United States Patent [19]

Mills

[11] Patent Number: 5,073,858
[45] Date of Patent: * Dec. 17, 1991

[54] MAGNETIC SUSCEPTIBILITY IMAGING (MSI)

[76] Inventor: Randell L. Mills, R.D. 2, Cochranville, Pa. 19330

[*] Notice: The portion of the term of this patent subsequent to Nov. 13, 2007 has been disclaimed.

[21] Appl. No.: 269,630

[22] Filed: Nov. 10, 1988

Related U.S. Application Data

[63] Continuation-in-part of Ser. No. 679,884, Dec. 10, 1984, abandoned.

[51] Int. Cl.⁵ .................. G06F 15/42; A61B 5/05; G01N 27/76
[52] U.S. Cl. .............. 364/413.13; 128/653.1; 324/201
[58] Field of Search ............. 364/413.13; 128/653 R, 128/659; 324/201

[56] References Cited

U.S. PATENT DOCUMENTS

| | | | |
|---|---|---|---|
| 3,980,076 | 9/1976 | Wikswo, Jr. et al. | 128/653 R |
| 4,079,730 | 3/1978 | Wikswo, Jr. et al. | 128/653 R |
| 4,270,545 | 6/1981 | Rodler | 128/653 R |
| 4,793,355 | 12/1988 | Crum et al. | 128/653 R |
| 4,969,469 | 11/1990 | Mills | 128/653 AF |

FOREIGN PATENT DOCUMENTS

0311186 12/1988 Japan ................. 324/201
PCT/US89/-
 05037 3/1989 PCT Int'l Appl.

OTHER PUBLICATIONS

Sarwinski, "Superconducting Instruments", *Cryogenics*, Dec. 1977, pp. 671–679.
Mills, "Magnetic Susceptibility Imaging", Quantum Imaging Corporation, Dec. 1989, pp. 1–5.
"Measurement of Magnetic Susceptibility in Living Rats", U. Steketee et al., *Med. & Biol. Eng. & Comput.*, (1980) 18: 253–260.
"Magnetic Measurements of Cardiac Mechanical Activity", R. Maniewski et al., *IEEE Transactions on Biomedical Engineering*, vol. 35, No. 9, Sep. 1988, 662–669.
Ivanenko, A. I.; Shpiring, K.; Noise-Resistant Hall Magnetometer, *Instrum. Exp. Tech.* (U.S.A.), (1987), vol. 30, No. 3, pt. 2, pp. 728–730.
Huang, R. M.; Yeh, F. S.; Huang, R. S.; Double-Diffusion Differential-Amplification Magnetic Sensor, *IEEE Trans. Electron Devices* (U.S.A.), (1984), vol. ED-31, No. 7, pp. 1001–1004.

(List continued on next page.)

*Primary Examiner*—Gail O. Hayes
*Assistant Examiner*—David Huntley
*Attorney, Agent, or Firm*—Hamilton, Brook, Smith & Reynolds

[57] ABSTRACT

Magnetic Susceptibility Imaging (MSI) comprises a generator to magnetize the tissue to be imaged, such as a first Helmholtz coil, which produces a high-strength external magnetic field to which unpaired electrons of paramagnetic molecules of tissue, which includes primarily deoxyhemoglobin and oxygen, couple in a positive sense, and to which orbital electrons of diamagnetic molecules of tissue, such as proteins and water, couple in a negative sense to produce a secondary magnetic field. The imaging system further comprises a nullifier to null the external magnetizing field, such as a second Helmholtz coil which, for example, confines the flux of both of the coils to a single plane such that the component of the secondary field perpendicular to this plane is the only field with a nonzero component. The secondary field component is detected by a detector, such as an array of Hall voltage detectors. The detection is performed over a sample space, and the signals recorded from the secondary field are used to reconstruct the magnetic susceptibility function of the body using the reconstruction processor of the present invention, such as a Fourier Transform Algorithm processor.

16 Claims, 5 Drawing Sheets

OTHER PUBLICATIONS

Thorn, M. J.; A Monolithic Linear Hall Effect Integrated Circuit, *Proceedings of the 29th IEEE Vehicular Technology Conference*, 27–30 Mar., 1979, Arlington Heights, Ill., pp. 226–229.

Nathan, A. et al.; Numerical Simulation of Semiconductor Magnetic Field Sensors Using the Finite–Element Method, *Proceedings of the IASTED International Symposium: Applied Simulation and Modeling –ASM '85*, 3–5 Jun. 1985, Montreal, Quebec, Canada, pp. 22–24.

Bligh, P. H.; Johnson, J. J.; Ward, J. M., Automating the Hall Effect, *Phys. Educ.* (GB), (1985), vol. 20, No. 5, pp. 245–247.

Nathan, A.; Huiser, A. M. J.; Baltes, H. P., Two–Dimensional Numerical Modeling of Magnetic–Field Sensors in CMOS Technology, *IEEE Trans. Electron Devices* (U.S.A.), (1985), vol. Ed–32, No. 7, pp. 1212–1219.

Vinal, A. W., A Magnetic Sensor Utilizing an Avalanching Semiconductor Device, *IBM J. Res. and Dev.* (U.S.A.), (1981), vol. 25, No. 2–3, pp. 196–201.

Bol'Shakova, I. A. et al.; Detectors For Simultaneous Magnetic Field and Temperature Measurement, *Instrum. and Exp. Tech.* (U.S.A.), (1980), vol. 23, No. 2, pt. 2, pp. 526–528.

Bessonov, V. I. et al.; Investigation of the Characteristics of n-InSb-I-GaAs Film Hall Converters, *Meas. Tech.* (U.S.A.), (1980), vol. 23, No. 3, pp. 255–256.

Kordic, S., Integrated Silicon Magnetic–Field Sensors, *Sens. and Actuators* (Switzerland), (1986), vol. 10, No. 3–4, pp. 347–378.

Pogodin, V. I. et al., Galvanomagnetic Instruments for Operation in Cryogenic Electrical–Engineering Installations, *Meas. Tech.* (U.S.A.), (1986), vol. 29, No. 3, pp. 223–225.

Tacano, M.; Sugiyama, Y.; Taguchi, T., 1/f Noise in (AlGa) As/Ga Heterostructure Van der Pauw Element, *IEEE Electron Device Lett.* (U.S.A.), 1987, vol. EDL-8, No. 1, pp. 22–23.

Dibbern, U., Magnetic Field Sensors Using the Magnetoresistive Effect, *Sens and Actuators* (Switzerland), (1986), vol. 10, No. 1–2, pp. 127–140.

Extance, P.; Pitt, G. D., GaAs Magnetic Field Sensors, Transducers '85, 1985 International Conference on Solid State Sensors and Actuators, Digest of Technical Papers, (Cat. No. 85CH 2127-9), 11–14 Jun. 1985, Phila., Pa., pp. 304–307.

Han, Y. S. et al., Measurement of Magnetic Fields in Low Temperature with Hall elements of GaAs, *Proceedings of the 9th International Conference on Magnet Technology*, MT-9 1985, 9–13 Sep. 1985, Zurich, Switzerland, pp. 828–829.

Bender, P. A., Measuring Magnetic Fields with an IC Chip in the Introductory Lab, *Am. J. Phys.* (U.S.A.), (1986), vol. 54, No. 1, pp. 89–90.

Hoffman, H., Plano-Magnetic Thin Film Sensors (Abstract), *J. Appl. Phys.* (U.S.A.), vol. 57, No. 8, pt. 2B, p. 3831.

Schmidt-Weinmar, H. G. et al., Numerical Modeling of Silicon Magnetic Field Sensors:, *IEEE Trans. Magn.* (U.S.A.), (1984), vol. Mag-20, No. 5, pt. 1, pp. 975–977.

Roumenin, C. S.; Kostov, P. T., Optimized Emitter-Injection Modulation Magnetotransistor, *Sens. and Actuators* (Switzerland), (1984), vol. 6, No. 1, pp. 19–33.

Akhmanova, L. N. et al., Hall Magnetometer with Increased Resolving Power, *Instrum. and Exp. Tech.* (U.S.A.), (1983), vol. 26, No. 6, pt. 2, pp. 1433–1436.

Dibern, U.; Pettersen, A., The Magnetoresistive Sensor-A Sensitive Device for Detecting Magnetic Field Variations, Electron. Components and Appl. (Netherlands), (1983), vol. 5, No. 3, pp. 148–153.

Popovic, R. S.; Baltes, H. P., Dual–Collector Magnetotransistor Optimized with Respect to Injection Modulation, *Sens. and Actuators* (Switzerland), (1983), vol. 4, No. 2, pp. 155–163.

Kordic, S. et al., A Novel Method for Reducing the Offset of Magnet-Field Sensors, *Sens. and Actuators* (Switzerland), (1983), vol. 4, No. 1, pp. 55–61.

Lindstrom, E. R. et al., The NBS–LANL RTM End–Magnet Field Mapper, *IEEE Trans. Nucl. Sci.* (U.S.A.), (1983), vol. NS-30, No. 4, pt. 2, pp. 3605–3607.

Rutkovskii, I. Z. et al., Thermal Stabilizer For a Hall Detector, *Instrum. and Exp. Tech.* (U.S.A.), (1981), vol. 24, No. 3, pt.2, pp. 822–823.

Belyaev, M. Yu.; Medvedev, E. Yu., Microthermostat For a Hall Detector, *Instrum. and Exp. Tech.* (U.S.A.), (1981), vol. 24, No. 3, pt. 2, pp. 821–822.

Netzer, Y., Bias Hall Sensors for Minimum Drift, *EDN* (U.S.A.), (1982), vol. 27, No. 6, pp. 180–186.

Lachinov, V. M. et al., Hall Magnetometers For Stationary Magnetic Fields that Read in Field Units, *Instrum. and Exp. Tech.* (U.S.A.), (1980), vol. 23, No. 6, pt. 2, pp. 1460–1462.

Poole, M. W.; Walker, R. P., Hall Effect Probes and Their Use in a Fully Automated Magnetic Measuring System, *IEEE Trans. Magn* (U.S.A.) (1981), vol. MAG-17, No. 5, pp. 2129–2132.

(List continued on next page.)

OTHER PUBLICATIONS

Dolgii, S. A. et al., Galvanomagnetic Three-Component Magnetic Induction Gauge, *Instrum. and Exp. Tech.* (U.S.A.), (1979), vol. 22, No. 5, pt. 2, pp. 1407–1410.

Wedlake, D., Temperature Matching of Ferrite Hall–Effect Devices, *Electron, Ind.* (GB), (1979), vol. 5, No. 3, p. 55.

Szavits, O., A Constant Power Hall-Probe Circuitry for Fast Field Mapping, *6th International Conference on Magnet Technology, Part II*, 29 Aug.–2 Sep. 1977, Bratislava, Czechoslovakia, pp. 849–853.

Sugiyama, Y.; Taguchi, T.; Tacano, M., Highly-Sensitive Magnetic Sensor made of AlGaAs/GaAs Heterojunction Semiconductors, *Proc. 6th Sensor Symp.*, May 1986, pp. 51–60.

Popovic, R. S.; Widmer, R., Sensitivity and Noise of a Lateral Bipolar Magnetotransistor in CMOS Technology, Electron Devices Meet., San Francisco, Calif., U.S.A., 1984, *IEDM Tech. Dig.*, pp. 568–571.

Jackson, D. A., Monomode Optical Fiber Interferometers for Precision Measurement, *J. Phys. E.*, vol. 18, No. 12, (1985), pp. 981–1001.

Giallorenzi, T. G. et al., Optical Fiber Sensor Technology, *IEEE J. of Quantum Electronics*, vol. QE-18, No. 4, (1982), pp. 626–665.

Kyuma, K. et al., Fiber Optic Measuring System for Electric Current by Using a Magnetooptic Sensor, *IEEE J. of Quantum Electronics*, vol. QE-18, No. 10, (1982), pp. 1619–1623.

Yoshino, T. et al., Fiber-Optic Fabry-Perot Interferometer and its Sensor Applications, *IEEE J. of Quantum Electronics*, vol. QE-18, No. 10, (1982), pp. 1624–1633.

Dandridge, A. et al., Optical Fibre Magnetic Field Sensors, *Electronics Letters*, vol. 16, No. 11, (1980), pp. 408–409.

Dickson, K. R. and Galbraith, P., A Digital Micro-Teslameter, Organisation Europeenne Pour La Recherche Nucleaire CERN European Organization for Nuclear Research, CERN 85-13, LEP Main Ring Division, 13 Sep. 1985, pp. 1–24.

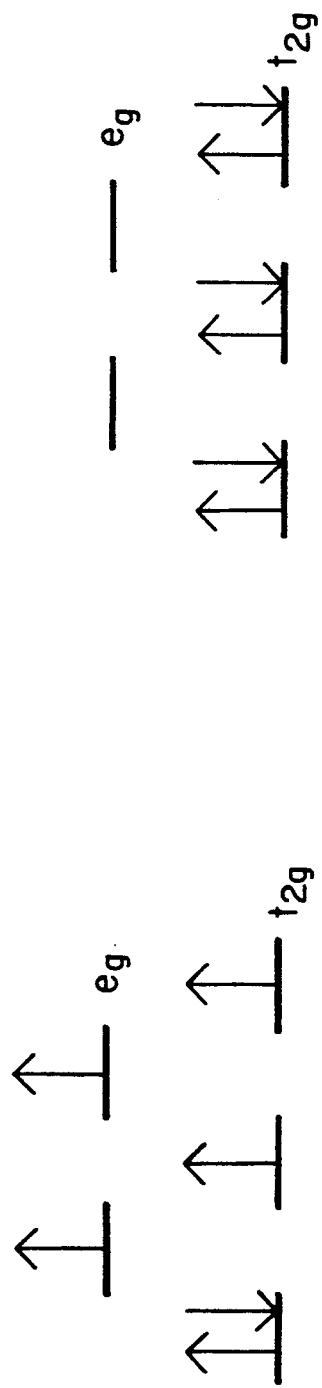
Fig. 1A
Fig. 1B
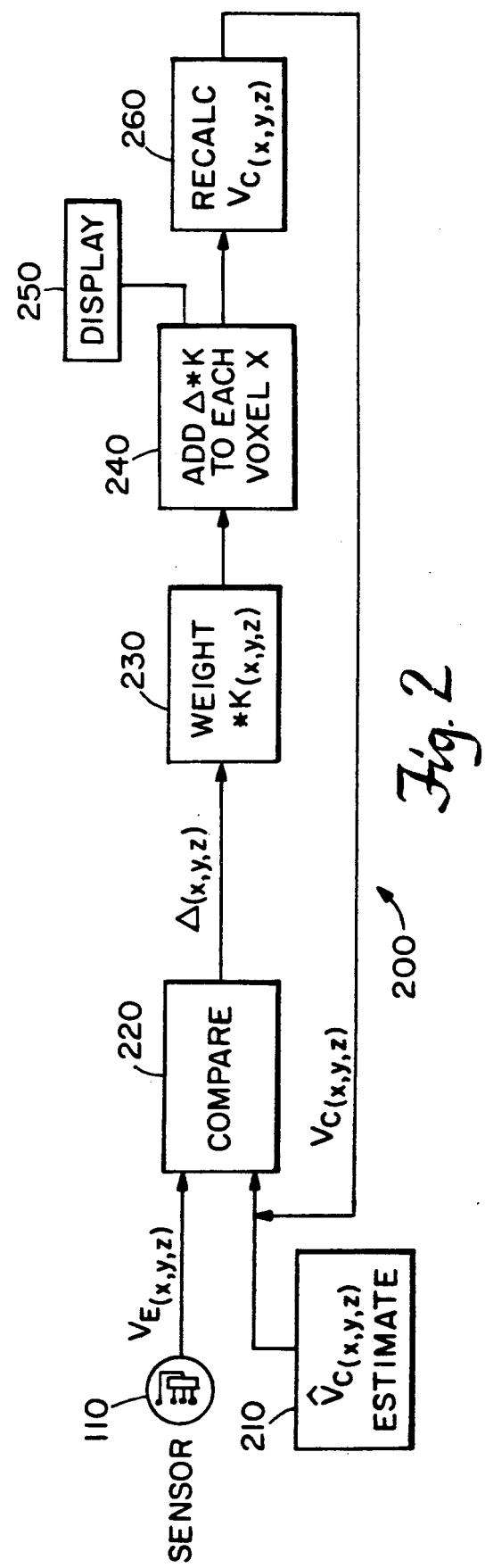
Fig. 2

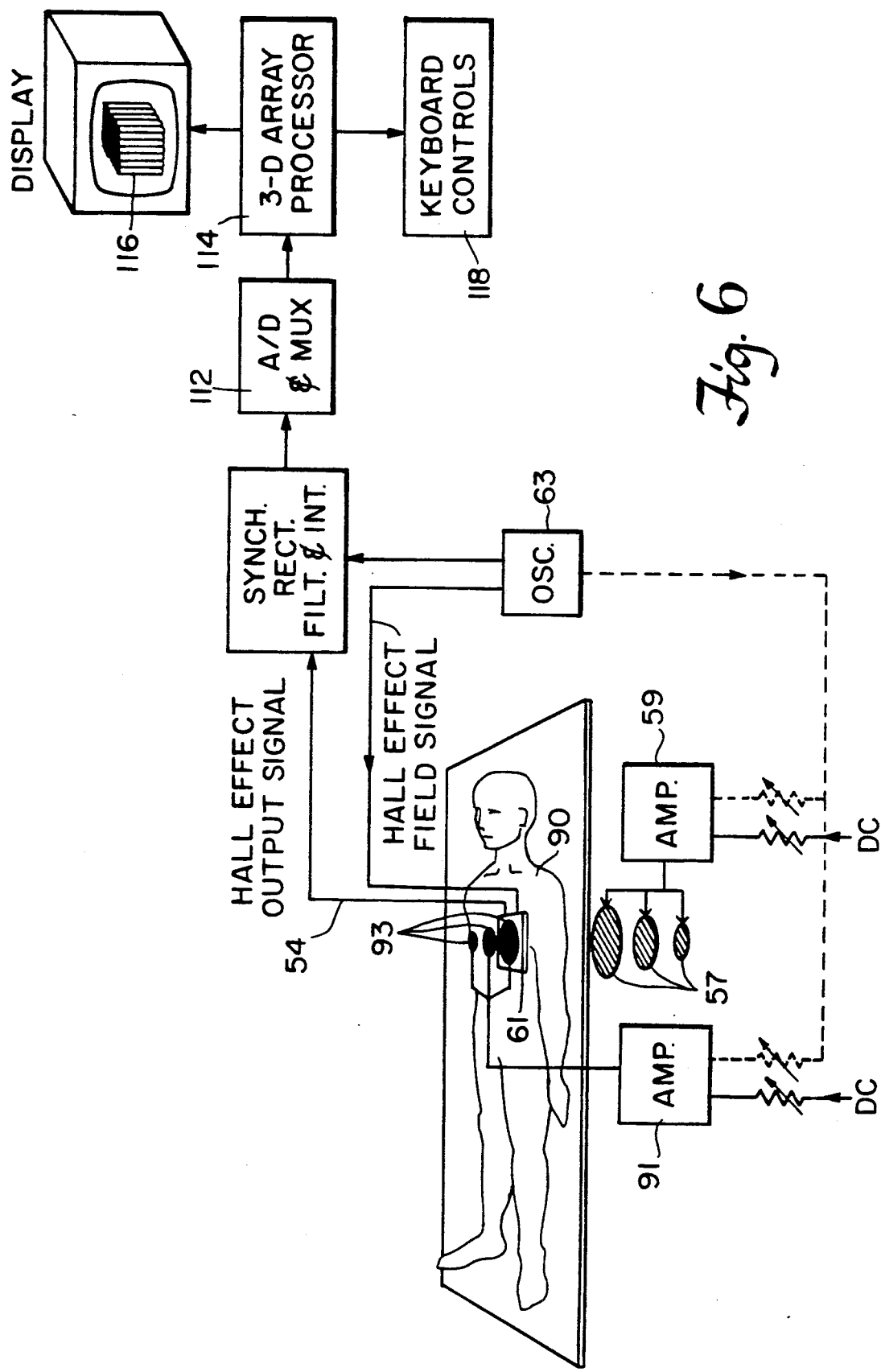

MAGNETIC SUSCEPTIBILITY IMAGING (MSI)

CROSS-REFERENCE TO RELATED APPLICATIONS

This application is a continuation-in-part of application Ser. No. 679,884, filed Dec. 10, 1984, now abandoned entitled Paramagnetic Dynamo Electromotive Force Detector and Imaging System Incorporating Same.

FIELD OF THE INVENTION

The present invention provides an image of the magnetic susceptibility function of inanimate and animate objects, including the human body.

BACKGROUND

The basis of all imaging modalities exploits some natural phenomenon which varies from tissue to tissue, such as acoustic impedance, nuclear magnetic relaxation, or x-ray attenuation; or, a substance such as a positron or gamma ray emitter is added to the body and its distribution is reconstructed; or, a substance is added to the body which enhances one or more of acoustic impedance, nuclear magnetic relaxation, or x-ray attenuation. Each imaging modality possesses certain characteristics which provide superior performance relative to other modalities of imaging one tissue or another. For example, x-ray contrast angiography has an imaging time less than that which would lead to motion artifact and it possesses high resolution which makes it far superior to any prior known imaging modality for the task of high resolution imaging of veins and arteries. However, x-ray contrast angiography is invasive, requires injection of a noxious contrast agent, and results in exposure to ionizing radiation; therefore, it is not indicated except for patients with severe arterial or venous pathology.

SUMMARY OF THE INVENTION

All tissues of the body possess a magnetic susceptibility which is diamagnetic or paramagnetic; therefore, magnetized tissue produces a secondary magnetic field. This field is that of a series of negative and positive dipoles spatially distributed at frequencies representative of the magnetic susceptibility function of the tissue at a given level of resolution, where each dipole is representative of a volume element or voxel of dimensions equalling the limiting resolution, and where the magnitude of any dipole is given by the product of the volume of the voxel, the magnetic flux strength at the voxel, and the magnetic susceptibility of the voxel.

The present invention herein disclosed as MSI (Magnetic Susceptibility Imaging) is directed to the reconstruction of the magnetic susceptibility function of the tissue at the said limiting resolution from measurements of the said secondary field, where the signal-to-noise ratio of the said measurement determines the said resolution. MSI comprises 1) a generator to magnetize the tissue to be imaged, such as a first Helmholtz coil, 2) detector to record the secondary magnetic field produced by the tissue, such as an array of Hall magnetic field detectors, 3) a nullifier to null the external magnetic field produced by the magnetizing means such that the secondary field can be recorded independently of the external magnetizing field, such as a second Helmholtz coil which confines the magnetic flux of the said first and second Helmholtz coils to the plane of the said detector array, so that the nonzero perpendicular component of the secondary field may be recorded, and 4) a reconstruction processor to reconstruct the magnetic susceptibility function of the tissue from recordings of the secondary magnetic field made over a sample space, such as a reconstruction algorithm which Fast Fourier Transforms the signals, divides the said transform by the Fourier Transform of the system function which is the impulse response of the said detector array, Fast Fourier Inverse Transforms the said product, and evaluates the dipole values by applying a correction factor to each element of the resultant matrix, where the formula for the correction factors is determined by the dimensions of the said sample space over which the signals of the said secondary magnetic field were recorded.

The resultant image is displayed three-dimensionally and can be further processed to provide enhancement or to be displayed from any three-dimensional perspective or as two-dimensional slices.

DETAILED DESCRIPTION OF THE DRAWINGS

The present invention is further described with respect to the drawings having the following, solely exemplary figures, wherein:

FIG. 1A shows the electron population diagram of the $e_g$ and $t_{2g}$ orbitals of a high spin $d^6$ complex;

FIG. 1B shows the electron population diagram of the $e_g$ and $t_{2g}$ orbitals of a low spin $d^6$ complex;

FIG. 2 shows the general process of reconstruction by reiteration;

FIG. 6 is a block diagram of one embodiment of the system according to the present invention.

Figure 3:
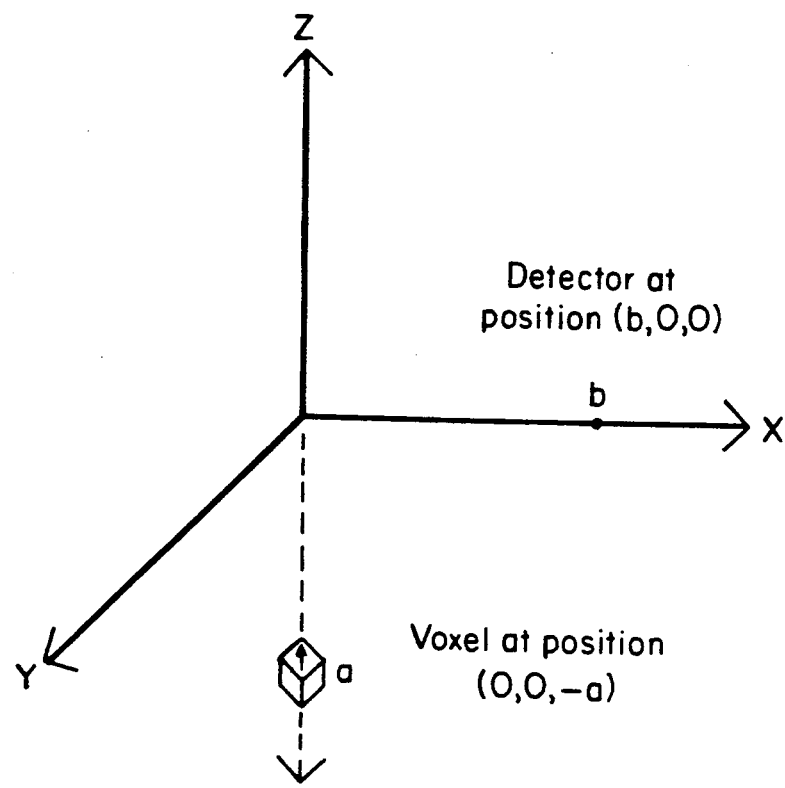
FIG. 3 shows a coordinate system and distances from a voxel to a point detector.

Further details regarding specific derivations, calculations and experimental implementation are provided in the attached appendices, wherein:

Appendix I is the derivation of the field produced by a ring of dipoles;

Appendix II is the derivation of the field produced by a shell of dipoles;

Appendix III is the derivation of the field produced by a sphere of dipoles;

Appendix IV is the derivation of the Fourier Transform of the System Function used in a reconstruction process according to the present invention;

Appendix V is the derivation of $S=HF^*U[K_z]$ convolution used in a reconstruction process according to the present invention;

Appendix VI is the derivation of the solution of Inverse Transform 1 used in a reconstruction process according to the present invention;

Appendix VII is the listing for the PSI Prototype LIS Program used to calculate experimental MSI results; and Appendix VII is the listing for the PSI Prototype I LIS Program used to calculate experimental MSI results.

DETAILED DESCRIPTION OF THE INVENTION

Uniqueness

Linus Pauling demonstrated in 1936 that blood is a mixture of components of different magnetic susceptibilities. The predominant components are water and iron containing hemoglobin of red blood cells having magnetic susceptibilities of $-7 \times 10^{-6}$ and $1.2 \times 10^{-2}$, respectively, where blood corpuscles constitute about one-half of the volume of blood. Due to the presence of an iron atom, each hemoglobin molecule has a paramagnetic moment of 5.46 Bohr magnetons resulting from four unpaired electrons. Hemoglobin in blood contributes a significant paramagnetic contribution to the net magnetic susceptibility of blood. The net susceptibility arises from the sum of noninteracting spin wave-functions and a state of uniform magnetization is not achieved by magnetizing blood. In fact, there is no interaction between spin wave-functions or orbital wave-functions of any pure paramagnetic or diamagnetic material, respectively, or any paramagnetic or diamagnetic mixture, respectively, including the constituents of human tissue. The divergence of the magnetization in magnetized blood or tissue is not zero, and the secondary magnetic field due to magnetized tissue has to be modeled as noninteracting dipoles aligned with the imposed field It is demonstrated below that the field of any geometric distribution of dipoles is unique, and the superposition principle holds for magnetic fields; therefore, a unique spatial distribution of dipoles gives rise to a unique secondary magnetic field, and it is further demonstrated below that this secondary field can be used to solve for the magnetic susceptibility map exactly. It follows that this map is a unique solution.

To prove that any geometric distribution of dipoles has a unique field, it must be demonstrated that the field produced by a dipole can serve as a mathematical basis for any distribution of dipoles. This is equivalent to proving that no geometric distribution of dipoles can produce a field which is identical to the field of a dipole. By symmetry considerations, only three distributions of uniform dipoles need to be considered a ring of dipoles, a shell of dipoles, and a sphere of dipoles The fields produced by these distributions are given as follows, and their derivations appear in Appendices I, II and III, respectively.

Ring of Dipoles:

$$B_z = m \left( \frac{2z^2 - x^2 - y^2}{(r^2 + R^2)^{5/2}} - \frac{R^2}{(r^2 + R^2)^{5/2}} + \frac{5R^2(x^2 + y^2)}{(r^2 + R^2)^{7/2}} \right)$$

for $R = 0$.

$$B_z = m \left( \frac{2z^2 - x^2 - y^2}{r^5} \right) = \frac{m(2z^2 - x^2 - y^2)}{(x^2 + y^2 + z^2)^{5/2}}$$

which is the field due to a single dipole.

Thus, a ring of dipoles gives rise to a field different from that given by a dipole, and the former field approaches that of a single dipole only as the radius of the ring goes to zero.

Shell of Dipoles:

$$B_z \approx \frac{m}{4\pi R^2} \left\{ 4\pi R^2 \left[ \frac{2z^2 - x^2 - y^2}{(p^2 + R^2)^{5/2}} \right] - \frac{40\pi}{3} \frac{R^4(2z^2 - x^2 - y^2)}{(p^2 + R^2)^{7/2}} \right\}$$

For $R = 0$ $$B_z = m \frac{(2z^2 - x^2 - y^2)}{(p^2)^{5/2}} = m \frac{(2z^2 - x^2 - y^2)}{(x^2 + y^2 + z^2)^{5/2}}$$

which is the field due to a single dipole at the origin. Thus, a shell of dipoles gives rise to a field which is different from that of a single central dipole. The field in the former case is that of a dipole only when the radius of the shell is zero as would be expected.

Sphere of Dipoles:

$$B_z \approx \frac{m(2z^2 - x^2 - y^2)}{(R^2 + p^2)^{5/2}} (1 + (R/p)^2)$$

For $R = 0$, $$B_z = \frac{m(2z^2 - x^2 - y^2)}{(p^2)^{5/2}} = \frac{m(2z^2 - x^2 - y^2)}{(x^2 + y^2 + z^2)^{5/2}}$$

which is the field due to a single dipole at the origin. Thus, a sphere of dipoles gives rise to a field which is different from that of a single central dipole. The field in the former case is that of a dipole only when the radius of the sphere is zero.

These cases demonstrate that the field produced by a magnetic dipole is unique. Furthermore, the image produced in MSI is that of dipoles. Since each dipole to be mapped gives rise to a unique field and since the total field at a detector is the superposition of the individual unique dipole fields, linear independence is assured; therefore, the MSI map or image is unique. That is, there is only one solution of the MSI image for a given set of detector values which spatially measure the superposition of the unique fields of the dipoles. This map can be reconstructed using the algorithms described in the Reconstruction Algorithm Section.

The resulting magnetic susceptibility map is a display of the anatomy and the physiology of systems such as the cardiopulmonary system as a result of the large difference in the magnetic susceptibility of this system relative to the background susceptibility.

Magnetic Susceptibility of Oxygen and Deoxyhemoglobin

The molecular orbital electronic configuration of $O_2$ is $$1\theta_g)^2(1\theta^*_\mu)^2(2\theta_g)^2(1\pi_{px})^2(1\pi_{py})^2(1\pi^*_{px})^1(1\pi^*_{py})^1$$

and by Hund's rule, $$\int (1\pi^*_{px}) d\tau \leq \int (1\pi^*_{py}) d\tau;$$

that is, unpaired electrons of degenerate orbitals have the same spin quantum number and $O_2$ is therefore paramagnetic.

The magnetic susceptibility of $O_2$ at STP is $1.8 \times 10^{-6}$. Also, ferrohemoglobin contains $Fe^{2+}$ which is high spin $d^6$ complex, as shown in FIG. 1A, and contains four unpaired electrons. However, experimentally oxyhemoglobin is diamagnetic. Binding of $O_2$ to hemoglobin causes a profound change in the electronic structure of hemoglobin such that the unpaired electrons of the free state pair upon binding. This phenomenon is not seen in all compounds which bind hemoglobin. Nitrous oxide is paramagnetic in both the bound and free state and NO—Hb has a magnetic moment of 1.7 Bohr magnetons.

Furthermore, oxyhemoglobin is in a low spin state, containing no unpaired electrons, as shown in FIG. 1B, and is therefore diamagnetic. However, the magnetic susceptibility of hemoglobin itself (ferrohemoglobin) corresponds to an effective magnetic moment of 5.46 Bohr magnetons per heme, calculated for independent hemes. The theoretical relationship between $\mu_{eff}$, the magnetic moment, and S, the sum of the spin quantum numbers of the electrons, is given by $$\mu_{eff} = \sqrt{(4S(S+1))}$$

The magnetic moment follows from the experimental paramagnetic susceptibility X according to $$\mu_{eff} = 2.84\sqrt{((T+\theta)\chi)}$$

where T is the absolute temperature and $\theta$ is the Curie-Weiss constant (assumed to be zero in this case) The experimental paramagnetic susceptibility of hemoglobin/heme is $1.2403 \times 10^{-2}$ (molar paramagnetic susceptibility calculated per gram atom of heme iron), and the concentration of Hb in blood is 150 g/l=$2.2 \times 10^{-3}$ M; $8.82 \times 10^{-3}$ M Fe.

Magnetic Susceptibility of Paramagnetic Species Other Than Oxygen and Hemoglobin The specific susceptibility of $H_2O$ saturated with air and deoxyhemoglobin is $-0.719 \times 10^{-6}$ and $1.2403 \times 10^{-2}$, respectively.

By Curie's law, the paramagnetic susceptibility is represented by $$\chi = N\mu^2/3kT$$

where N is the number of magnetic ions in the quantity of the sample for which $\chi$ is defined, $\mu$ is the magnetic moment of the ion, and k is the Boltzmann constant. $\mu$ can be expressed in Bohr magnetons:

$$\mu_B = e(h+2\pi)/2mc = 0.9273 \times 10^{-20} \, erg/G$$

which is the natural unit of magnetic moment due to electrons in atomic systems Thus, the Bohr magneton number n is given by $n = n\mu_B$.

Assuming the magnetic moments come solely from spins of electrons, and that spins of f electrons are aligned parallel in each magnetic ion, then, $$n = (f(f+2))^{\frac{1}{2}}$$

and substituting the resultant spin quantum number, $$S = f/2,$$

$$n = 2(S(S+1))^{\frac{1}{2}}.$$

The free radical concentrations in human liver tissues measured with the surviving tissue technique by Ternberg and Commoner is $3 \times 10^{15}$/g wet weight. Furthermore, human liver would contain the greatest concentration of radicals, since the liver is the most metabolically active organ.

The molal paramagnetic susceptibility for liver is calculated from Curie's law:

$$\chi_{mol} = N\mu^2/3kT = [(3 \times 10^{15} \text{ electrons})(1 \text{ g})(1000 \text{ ml})\mu^2]/[(1 \text{ g tissue})(1 \text{ ml})(1) \times 3kT]$$
$$\chi_{mol} = (3 \times 10^{18})\{[.9273 \times 10^{-20} erg)/G] [(2)(1/2) (1/2 + 7)]^{1/2}\}^2/(3)(1.38 \times 10^{-16} erg/°k.)(310° k.)$$
$$\chi_{mol} = 6 \times 10^{-9}$$

For any material in which the magnetization M is proportional to the applied field, H, the relationship for the flux B is $B = \mu_0(1+4\pi\chi_m)H$, where $\chi_m$ is the molal magnetic susceptibility, $\mu_0$ is the permitivity, and H is the applied field strength The susceptibility of muscle, bone, and tissue is approximately that of water, $-7 \times 10^{-7}$, which is very small; therefore, the attenuation effects of the body on the applied magnetic field are negligible. Similarly, since the same relationship applies to the secondary field from deoxyhemoglobin, the attenuation effects on this field are negligible. Furthermore, for liver $$4\pi\chi_m = 7.5 \times 10^{-8} << 1.$$

Therefore, the effect of the background radicals and cytochromes on the applied field are negligible, and the signal-to-noise ratio is not diminished by these effects. Also, any field arising from the background unpaired electrons aligning with the applied field would be negligible compared to that arising from blood, because the magnetic susceptibility is seven orders of magnitude greater for blood.

Furthermore, the vascular system can be imaged despite the presence of background blood in tissue because the concentration of hemoglobin in tissue is 5% of that in the vessels.

The magnetic susceptibility values from deoxyhemoglobin and oxygen determines that MSI imaging is specific for the cardiopulmonary and vascular systems where these species are present in much greater concentrations than in background tissue and serve as intrinsic contrast agents. The ability to construct an image of these systems using MSI depends not only on the magnitude of the differences of the magnetic susceptibility between tissue components, but also on the magnitude of the signal as a function of the magnetic susceptibility which can be obtained using a physical instrument in the presence of parameters which cause unpredictable random fluctuations in the signal which is noise. The design of the physical instrument is described next and the analysis of the contrast and resolution of the image are described in the Contrast and Limiting Resolution Section.

System Construction

The MSI scanner entails an apparatus to magnetize a volume of tissue to be imaged, an apparatus to sample the secondary magnetic field at the Nyquist rate over the dimensions which uniquely determine the susceptibility map which is reconstructed from the measurements of the magnetic field, and a mathematical apparatus to calculate this magnetic susceptibility map, which is the reconstruction algorithm.

Magnetizing Field

The applied magnetizing field (provided by coils 57, FIG. 6) which permeates tissue is confined only to that region which is to be imaged. The confined field limits the source of signal only to the volume of interest; thus, the volume to be reconstructed is limited to the magnetized volume which sets a limit to the computation required, and eliminates end effects of signal originating outside of the edges of the detector array.

A magnetic field gradient can be applied in the direction perpendicular to the plane of the detector array described below to alter the dynamic range of the detected signal, as described in the Altering the Dynamic Range Provided by the System Function Section.

Figure 4:
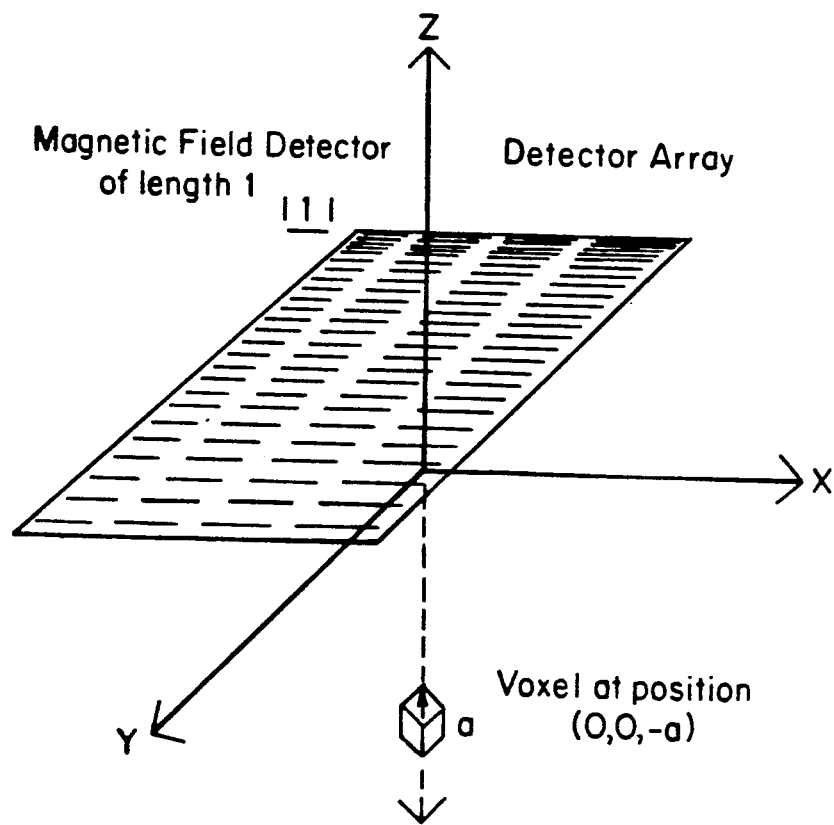
FIG. 4 shows a coordinate system of a two-dimensional detector array where the detectors generate a voltage along the length l in response to a magnetic field perpendicular to the plane.

The magnetizing field generating elements can also include an apparatus including coils 93 disposed on the side of the patient 90 having detector array 61, and energized by amplifier 91 energized by a selected d.c. signal, to generate a magnetic field which exactly cancels the z directed flux permeating the interrogated tissue at the x,y plane of the detector array, as shown in FIG. 6, such that the applied flux is totally radially directed. This permits the use of detectors which produce a voltage in response to the z component of the magnetic field produced by the magnetized tissue of interest as shown in FIG. 4, where the voltages are relative to the voltage at infinity, or any other convenient reference as described below in the Detector Array Section.

The magnetizing means can also possess a means to add a component of modulation to the magnetizing field at frequencies below those which would induce eddy currents in the tissue which would contribute significant noise to the secondary magnetic field signal. Such modulation would cause an in-phase modulation of the secondary magnetic field signal which would displace the signal from zero hertz, where white noise has the highest power density.

Detector Array

Figure 7:
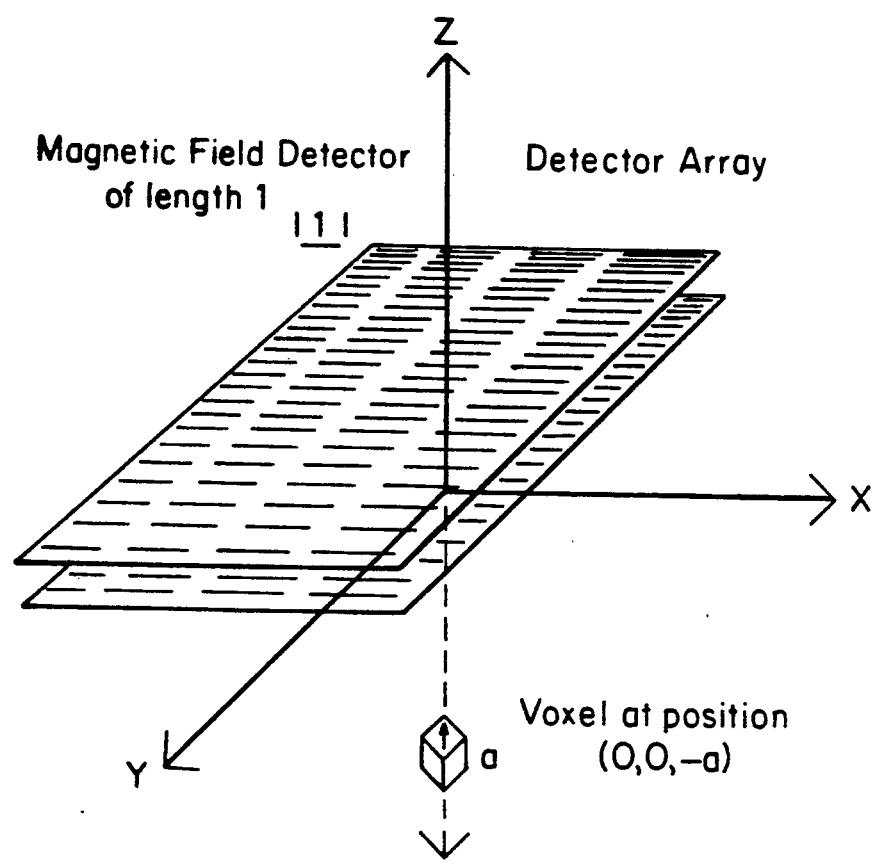
FIG. 7 shows a three dimensional detector array.

The MSI imager possesses a detector array of multiple detector elements which are arranged in a plane. This two dimensional array is translated in the direction perpendicular to this plane during a scan where readings of the secondary magnetic field are obtained as a function of the translation. In another embodiment, the array is three dimensional comprising multiple parallel two dimensional arrays. See FIG. 7. The individual detectors of the array respond to a single component of the magnetic field which is produced by the magnetized tissue where the component of the field to which the detector is responsive determines the geometric system function which is used in the reconstruction algorithm discussed in the Reconstruction Algorithm Section. In one embodiment, the detectors provide moving charged particles which experience a Lorentz force in the presence of a magnetic field component perpendicular to the direction of charge motion. This Lorentz force produces a Hall voltage in the mutually perpendicular third dimension, where, ideally, the detector is responsive to only the said component of the magnetic field.

Many micromagnetic field sensors have been developed that are based on galvanometric effects due to the Lorentz force on charge carriers. In specific device configurations and operating conditions, the various galvanomagnetic effects (Hall voltage, Lorentz deflection, magnetoresistive, and magnetoconcentration) emerge. Semiconductor magnetic field sensors include those that follow.

1. The MAGFET is a magnetic-field-sensitive MOSFET (metal-oxide-silicon field-effect transitor). It can be realized in NMOS or CMOS technology and uses galvanomagnetic effects in the inversion layer in some way or another. Hall-type and split-drain MAGFET have been realized. In the latter type, the magnetic field (perpendicular to the device surface) produces a current imbalance between the two drains. A CMOS IC incorporating a matched pair of n- and p-channel split drain MAGFET achieves $10^4$V/A·T sensitivity. Still higher sensitivity may be achieved by source efficiency modulation.

2. Integrated bulk Hall devices usually have the form of a plate merged parallel to the chip surface and are sensitive to the field perpendicular to the chip surface. Examples are the saturation velocity MFS, the DAMS (differential magnetic field sensor) and the $D^2$DAMS (double diffused differential magnetic sensor) which can achieve 10 V/T sensitivity. Integrated vertical Hall-type devices (VHD) sensitive to a magnetic field parallel to the chip surface have been realized in standard bulk CMOS technology.

3. The term mg magnetotransitor (MT) is usually applied to magnetic-field-sensitive bipolar transistors. The vertical MT (VMT) uses a two-or four-collector geometry fabricated in bipolar technology, and the lateral MT (LMT) is compatible with CMOS technology and uses a single or double collector geometry Depending on the specific design and operating conditions, Lorentz deflection (causing imbalance in the two collector currents) or emitter efficiency modulation (due to a Hall-type voltage in the base region) are the prevailing operating principles.

4. Further integrated MFS are silicon on saphire (SOS) and CMOS magnetodiodes, the magnetounijunction transistor (MUJT), and the carrier domain magnetometer (CDM). The CDM generates an electrical output having a frequency proportional to the applied field.

5. (AlGa) As/GaAs heterostructure Van der Pauw elements exploit the very thin high electron mobility layer realized in a two-dimensional electron gas as a highly sensitive practical magnetic sensor with excellent linearity on the magnetic field.

6. The Magnetic Avalanche Transistor (MAT) is basically a dual collector open-base lateral dipolar transitor operating in the avalanche region and achieves 30 V/T sensitivity.

A broad variety of other physical effects, materials and technologies are currently used for the realization of MFS. Optoelectronic MFS, such as magnetooptic MFS based on the Faraday effect of optical-fiber MFS with a magnetostrictive jacket, use light as an intermediary signal carrier. SQUIDS (Superconducting Quantum Interference Devices) use the effects of a magnetic field on the quantum tunneling at Josephson Junctions.

Metal thin film magnetic field sensors (magnetoresistive sensors) use the switching of anisotropic permalloy (81:19 NiFe) which produces a change in electrical resistance that is detected by an imbalance in a Wheatstone Bridge.

Integrated magnetic field sensors are produced with nonlinearity, temperature drift, and offset correction and other signal conditioning circuitry which may be integrated on the same chip. Hall type microdevices possess a nonlinearity and irreproducibility error of less than $10^{-4}$ over a 2 Tesla range, less than 10 ppm/0°C temperature drift, and a high sensitivity to detect a magnetic flux of nanotesla range. And, micro Van der Pauw and magnetoresistive devices with high linearity over 100 guass range have sufficient signal to noise ratio to measure a magnetic flux of lnT. Magnetooptic MFS and SQUIDS can detect a magnetic flux of $10^{-15}$T.

The signal arising from the external magnetizing field can be eliminated by taking the voltage between two identical detectors which experience the same external magnetizing field, for example, where the magnetizing field is uniform Or, the external magnetic field can be nulled (by coil 93, FIG. 6) to confine the flux to a single plane at the plane of the detector array where the detectors of the array are responsive only to the component of the magnetic field perpendicular to this plane. The voltage of the detector can then be taken relative to the voltage at ground or any convenient reference voltage.

Exemplary circuitry according to the present invention to measure the secondary magnetic field using an array 61 of $10^4$ Hall effect sensors is shown in FIG. 6. For each magnetic field sensor, an a.c. constant-current source (oscillator 63) is used to provide a sine-wave current drive to the Hall sensors in array 61. Alternately, the exciting and/or nulling coils 57 and 93 can receive an amplified oscillator 63 signal for the synchronous rectification (detection). Amplifier 59 energizes the exciting coils 57 by selected signals including a d.c. signal on the a.c. oscillator signal, or a selected combination of both. A counter produces a sawtooth digital ramp which addresses a sine-wave encoded EPROM. The digital sine-wave ramp is used to drive a digital to analogue converter (DAC) producing a pure voltage reference signal which is used as an input to a current-drive circuit 59 and the synchronous detector 56. After band-pass/amplification, the received detector signals are demodulated to d.c. with a phase sensitive (synchronous) rectifier followed by a low pass filter in 56. In 112, a voltage-to-frequency converter (VFC) is used to convert the voltage into a train of constant width and constant amplitude pulses; the pulse rate of which is proportional to the amplitude of the analogue signal. The pulses are counted and stored in a register which is read by the control logic. The use of a VFC and counter to provide analog to digital conversion 112 enables the integration period to be set to an integral number of signal excitation cycles; thus, rejecting the noise at the signal frequency, and enabling indefinitely long integration times to be obtained. The element 112 also includes input multiplex circuits which allow a simple A/D converter to selectively receive input signals from a large number (e.g., 100) of detectors. The voltages from 56 corresponding to the $10^4$ detectors are received by 100 multiplexer-VFC-12 bit analogue-to-digital converter circuits in 112, where each multiplex-VFC-A/D converter circuit services 100 detectors. The conversion of a set of array voltages typically requires $10^{-4}$ seconds, and 100 sets of array voltages are recorded in the processor 114 and converted requiring a total time of $10^{-2}$ seconds, where the detector array 61 is translated to each of 100 unique positions from which a data set is recorded during a scan. If the dynamic range of the data exceeds that of the 12-bit A/D converter, then a magnetic field gradient of the magnetizing field is implemented as described in the Dynamic Range Section.

The processed voltages are used to mathematically reconstruct the magnetic susceptibility function by using a reconstruction algorithm discussed in the Reconstruction Algorithm Section to provide a corresponding image on display 116.

Dynamic Range

As described in the Nyquist Theorem with the Determination of the Spatial Resolution Section, the system function which effects a dependence of the signal on the inverse of the separation distance between a detector and a dipole cubed band-passes the magnetic susceptibility function; however, the resulting signals are of large dynamic range requiring at least a 12-bit A/D converter.

A 12 bit A/D converter is sufficient with a magnetizing design which exploits the dependence of the signal on the strength of the local magnetizing field. A quadratic magnetizing field is applied in the z direction such that the fall-off of the signal of a dipole with distance is compensated by an increase in the signal strength due to a quadratically increasing local magnetizing field. The reconstruction algorithm is as discussed in the Reconstruction Algorithm Section, however, each element of the matrix containing the magnetic susceptibility values is divided by the corresponding element of the matrix containing the values of the flux magnetizing the said magnetic susceptibility. These operations are described in detail in the Altering the Dynamic Range Provided by the System Function Section.

An alternate approach is to convert the analogue voltage signal into a signal of a different energy form such as electromagnetic radiation for which a large dynamic range in the A/D processing is more feasible.

Alternatively, the original signal or any analogue signal transduced from this signal may be further processed as an analogue signal before digitizing.

Reconstruction Algorithm

The reconstruction algorithm can be a reiterative, matrix inversion, or Fourier Transform algorithm. For all reconstruction algorithms, the volume to be imaged is divided into volume elements called voxels and the magnetized voxel with magnetic moment $\chi B$ is modeled as a magnetic dipole where $\chi$ is the magnetic susceptibility of the voxel and B is the magnetizing flux at the position of the dipole.

A matrix inversion reconstruction algorithm is to determine a coefficient for each voxel mathematically or by calibration which, when multiplied by the magnetic susceptibility of the voxel, is that voxel's contribution to the signal at a given detector. This is repeated for every detector and those coefficients are used to determine a matrix which, when multiplied by a column vector of the magnetic susceptibility values of the voxels, gives the voltage signals at the detectors. This matrix is inverted and stored in memory. Voltages are recorded at the detectors and multiplied by the inverse matrix, to generate the magnetic susceptibility map which is plotted and displayed.

A reiterative algorithm is to determine the system of linear equations relating the voltage at each detector to the magnetic susceptibility of each voxel which contributes signal to the detector. Each of these equations is the sum over all voxels of the magnetic susceptibility value of each voxel times its weighting coefficient for a given detector which is set equal to the voltage at the given detector. The coefficients are determined mathematically, or they are determined by calibration. The magnetic susceptibility, $\chi$, for each voxel, is estimated and the signals at each detector are calculated using these values in the linear equations. The calculated values are compared to the scanned values and a correction is made to $\chi$ of each voxel. This gives rise to a second, or recomputed, estimate for $\chi$ of each voxel. The signal value from this second estimate is computed and corrections are made as previously described. This is repeated until the correction for each reiteration approaches a predefined limit which serves to indicate that the reconstruction is within reasonable limits of error. This result is then plotted.

The general process of reconstruction by reiteration is shown according to the steps of FIG. 2 (and is implemented in processor 114 in FIG. 6). The image displayed according to the process 200 is directly related to the magnetic susceptibility of $\chi$ of voxel sections of the object examined, the image is merely a mapping of the magnetic susceptibility in three dimensions. Accordingly, signals produced by the magnetic sensors 110, in terms of volts, are a direct result of the magnetic susceptibility $\chi$ of the voxel elements. Therefore, a reference voltage is generated at 210 from which the actual or measured sensor voltages is subtracted at 220. The reference voltages are modelled by assuming a signal contribution from each voxel element to each sensor. Therefore, the signals are summed separately for each sensor according to a weighted contribution of the voxel elements over the x, y, and z axes according to a model of the tissue to be examined. The resulting modelled or calculated voltage signals are compared at step 220, providing a difference or $\Delta$ signal, weighted at step 230 to produce a weighted difference signal, which is then added to the previously estimated susceptibility value for each voxel element at step 240. The resulting level, available in three dimensions corresponding to the axes x, y, and z, is selectively displayed on the display at step 250. Having adjusted the estimated susceptibility for each voxel, the calculated magnetic susceptibility is recalculated at step 260, the resulting estimated sensor voltage is then compared to the actual sensor voltage at step 220, the process 200 being repeated until the difference is reduced to a tolerable value.

The reconstruction algorithm using Fourier Transforms involves exploiting the FFT to solve equation 4 given below. The FFT algorithm is given below and is followed by a discussion of the resolution of the magnetic susceptibility map in the Nyquist Theorem with the Determination of the Spatial Resolution Section.

For the case that follows, data is acquired in the x, y, and z directions, but in general data is acquired over the dimensions which uniquely determine the magnetic susceptibility map. Also, the present analysis is for measuring the z magnetic field component of a dipole oriented in the z direction; however, the analysis applies to the other two orthogonal components where the geometric system function for the z component of the z-oriented dipole is replaced by the geometric system function for the x or y components of the magnetic field produced by the dipole where the geometric system function is defined below as the impulse response of the detector to the given component of the field of a dipole of given orientation.

The sample space, or space over which the secondary field is measured, is defined in the present example as the three-dimensional space comprising the entire x,y plane and the positive z axis, as shown in FIG. 4. Other sample spaces are valid and each requires special consideration during the reconstruction as described below.

The discrete voltages recorded from an infinite detector array in the x,y plane which is translated to infinity along the z axis starting from the origin where the detector array is responsive to the z component of the secondary magnetic field is given by Equation 2, where the voltage at any point in space produced by dipoles advanced in the z direction and advanced or delayed in the x and y directions relative to the origin is given by the following Equation 1, where the voltage response is $C_o$ times the secondary magnetic flux strength. The flux magnetizing each voxel is given as unity.

$$V[x,y,z] = \qquad \text{Equation 1}$$

$$C_0 \sum_{n_3=0}^{+l_3/k} \sum_{n_2=-l_2/2k}^{+l_2/2k} \sum_{n_1=-l_1/2k}^{+l_1/2k} \chi_{n_1,n_2,n_3}\{[2[z+n_3k]^2 -$$

$$[y - n_2k]^2 - [x - n_1k]^2/[[x - n_1k]^2 + [y - n_2k]^2 +$$

$$[z + n_3k]^2]^{5/2}\}$$

where the variables for Equations 1 and 2 are defined as follows:

| | |
|---|---|
| $\chi_{n_1n_2n_3} =$ | the magnetic susceptibility of the dipole located at $\delta(x - n_1k, y - n_2k, z + n_3k)$. |
| $k_1, k_2, k_3 =$ | dipole spacing in the x, y, and z directions, respectively. |
| $l_1, l_2, l_3 =$ | the dimensions in x, y, and z, respectively, for which the magnetic susceptibility of the dipoles is nonzero. |
| $s_1, s_2 =$ | the detector spacing in the x and y directions, respectively. |
| $s_3 =$ | the distance the array is translated in the z direction between readings or the z interval between arrays of a multi-plane detector array (i.e., 3D detector array). |

The voltage signal recorded at the detector array over the sample space is given by Equation 2 as follows:

$$V[m_1, m_2, m_3] = \qquad \text{Equation 2}$$

$$\sum_{m_3=0}^{\infty} \sum_{m_2=-\infty}^{\infty} \sum_{m_1=-\infty}^{\infty} C_0 \delta[x - m_1s_1, y - m_2s_2, z - m_3s_3]$$

$$\chi \left[ \sum_{n_3=0}^{+l_3/k} \sum_{n_2=-l_2/2k}^{+l_2/2k} \sum_{n_1=-l_1/2k}^{+l_1/2k} [2z^2 - x^2 - y^2]/ \right.$$

-continued $$[x^2 + y^2 + z^2]^{5/2} * \chi_{n1,n2,n3} \delta[x - n_1 k, y - n_2 k, z - n_3 k]$$

Equation 2 can be represented symbolically as follows:

$$S = C_o(g \times [h^* f] \times u(z))$$

where $C_o$ is the constant which relates voltage to flux stength; S is the discrete function of the voltage signals recorded of the secondary magnetic flux over the sample space; where f is the secondary magnetic flux sampling function given as follows:

$$g = \sum_{m_3=0}^{\infty} \sum_{m_2=-\infty}^{\infty} \sum_{m_1=-\infty}^{\infty} \delta[x - m_1 s_1, y - m_2 s_2, z - m_3 s_3]$$

where h is the system function which is also defined as the geometric system function given as follows $$\frac{2z^2 - x^2 - y^2}{(x^2 + y^2 + z^2)^{5/2}},$$

and it represents the impulse response of the detector array; where the external magnetizing field is set equal to one (if the magnetizing field is nonuniform, then the magnetic susceptibility values determined by solution of Equation 4 must be divided by the strength of the magnetic flux magnetizing the corresponding susceptibility on a value-by-value basis as described in detail in the Altering the Dynamic Range Provided by the System Function Section); where f is the magnetic susceptibility function given as follows:

$$f = \sum_{n_3=0}^{+l_3/k} \sum_{n_2=-l_2/2k}^{+l_2/2k} \sum_{n_1=-l_1/2k}^{+l_1/2k} \chi_{n1,n2,n3} \delta[x - n_1 k, y - n_2 k, z - n_3 k]]$$

and where u(z) is the unitary z function which is one for positive z and zero otherwise. The function g discretizes the continuous voltage function, V, given by Equation 1, which is h convolved with f and multiplied by u(z).

The discrete voltages are used in a computer algorithm to reconstruct the magnetic susceptibility map. The algorithm follows from the following derivation which demonstrates that the magnetic susceptibility values of the dipoles can be recovered from the voltage function defined over the sample space, which, in the present case, is defined as the x,y plane and the positive z axis. The voltage function of Equation 1 is defined over all space, but it can be defined to be zero outside of this exemplary sample space via the operation given below of a multiplication by u(z). Other sample spaces are valid. For each case, the continuous voltage function defined over all space is multiplied by the function which results in the voltage function being nonzero in the sample space and zero outside the sample space. In each case, the appropriate function which defines the sample space is substituted for u(z) in the analysis which follows. Furthermore, as described previously, the system function of the present example is the geometric system function for the z component of a z-oriented dipole, which is given as follows:

$$\frac{2z^2 - x^2 - y^2}{(x^2 + y^2 + z^2)^{5/2}}$$

A different geometric system function applies if a different component of the dipole field is recorded. In each case, the appropriate system function is substituted for h in the analysis which follows.

Consider the function s of Equation 2, which is given as follows:

$$s = (h^* f) \times u(z)$$

which is h convolved with f and multiplied by u(z). S, the Fourier Transform of s, is given as follows:

$$S = (H \times F) * U(k_z)$$

which is the resultant function of H multiplied by F convolved with $U(k_z)$, where H, F, and $U(k_z)$ are the Fourier Transformed functions of h, f, and u(z), respectively. The Fourier Transform of $$f = \sum_{n_3=0}^{+l_3/k} \sum_{n_2=-l_2/2k}^{+l_2/2k} \sum_{n_1=-l_1/2k}^{+l_1/2k} \chi_{n1,n2,n3} \delta[x - n_1 k, y - n_2 k, z - n_3 k]]$$

is $$F = \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

where $x_n = n_1 k$; $y_n = n_2 k$ and $z_n = -n_3 k$.

The Fourier Transform of $u(z) = 1$ for $z > 0$ and zero for $z < 0$ is $$U(k_z) = \tfrac{1}{2}\delta(k_z) + 1/jk_z.$$

The Fourier Transform of the system function $$h = \frac{2z^2 - x^2 - y^2}{(x^2 + y^2 + z^2)^{5/2}} = \frac{2z^2 - p^2}{(p^2 + z^2)^{5/2}}$$

is given as follows. The derivation appears in Appendix IV.

$$H[k_p, k_z] = \frac{4\pi k_p^2}{k_p^2 + k_z^2} \qquad \text{Equation 3}$$

$$H[k_x, k_y, k_z] = \frac{4\pi[k_x^2 + k_y^2]}{k_x^2 + k_y^2 + k_z^2}$$

$$k_x = 2\pi f_x = 2\pi 1/x$$

$$k_y = 2\pi f_y = 2\pi 1/y$$

$$k_z = 2\pi f_z = 2\pi 1/z$$

The product of H and F is convolved with $U(k_z)$ as follows:

$$S = HF * U[k_z] = \frac{2\pi k_p^2}{k_p^2 + k_z^2} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)} +$$

$$1/jk_z * \frac{4\pi k_p^2}{k_p^2 + k_z^2} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

The result is given as follows and the derivation appears in Appendix V.

$$S = 1/2 HF +$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$\left[ \frac{4\pi k_p^2}{k_p^2 + k_z^2} \right] +$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$\left[ \frac{\pi^2 k_p}{k_p^2 + jk_p k_z} e^{-k_p|z_n|} + \frac{\pi^2 k_p}{k_p^2 + jk_p k_z} e^{-k_p|z_n|} \right]$$

The function of S divided by H is given as follows:

$$S = \left[ \frac{2\pi k_p^2}{k_p^2 + k_z^2} - \frac{4\pi^2 k_p^2}{k_p^2 + k_z^2} \right]$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)} +$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$\left[ \frac{\pi^2}{k_p^2 + k_z^2} [k_p^2 - jk_p k_z] e^{-k_p|z_n|} + \frac{\pi^2}{k_p^2 + k_z^2} [k_p^2 + jk_p k_z] e^{+k_p|z_n|} \right]$$

$$S = [1/2 - \pi] \frac{4\pi k_p^2}{k_p^2 + k_z^2}$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)} +$$

$$\frac{\pi^2}{k_p^2 + k_z^2} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$[[1 - jk_z/k_p] e^{-k_p|z_n|} + [1 + jk_z/k_p] e^{+k_p|z_n|}]$$

$$S = [1/2 - \pi] HF + \frac{\pi}{4} H$$

$$\sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$[e^{-k_p|z_n|} + e^{+k_p|z_n|} +$$

$$jk_z/k_p [e^{+k_p|z_n|} - e^{-k_p|z_n|}]; \text{ where } z_n < 0$$

$$S/H = [1/2 - \pi]F +$$

$$\frac{\pi}{4} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$[e^{-k_p|z_n|} + e^{+k_p|z_n|} +$$

$$jk_z/k_p [e^{+k_p|z_n|} - e^{-k_p|z_n|}]]; \text{ where } z_n < 0$$

The Inverse Fourier Transform of S divided by H is given as follows, where the symbol $\mathcal{F}^{-1}(Q)$ is defined as the Inverse Fourier Transform of the function Q.

Inverse Transform 1

$$\mathcal{F}^{-1}[S/H] = \mathcal{F}^{-1} \left\{ [1/2 - \pi]F + \right.$$

$$\frac{\pi}{4} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}$$

$$[e^{-k_p|z_n|} + e^{+k_p|z_n|} +$$

$$\left. jk_z/k_p [e^{+k_p|z_n|} - e^{+k_p|z_n|}]] \right\}; \text{ where } z_n < 0$$

$$\mathcal{F}^{-1}[F] = f = \sum_{z_n} \sum_{y_n} \sum_{x_n} \chi_{n1,n2,n3} \delta[x - x_n, y - y_n, z - z_n]$$

i.e.

$$\mathcal{F}^{-1} \left\{ \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)} \right\}$$

$$= \sum_{n_3=0}^{-l_3/k} \sum_{n_2=-l_2/2k}^{+l_2/2k} \sum_{n_1=-l_1/2k}^{+l_1/2k} \chi_{n1,n2,n3} \delta[x - n_1 k, y - n_2 k, z - n_3 k]$$

$$\mathcal{F}^{-1} \left\{ \frac{\pi}{4} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)} \right.$$

$$[e^{-k_p|z_n|} + e^{+k_p|z_n|} +$$

$$\left. jk_z/k_p [e^{+k_p|z_n|} - e^{-k_p|z_n|}]] \right\}; \text{ where } z_n < 0$$

$$= \frac{\pi}{4} \sum_{n_3=0}^{-l_3/k} \sum_{n_2=-l_2/2k}^{+l_2/2k} \sum_{n_1=-l_1/2k}^{+l_1/2k} \chi_{n1,n2,n3} \delta[x - n_1 k, y - n_2 k, z - n_3 k]$$

$$\left\{ 2\pi \int_{-\infty}^{\infty} \int_{0}^{\infty} e^{-k_p|z_n|} j_0[k_p \rho] k_p dk_p e^{jk_z z} dk_z + \right.$$

$$2\pi \int_{-\infty}^{\infty} \int_{0}^{\infty} e^{+k_p|z_n|} j_0[k_p \rho] k_p dk_p e^{jk_z z} dk_z +$$

$$j2\pi \int_{-\infty}^{\infty} \int_{0}^{\infty} e^{+k_p|z_n|} j_0[k_p\rho] dk_p k_z e^{jk_z z} dk_z -$$

$$j2\pi \int_{-\infty}^{\infty} \int_{0}^{\infty} e^{-k_p|z_n|} j_0[k_p\rho] dk_p k_z e^{jk_z z} dk_z$$

The solution of Inverse Transform 1 appears as follows and the derivation appears in Appendix VI.

$$\mathfrak{F}^{-1}\left\{\frac{\pi}{4} \sum_{z_n=0}^{-l_3} \sum_{y_n=-l_2/2}^{+l_2/2} \sum_{x_n=-l_1/2}^{+l_1/2} \chi_{n1,n2,n3} e^{-j(k_x x_n + k_y y_n + k_z z_n)}\right.$$

$$[e^{-k_p|z_n|} + e^{+k_p|z_n|} +$$

$$\left. j k_z/k_p [e^{+k_p|z_n|} - e^{-k_p|z_n|}]]\right\}; \text{ where } z_n < 0 =$$

$$2\pi\left[\overset{\bullet}{\delta}[z]\left[\frac{|z_n|}{[z_n^2 + p^2]^{3/2}} - \frac{|z_n|}{[z_n^2 + p^2]^{3/2}} + \frac{\frac{1}{2}|z_n|^{-1}}{[z_n^2 + p^2]^{\frac{1}{2}}}\right] +$$

$$2\pi\delta[z]\left[\frac{-1}{[z_n^2 + p^2]^{\frac{1}{2}}} - \frac{1}{[z_n^2 + p^2]^{\frac{1}{2}}}\right]\right]$$

Combine Inverse Transforms and use the rule that a product in the frequency domain Inverse Transforms to a convolution integral in the Spatial Domain $$\mathfrak{F}^{-1}[S/H] = [\tfrac{1}{2} - \pi]$$

$$\sum_{z_n} \sum_{y_n} \sum_{x_n} \chi_{n1,n2,n3} \delta[x - x_n, y - y_n, z - z_n] +$$

$$\frac{4}{\pi} \sum_{z_n} \sum_{y_n} \sum_{x_n} \chi_{n1,n2,n3} \delta[x - x_n, y - y_n, z - z_n] *$$

$$2\pi\left[\delta[z]\left[\frac{|z_n|}{[z_n^2 + p^2]^{3/2}} - \frac{|z_n|}{[z_n^2 + p^2]^{3/2}} + \frac{\frac{1}{2}|z_n|^{-1}}{[z_n^2 + p^2]^{\frac{1}{2}}}\right] +$$

$$2\pi\delta[z]\left[\frac{-1}{[z_n^2 + p^2]^{\frac{1}{2}}} - \frac{1}{[z_n^2 + p^2]^{\frac{1}{2}}}\right]\right]$$

$$\mathfrak{F}^{-1}[S/H] = [\tfrac{1}{2} - \pi]$$

$$\sum_{z_n} \sum_{y_n} \sum_{x_n} \chi_{n1,n2,n3} \delta[x - x_n, y - y_n, z - z_n] +$$

$$\frac{\pi^2}{2} \sum_{z_n} \sum_{y_n} \sum_{x_n} \chi_{n1,n2,n3} \delta[z - z_n]$$

$$\left(\frac{|z_n|}{[z_n^2 + [x - x_n]^2 + [y - y_n]^2]^{3/2}} - \right.$$

$$\frac{|z_n|}{[z_n^2 + [x - x_n]^2 + [y - y_n]^2]^{3/2}} +$$

$$\left.\frac{\frac{1}{2}|z_n|^{-1}}{[z_n^2 + [x - x_n]^2 + [y - y_n]^2]^{\frac{1}{2}}}\right)$$

Evaluate at $x_n, y_n, z_n$

Equation 4
$$\mathfrak{F}^{-1}[S/H]|_{x_n,y_n,z_n} = \chi_{n1,n2,n3}\left[\tfrac{1}{2} - \pi + \frac{\pi^2/4}{z_n^2}\right]$$

$$\therefore \chi_{n1,n2,n3} = \frac{\mathfrak{F}^{-1}[S/H]|_{x_n,y_n,z_n}}{\tfrac{1}{2} - \pi + \frac{\pi^2/4}{z_n^2}}$$

The solution of the magnetic susceptibility of each dipole of the magnetic susceptibility function follows from Equation 4. Discrete values of the voltages produced at the detector array due to the secondary magnetic field are recorded during a scan which represent discrete values of function s (Equation 2); thus, in the reconstruction algorithm that follows, Discrete Fourier and Inverse Fourier Transforms replace the corresponding continuous functions of Equation 4 of the previous analysis.

Discrete values of H of Equation 3, the Fourier Transform of the system function replace the values of the continuous function. Furthermore, each sample voltage of an actual scan is not truly a point sample, but is equivalent to a sample and hold which is obtained by inverting the grid matrices or which is read directly from a microdevice as described in the Finite Detector Length Section. The spectrum of a function discretely recorded as values, each of which is equivalent to a sample and hold, can be converted to the spectrum of the function discretely recorded as point samples by dividing the former spectrum by an appropriate sinC function. This operation is performed and is described in detail in the Finite Detector Length Section. From these calculated point samples, the magnetic susceptibility function is obtained following the operations of Equation 4 as given below.

Reconstruction Algorithm

1) Record the voltages over the sample space.
2) Invert the grid matrices defined by the orthogonal detector arrays described in the Finite Detector Length Section to obtain the sample and hold voltages which form Matrix A (if microdevices are used, form Matrix A of the recorded voltages directly).
3) Three-dimensionally Fourier Transform Matrix A, using a Discrete Fourier Transform formula such as that which appears in W. McC. Siebert, *Circuits, Signals, and Systems*, MIT Press, Cambridge, Mass., 1968, p. 574, incorporated by reference, to form Matrix A* of elements at frequencies corresponding to the spatial recording interval in each dimension.

$$A(x,y,z) \cong A^*(k_x,k_y,k_z)$$

4) Multiply each element of Matrix A* by a value which is the inverse of the Fourier Transform of a square wave evaluated at the same frequency as the element where the square wave corresponds to a sample and hold operation performed on the continuous voltage function produced at the detector array by the secondary field. This multiplication forms matrix A** which is the discrete spectrum of the continuous voltage function discretely point sampled (see the Finite Detector Length Section for details of this operation).

$$A^*(k_x,k_y,k_z) \times 1/\mathrm{sinc}(k_x,k_y,k_z) = A^{**}(k_x,k_y,k_z)$$

5. Multiply each element of Matrix A** by the value which is the inverse (reciprocal) of the Fourier Transform of the system function evaluated at the same frequency as the element to form Matrix B.

$$A^{**}(k_x,k_y,k_z) 1/H(k_x,k_y,k_z) = B(k_x,k_y,k_z)$$

6. Inverse three-dimensionally Fourier Transform Matrix B using a Discrete Inverse Fourier Transform Formula such as that which appears in W. McC. Siebert, *Circuits, Signals, and Systems*, MIT Press, Cambridge, Mass., (1986), p. 574, incorporated by reference, to form Matrix C whose elements correspond to the magnetic susceptibility of the dipoles at the points of the image space of spatial interval appropriate for the frequency spacing of points of Matrix B.

$$B(k_x,k_y,k_z) \cong C(x,y,z)$$

7) Divide each element of Matrix C by $$.5 - \pi + \frac{\pi^2}{4z_n^2}$$

to correct for the restriction that the sample space is defined as z greater than zero. This operation creates Matrix D which is the magnetic susceptibility map.

$$\frac{C(x, y, z)}{.5 - \pi + \frac{\pi^2}{4z_n^2}} = D(x, y, z)$$

(If the magnetizing field is not unity, then further divide each element by the value of the magnetizing field at the position of the corresponding magnetic susceptibility element.)

8) Plot the magnetic susceptibility function with the same spatial interval in each direction as the sampling interval in each direction.

(The above steps relate generally to the program implementation shown in the listings of Appendices VII and VIII as follows. The above steps 1) and 2) relate to the Data Statements beginning at lines 50; and step 3) relates to the X Z and Y FFT operations of lines 254, 455 and 972, respectively Steps 4) and 5) are implemented by the processes of lines 2050, 2155 and and step 6) relates to the X, Y and Z inverse transform of lines 3170, 3422 and 3580, respectively Step 7) relates to the correction and normalization process of line 4677.)

CHART OF RECONSTRUCTION ALGORITHM

| OPERATION | COMPUTATION RESULT | DIMENSIONS | NUMBER OF MULTIPLICATIONS |
|---|---|---|---|
| $V(m_1,m_2,m_3)$ | Measured data | 400 × 120 × 100 | |
| Invert grid matrices to obtain sample and hold values | Calculated data Form Matrix A | 200 × 60 × 100 | 2 × 10⁵ |
| Three-dimensionally Fourier Transform Matrix A | Obtain 100 × 30 × 150 Complex points to form Matrix A* | 100 × 30 × 150 Complex points | 200log200x 60log60x 300log300 = 3.6 × 10⁷ |
| Recall Matrix $T^{-1}$ the inverse of the Transform of the square wave of the sample and hold in the spatial domain | 100 × 30 × 150 Complex points Matrix $T^{-1}$ | 100 × 30 × 150 Complex points | |
| Multiply element $a_{ijk}$ of Matrix A* by element $a_{ijk}$ of Matrix $T^{-1}$ | 100 × 30 × 150 Complex points to form Matrix A** | 100 × 30 × 150 Complex points | 4.5 × 10⁵ |
| Recall Matrix $H^{-1}$, the inverse of the Transform of the System Function | 100 × 30 × 150 Complex form Matrix $H^{-1}$ | 100 × 30 × 150 Complex points | |
| Multiply element $a_{ijk}$ of Matrix $H^{-1}$ by element $a_{ijk}$ of Matrix A** | 100 × 30 × 150 Complex points to form Matrix B | 100 × 30 × 150 Complex points | 4.5 × 10⁵ |
| Inverse three-dimensionally Fourier Transform Matrix B | 200 × 60 × 300 Real points to form Matrix C | 200 × 60 × 300 Real points | 200log200x 60log60x 300log300 = 3.6 × 10⁷ |
| Divide $a_{ijk}$ of Matrix C by the value which corrects for the restricted sample space (and the non-unitary magnetizing field, if applicable) | 200 × 60 × 300 Real points to form Matrix D | 200 × 60 × 300 Real points | 3.6 × 10⁶ |
| Plot Matrix D | Form magnetic susceptibility | 3.6 × 10⁶ points in |

-continued

CHART OF RECONSTRUCTION ALGORITHM

| OPERATION | COMPUTATION RESULT | DIMENSIONS | NUMBER OF MULTIPLICATIONS |
|---|---|---|---|
| | map | image | $7.7 \times 10^7$ multiplications = 1 sec of array processor time |

The Nyquist Theorem With The Determination Of The Spatial Resolution

The derivation of Equation 4 demonstrates that the system function behaves as a filter of the spectrum of the magnetic susceptibility function. It is well known in the art of signal processing that if such a filter passes all frequencies for which an input function has significant energy, then the input function can be recovered completely from samples of the filtered function taken at the Nyquist rate. This premise embodies the Nyquist Sampling Theorem The spectrum of the system function given in the Reconstruction Algorithm Section is given by Equation 3. This function is a band-pass for all frequencies of the magnetic susceptibility function where $k_p$ and $k_z$ are comparable. Thus, the magnetic susceptibility function can be recovered by sampling the continuous voltage function given by Equation 1 at the Nyquist rate, twice the highest frequency of the magnetic susceptibility function, in each spatial dimension over the sample space for which the function has appreciable energy. Sampling operations other than the present operation and the negligible error encountered by not sampling over the entire sample space are discussed in W. McC. Siebert, *Circuits, Signals, and Systems,* MIT Press, Cambridge, Mass., (1986), pp. 435-439 and the references therein disclosed which are all incorporated herein by reference.

In the absence of noise, the spectrum of the magnetic susceptibility function can be completely recovered if the detector spacing frequency is equal to the Nyquist rate which is twice the highest frequency of the magnetic susceptibility function, and this represents the limit of resolution.

However, the density of the detector spacing is limited by noise. The three-dimensional magnetic susceptibility map is a reconstruction from independent recordings at independent detector spatial locations relative to the voxels of the susceptibility map where two detector signals are independent if they are sufficiently spatially displaced from each other such that the difference in signal between the two detectors due to a test voxel is above the noise level. The resolution based on signal-to-noise arguments is discussed in the Contrast and Limits of Resolution Section.

Contrast and Limits of Resolution

The ability to visualize a structure in a noise-free environment depends, among other factors, on the local contrast C, which is defined as $C=\Delta I/\bar{I}$, where $\bar{I}$ is the average background intensity and $\Delta I$ is the intensity variation in the region of interest.

The contrast for MSI is typically greater than 20%, which compares favorably with computed tomography where the contrast of soft tissue is 0.1%. Contrast, however, is not a fundamental limit on visualization since it can be artificially enhanced by, for example, subtracting part of the background or raising the intensity pattern to some power. Noise, however, represents a fundamental limitation on the ability to visualize structures. The signal-to-noise ratio, a basic measure of visualization, is determined by the ratio of the desired intensity variations to the random intensity variations, which are governed by the statistical properties of the system. The signal-to-noise ratio is defined as $SNR=\Delta I/\theta_I=C\bar{I}/\theta_I$, where $\theta_I$ is the standard deviation of the background intensity representing the rms value of the intensity fluctuations.

The noise properties of the MSI phenomenon involve additive noise only. An unpaired electron has a magnetic moment $\mu_e$. Its energy is affected by the presence of a magnetic field and the energy levels in the presence of the field are given as follows:

$$E_m = {}^-g\mu_e Bm_z$$

$m_z$ is the magnetic quantum number which can take the values $+\frac{1}{2}$, g is the electron g-factor, 2.002, B is the magnetizing flux density, and $\mu_e$ is the electron magnetic moment, $9.28 \times 10^{-24}$ J/T. The ratio of the number of electrons in the parallel versus antiparallel quantum state is given by the Boltzmann equation.

$$N/N_o = e^{-\Delta E/kT}$$

where $\Delta E$ is the energy difference between two magnetic sublevels, k is the Boltzmann constant, $1.38 \times 10^{-23}$ J/° k, and T is the absolute temperature. A material containing unpaired electrons at a concentration of $10^{-2}$ M at room temperature would possess an excess of $1.34 \times 10^{10}$ electrons aligned parallel versus antiparallel per nanoliter which represents a cubic voxel of dimensions of 0.1 mm per side. Measurable quantum fluxuations of $10^{10}$ particles would violate the laws of entropy; thus, the uncertainties lie almost completely in the noise added by the measurement system rather than those of the susceptibility itself.

The magnitude of the signal from a given voxel is given as follows.

The magnetic moment of a voxel of dimensions x' by y' by z' with a magnetic susceptibility X permeated by an external magnetic flux density of B is given as follows:

$$m = x'y'z'\chi B$$

The magnetic flux produced by this magnetic moment at a detector, where the orientation of the voxel and detector are as shown in FIG. 3 is given as follows:

$$B_z = (x'y'z')(2b^2 - a^2)\chi B/[(a^2+b^2)^{5/2}] \qquad \text{Equation 5}$$

As discussed below in the Detector Array Section, a single component of a magnetic field can be detected, for example, as a Hall voltage by producing charge motion in a direction perpendicular to that of the magnetic field component. The application of a voltage to a semiconductor such as InSb results in the production of electrons and holes which carry a current and are bent in opposite directions by a transverse magnetic field due to the Lorentz force; thus, a Hall voltage is produced in the direction perpendicular to both the direction of the current and the direction of the magnetic field. The SNR of this voltage signal determines the resolution.

The detector measurement error due to temperature drift, in plane Hall effect (for a field in the plane of the detector array of less than 10 Guass), and irreproducibility and nonlinearity can be suppressed to less than 0.001%, and the dominant sources of semiconductor detector measurement error are thermal noise, 1/f noise which originates from charge carriers whose average lifetime is not constant, and Hall noise which originates from the altered spatial distribution of fluctuations of charge carrier density in the presence of a magnetic field. High sensitivity micromagnetic field detectors such as Van der Pauw devices, Magnetic Avalanche Transistor devices, and magnetoresistive devices achieve a SNR greater than one of the measurement of a magnetic flux of $\ln T = 10\mu G$.

Setting the flux density of Equation 5 equal to one nT provides an expression for the limiting voxel dimensions providing a SNR greater than unity.

$$10^{-5} = x'y'z'(2b^2 - a^2)\chi B/(a^2 + b^2)^{5/2}$$

An exemplary calculation is given below for the following values of the parameters.

a = 0 cm
b = 10 cm
X = $10^{-4}$
B = $12 \times 10^4$ G $$x'y'z'(2)(12)/10^3 = 10^{-5}$$

$$x'y'z' = 4.1 \times 10^{-4} \text{ cm}^3$$

$$x' = y' = z' = 0.75 \text{ mm}$$

In addition to detector error, irreproducibility of the external magnetizing field can limit the SNR provided by the voxel. The error due to both sources is determined as follows.

The error in a signal whose function involves multiplication of variables with error is found as follows. Consider the function F(x,y,z), where x, y, and z are experimentally measured quantities with errors $e_x$, $e_y$, and $e_z$, respectively. If x, y, and z are independent of each other, then the most probable propagated error in F is given by the equation, $$e_F = \sqrt{[(\delta F/\delta x)^2 e_x^2 + (\delta F/\delta y)^2 e_y^2 + (\delta F/\delta z)^2 e_z^2]}$$

For MSI, the signal is given by the following function:

$$V = [k \, x'y'z'\chi B \, (2b^2 - a^2)]/(a^2 + b^2)^{5/2}$$

where k is the voltage response of the detector per Guass of flux density, a and b are the distances of the voxel from the detector in the x and z directions, respectively, as shown in FIG. 3, x', y', and z' are the dimensions of the voxel, $\chi$ is the magnetic susceptibility and B is the flux density of the external field.

If the flux of the external magnetizing field can be reproducibly confined to be in plane at the detector array and if the detectors have a negligible response to this flux, then the dominant sources of error are the statistical noise of the voltage responses of the detectors and the irreproducibility of the magnetizing field at the position of the voxels.

Considering a single detector and voxel, the absolute error or noise level due to both of the sources is given as follows:

$$e_v = \{[x'y'z'(2b^2 - a^2)\chi B/(a^2+b^2)^{5/2}]^2 e_k^2 + [Kx'y'z'(2b^2 - a^2)\chi/(a^2+b^2)^{5/2}]^2 e_B^2\}^{\frac{1}{2}}$$

For the following values of the parameters $e_v = 0.2$ nV, where the error associated with the detector predominates.

k = $5 \times 10^{-4}$
x' = y' = z' = 1 mm
a = 0 cm
b = 1 cm
$\chi = 10^{-4}$
B = 10 guass
$e_B = 10^{-5}$
$e_K 10^{-4}$ But, the sources of detector error as described before are random, and the noise is averaged out as the number of detectors increases. Typically, the noise is suppressed by a factor of the inverse square root of the number of detectors. Thus, the effective limit of flux detection is increased by a factor of the square root of the number of detectors for a constant SNR.

The voxel dimensions at the limit of resolution given that an effective flux change of 10 nG is detectable is given below. 4 The predominant term for the $\bar{z}$ component of the secondary magnetic field due to a ring, shell or sphere of dipoles of radius R was given in the Uniqueness Section as follows:

$$B_z = \frac{m(2z^2 - x^2 - y^2)}{(R^2 + x^2 + y^2 + z^2)^{5/2}}$$

During the scanning operation, the $\bar{z}$ component of the secondary magnetic field is recorded, and the resultant signals contain error. This error represents ambiguity in the reconstruction where dipoles can be replaced by spheres of radius R, as demonstrated in the above equation. The magnitude of R determines the voxel size and thus the resolution and is calculated as follows:

$$\Delta B_z = \frac{m[2z^2 - x^2 - y^2]}{[x^2 + y^2 + z^2]^{5/2}} - \frac{m[2z^2 - x^2 - y^2]}{[R^2 + x^2 + y^2 + z^2]^{5/2}}$$

Given that m = $12 \times 10^{-3}$, x = y = 0, z = 15 cm, and $\Delta B_z$ = 10 nG, the resolution at a depth of 15 cm from the detector array is calculated to be 0.65 mm as follows:

$$10^{-8} = 12 \times 10^{-3}(2)(10)^2[1/10^5 - 1/(R^2 + 10^2)^{5/2}]R$$
$$= 0.129 \text{ cm} = 1.3 \text{ mm}$$

Therefore, the distance between two dipoles is 0.65 mm.

Finite Detector Length

The system function, h, of the Reconstruction Algorithm Section is the impulse response for a point detector. The following analysis will concern the impulse response for a detector which has finite dimensions.

Consider rows of detectors with spacing s which sample in the y direction and have finite length, l, in the x direction, as shown in FIG. 4.

The voltage, $V_n$, at a detector, n, is given as follows:

$$V_n = C\chi B \left[ \left( \frac{2z^2 - y_n^2}{y_n^2 + z^2} \right) \left[ \frac{2x_m}{[y_n^2 + z^2][x_m^2 + y_n^2 + z^2]^{1/2}} + \frac{x_m}{3[x_m^2 + y_n^2 + z^2]^{3/2}} \right] + \frac{x_m}{3[x_m^2 + y_n^2 + z^2]^{3/2}} - $$

-continued $$\frac{x_m}{3[y_n^2 + z^2][x_m^2 + y_n^2 + z^2]^{1/2}} -$$

$$\left\{\frac{2z^2 - y_n^2}{y_n^2 + z^2}\left[\frac{2[x_m + 1]}{[y_n^2 + z^2][[x_m + 1]^2 + y_n^2 + z^2]^{1/2}} + \right.\right.$$

$$\left.\frac{[x_m + 1]}{3[[x_m + 1]^2 + y_n^2 + z^2]^{3/2}}\right] + \frac{[x_m + 1]}{3[[x_m + 1]^2 + y_n^2 + z^2]^{3/2}} -$$

$$\left.\frac{[x_m + 1]}{3[y_n^2 + z^2][[x_m + 1]^2 + y_n^2 + z^2]^{1/2}}\right)$$

This is the impulse response which is the system function which replaces h for a finite length detector The Fourier Transform of this system function contains an argument of a product of the detector length, l, and the spatial frequency variables Reconstruction could be performed as previously described in the Reconstruction Algorithm Section where this system function is substituted for the system function for a point detector. Another approach is to use two orthogonal arrays of detectors where the detectors of finite length with spacing between detectors of s are organized into n rows. The orthogonality of any two rows of the two orthogonal detector arrays defines square grids of orthogonally overlapping detectors of dimensions, l, the length of any individual detector with $1/s$ detectors per side of the grid. Each composite square grid is called an R square consisting of component small blocks called Q squares. The $2\, 1/s$ detector values of an R square can be used to solve for a signal value of $2\, 1/s$ Q squares by solving 2 $1/s$ equations in $2\, 1/s$ unknowns by matrix inversion. The resulting values represent the average signal for each Q square center location The effect of this data processing operation on the spectrum can be modelled as a sample and hold, where the voltages at the centers of the Q squares are sampled by multiplying by a picket fence of delta functions spaced s apart which are convolved with a square wave function, d, of width 2s. In the frequency domain, this data processing operation causes the spectrum of the signal function s to be multiplied by D, the Fourier Transform of the square wave function of width 2s, to form function S*. If this multiplication does not multiply S, the Fourier Transform of the signal function, s, by zero for any frequency less than its bandwidth, then S can be recovered from S* by multiplying S* with the inverse of the transform of the sample and hold square wave function, a sinc function This analysis applies to all axes in which direction the detectors have finite length. Furthermore, as stated previously, z sampling is achieved by translating the array in the z direction by interval distances at which points discrete signals are recorded or by using multiple parallel plane detector arrays spaced at the sampling interval along the z axis. However, if the signals are not sampled at discrete z points, but each sample point is the integral resultant of the signal acquired continuously over a z displacement of q, which is much greater than the dimension of the detector in the z direction, then the sample and hold square wave has width q.

For a detector array comprising microdevice magnetic field sensors, the voltage of each device is read and treated as the average value of the magnetic flux over the dimensions of the active area of the sensor. Each value is treated as a sample and hold as in the previous analysis where the length of the active area of the detector in each direction is used as the width of the corresponding square wave.

Altering The Dynamic Range Provided By The System Function

The system function used in the Reconstruction Algorithm Section was the geometric system function, h, given as follows:

$$h = \frac{2z^2 - x^2 - y^2}{(x^2 + y^2 + z^2)^{5/2}}$$

This function is the impulse response at the detector array of the z component of the magnetic field of a z-oriented dipole. The geometric system function convoluted with the advanced and delayed dipoles, which is represented by the function f defined in the said section, gives the function of the secondary flux when the tissue is magnetized with a constant magnetic field of unity. When the tissue is magnetized with a magnetic field whose function is not unity, the solution of Equation 4 of the said section gives the magnetic moment of the voxel which is the product of the magnetic susceptibility and the external flux magnetizing the voxel. To obtain the magnetic susceptibility of the voxel, the solved magnetic moment is divided by the magnitude of the flux magnetizing the voxel.

Consider the case where a quadratic magnetizing field gradient is applied along the z-axis as shown in FIG. 4, where the magnetizing field strength increases with distance from the detector array. A function of such a field is given as follows:

$$B_z = B_0[a^2 + z_n^2]^{3/2} \qquad \text{Equation 6}$$

where a and $B_0$ are constants, and $z_n$ is the distance of the dipole representing the voxel from the detector array. The system function in this case is given as the product of h and Equation 6. And, the function of the secondary magnetic flux is given by the convolution of the function f with the product h and Equation 6, where the advance of each dipole in the z direction which appears in the function f is substituted for the variable $z_n$ of Equation 6, which reduces this part of the function to a constant; thus, it follows that the solution of Equation 4 of the Reconstruction Algorithm Section is the magnetic moment of the voxel and that the magnetic susceptibility is given by dividing the said solution by the magnetizing flux.

The purpose of applying a field gradient is to change the dynamic range of the signals of the secondary magnetic field For example, the signal due to the z component of a z-oriented dipole falls off as the inverse distance in z cubed; to reduce the dynamic range of the signals for dipoles at different distances along the z axis from the detector array, a quadratic magnetizing field gradient is applied along the z axis, where the magnetizing field strength increases with distance from the detector array.

It was demonstrated in the Contrast and Limits of Resolution Section that the signal-to-noise ratio produced at the detector by the voxels determines the limits of resolution. The application of a gradient of magnetizing field which compensates for the dropoff of signal as a function of distance from the array improves the resolution relative to that which is possible in its absence. The gradient levels the signal as a function of distance. In effect, it prevents the contributions produced by voxels in close proximity to the array from dominating the detector signal such that contributions of distant voxels are lost in the relative error. Thus, the limits of resolution are determined by the SNR of the detectors.

Uses

The MSI image system responds to deoxyhemoglobin and oxygen; thus, it is selective to the anatomy and physiology of the cardiopulmonary and vascular systems. The imaging system can be used to image ischemic tissue, including that associated with cerebral vascular disease, ischemic heart disease, peripheral vascular disease, myocardial, brain, or bowel infarction, and pulmonary, peripheral and cerebral emboli. The system can be used to image the anatomy of the arterial and venous vascular systems, including the coronary, peripheral, renal, and cerebral arteries, and the peripheral and central venous systems, to assess atherosclerotic disease and vasculitides and venous thrombosis and phlebitis, respectively. The system can be used to identify pathology which has a specific signature, such as abnormal anatomical patterns of vessels or abnormal levels of oxygen tension. For example, decreased blood flow in certain regions of the brain is indicative of Alzheimer's disease, and cancer produces an abnormal vascular pattern and tends to outgrow its blood supply, producing ischemia in this tissue, which is an increased concentration of deoxyhemoglobin with an enhanced MSI signal.

Furthermore, the system according to the present invention can be used to determine physiological parameters, such as cardiac output, and to perform studies, such as pulmonary function tests.

Moreover, the imaging system according to the present invention permits physicians to view human anatomy and pathology in a manner which is not available through use of conventional technology. The present system can achieve .6 mm resolution, which is the level of resolution of angiography, with data acquisition times less than those which result in diminished image quality due to motion artifact; the system is non-invasive; the system does not use ionizing radiation; and it is specifically sensitive to the cardiopulmonary system, which is unique. And, unlike conventional imaging modalities, including angiography, it is three-dimensional. In the present MSI system an image is provided which can be rotated in space to be displayed on any perspective and image processing instruments.

Comparison Of MSI To CT And Emission Tomography

CT and emission tomographic imaging are very analogous to MSI imaging. In all cases, information is taken outside of the image space over the number of dimensions that are to be reconstructed, where sampling over the sample space is at the Nyquist rate. In the CT and emission tomographic cases, the angular distance between projections and the distance between ray paths are the Nyquist interval. In the MSI case, the distance between samples of the secondary magnetic field over the sample space is the Nyquist interval. The reconstruction model in all cases can be reduced to a series of spatially distributed impulses, where each impulse represents the density function at the intersection of two or more rays, a uniform gamma ray source, or a magnetic dipole representing a magnetized voxel, in the case of CT, emission tomography, or MSI, respectively. In each case, data is sampled over the sample space, convolved and back-projected where pixels are reconstructed in the cases of CT and emission tomography, and voxels are reconstructed in the case of MSI. The spatially distributed impulse model behaves well mathematically in all cases and is particularly appropriate for the MSI case, especially in light of the validity of the physical basis of such a model.

And, contrast agents which provide signals from spatially distributed magnetic dipoles are available. For example, hydrogen peroxide has previously been demonstrated as a safe contrast agent for ultrasonic imaging. The dipole nature of magnetized blood can be enhanced using hydrogen peroxide as a contrast agent, where hydrogen peroxide generates paramagnetic oxygen bubbles in blood, where the magnetized oxygen bubbles and the intervening magnetized discontinuous volumes of blood provide signals of independent dipoles.

It is within the scope of this invention to derive or measure the gradient of the secondary magnetic field. The gradient field is obtained with a detector array, as described in the Detector Array Section, by subtracting the readings of adjacent detectors or by recording the gradient of the secondary field with a translated two-dimensional array or with a three-dimensional array of gradient magnetometers which comprise devices such as those described in the Detector Array Section. The gradient magnetic field is also obtained directly with a translated two-dimensional array or three-dimensional array of SQUID (Superconducting Quantum Interference Device) detectors or optical fiber magnetic field sensors which can detect changes of flux of $10^{-11}$ G. The magnetic susceptibility map is reconstructed from the gradient measurements where the derivative of the geometric system function is substituted for the geometric system function of Equation 4 of the Reconstruction Algorithm Section.

EXPERIMENTAL SECTION

A micromanipulator was rigidly fastened to the frame of a Brucker 1.4 T permanent magnet comprising cobalt/samarium poles where the separation distance between the pole faces was 1.5 cm and the diameter of the pole faces was 7 cm. The micromanipulator comprised a device which provided precise independent mechanical movement of a strut along three mutually perpendicular axes. A glass rod was fastened to the strut. A thin-glass capillary was fastened to the glass rod A FW Bell BH-705 Hall generator was fastened to the capillary. The micromanipulator was oriented such that movement of the strut caused the attached generator to transverse the entire space defined by the perimeters of the pole faces. A 5 volt constant voltage power supply was connected in series to two 50 ohm resistors and the input leads of the Hall generator. A 200 millivolt full scale, four digit voltmeter was connected to the output leads of the Hall generator. The Hall generator was oriented such that it responded only to the z component of the magnetic field as the z axis appears in FIG. 5. The Hall generator was moved in 1 mm increments along each of the three mutually perpendicular axes to transverse the entire space comprising a cylindrical area of radius 1 cm from the center of the pole faces and length equal to the separation distance of the pole faces. The Hall generator readings were constant to three parts per 1000 over this space.

Figure 5A:
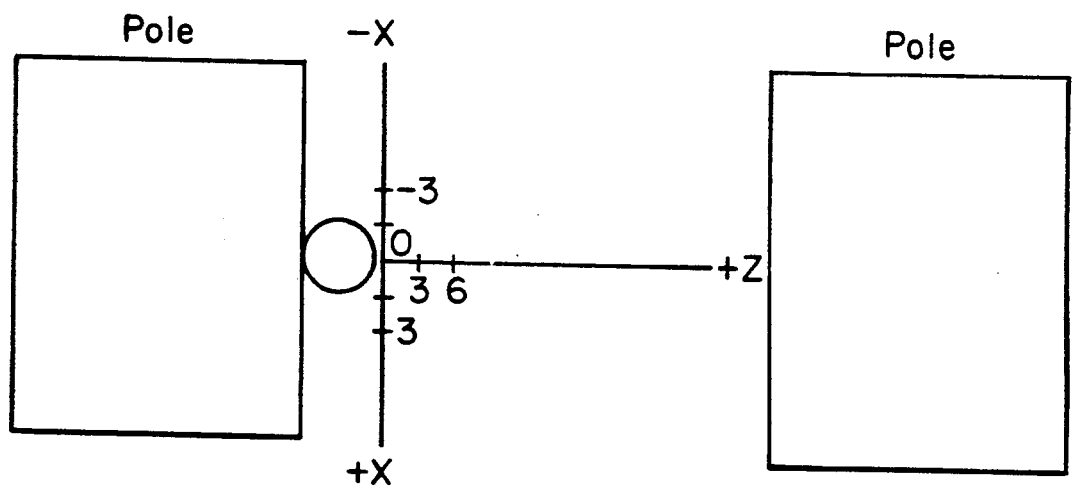
FIGS. 5a and 5b are the coordinate system of the prototype.
Figure 5B:
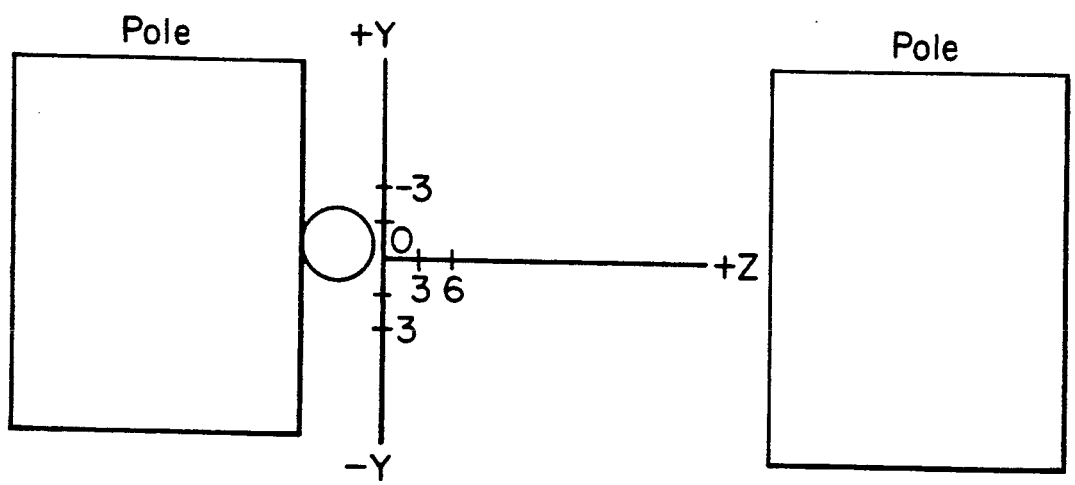

A steel ball bearing of 3 mm diameter was placed in the magnet such that the center of the sphere was just off center of the point (x=0, y=1, z=−4) towards the point (x=−1, y=1, z=−4) as defined by the coordinate system shown in FIG. 5 where points were spaced at increments of 0.5 mm along the z axis and 1 mm along the x and y axes. Hall voltage readings were recorded over the x-y plane and the positive z axis at each independent point separated by a spatial displacement of 0.05 cm in the z direction and 0.1 cm in the x and y directions for a total of nine displacemnts along each axis. The coordinate system is shown in FIG. 5. The recordings are given in millivolts in Table 1.

It is appreciated by one skilled in the art that a spherical ferromagnetic material, when magnetized, produces a field corresponding to a dipole at the center of the field (Jackson). The data of Table 1 was entered into the computer program, PSI PROTOTYPE, which is based on Equation 4 of the Reconstruction Algorithm Section, and the phantom was reconstructed. The results appear in Table 2 The data of Table 1 was further entered into the computer program, PSI PROTOTYPE I, which is based on Equation 4 of the Reconstruction Algorithm Section, and which uses a sinc filter to correct for the finite detector dimensions as described in the Finite Length Detector Section The results of the reconstruction appear in Table 3. The results indicate that the phantom was reconstructed at the correct position which was just off of center at point (x=0, y=1, z=−4) towards the print (x=−1, y=1, z=−4) with a two point point-spread in the x and y directions and a single point point-spread in the z direction. (The point-spread criteria was full width at half maximum).

TABLE 1

Voltage Data Obtained of the Phantom by the Prototype

| x = −4 (x = 1) | x = −3 (x = 2) | x = −2 (x = 3) | x = −1 (x = 4) | x = 0 |   |
|---|---|---|---|---|---|
| Plane: y = −4 |||||  |
| 0 | 0 | −.6 | −.5 | −.3 |  |
| −.3 | −.3 | 0 | 0 |  | z = 0 |
| 0 | 0 | −.5 | −.4 | −.3 |  |
| −.3 | −.3 | 0 | 0 |  | z = −1 |
| 0 | 0 | −.5 | −.3 | −.3 |  |
| −.2 | −.2 | 0 | 0 |  | z = −2 |
| 0 | 0 | −.4 | −.2 | −.2 |  |
| −.1 | −.2 | 0 | 0 |  | z = −3 |
| 0 | 0 | −.3 | −.1 | −.2 |  |
| −.1 | −.1 | 0 | 0 |  | z = −4 |
| 0 | 0 | −.2 | −.1 | −.1 |  |
| 0 | 0 | 0 | 0 |  | z = −5 |
| 0 | 0 | −.1 | 0 | 0 |  |
| 0 | 0 | 0 | 0 |  | z = −6 |
| 0 | 0 | −.1 | 0 | 0 |  |
| 0 | 0 | 0 | 0 |  | z = −7 |
| 0 | 0 | 0 | 0 | 0 |  |
|  |  |  |  |  | z = −8 |
| Plane: y = −3 |||||  |
| 0 | 0 | −.9 | −.7 | −.4 |  |
| −.6 | −.5 | 0 | 0 |  | z = 0 |
| 0 | 0 | −.8 | −.6 | −.5 |  |
| −.4 | −.5 | 0 | 0 |  | z = −1 |
| 0 | 0 | −.6 | −.4 | −.4 |  |
| −.2 | −.4 | 0 | 0 |  | z = −2 |
| 0 | 0 | −.5 | −.2 | −.3 |  |
| −.1 | −.3 | 0 | 0 |  | z = −3 |
| 0 | 0 | −.2 | −.1 | −.2 |  |
| −.1 | −.2 | 0 | 0 |  | z = −4 |
| 0 | 0 | −.1 | 0 | −.1 |  |
| 0 | −.1 | 0 | 0 |  | z = −5 |
| 0 | 0 | 0 | 0 | −.1 |  |
| 0 | −.1 | 0 | 0 |  | z = −6 |
| 0 | 0 | 0 | .1 | −.1 |  |
| 0 | 0 | 0 | 0 |  | z = −7 |
| 0 | 0 | 0 | 0 | 0 |  |
|  |  |  |  |  | z = −8 |

TABLE 1-continued

Voltage Data Obtained of the Phantom by the Prototype

| x = −4 (x = 1) | x = −3 (x = 2) | x = −2 (x = 3) | x = −1 (x = 4) | x = 0 |   |
|---|---|---|---|---|---|
| Plane: y = −2 |||||  |
| 0 | 0 | −1.1 | −.6 | −.7 |  |
| −.4 | −.6 | 0 | 0 |  | z = 0 |
| 0 | 0 | −.8 | −.6 | −.7 |  |
| −.2 | −.4 | 0 | 0 |  | z = −1 |
| 0 | 0 | −.6 | −.3 | −.6 |  |
| .1 | −.2 | 0 | 0 |  | z = −2 |
| 0 | 0 | 0 | 0 | −.4 |  |
| .2 | −.1 | 0 | 0 |  | z = −3 |
| 0 | 0 | .1 | .2 | −.2 |  |
| .1 | −.1 | 0 | 0 |  | z = −4 |
| 0 | 0 | .1 | .2 | .1 |  |
| .1 | 0 | 0 | 0 |  | z = −5 |
| 0 | 0 | .1 | .2 | 0 |  |
| .1 | .1 | 0 | 0 |  | z = −6 |
| 0 | 0 | 0 | .2 | 0 |  |
| 0 | 0 | 0 | 0 |  | z = −7 |
| 0 | 0 | 0 | .1 | 0 |  |
| 0 | 0 | 0 | 0 |  | z = −8 |
| Plane: y = −1 |||||  |
| 0 | 0 | −1.2 | .7 | .7 |  |
| 2.7 | −.6 | 0 | 0 |  | z = 0 |
| 0 | 0 | −1 | 1.2 | −.3 |  |
| 2.7 | −.1 | 0 | 0 |  | z = −1 |
| 0 | 0 | −.5 | 1.3 | −.8 |  |
| 2.1 | .2 | 0 | 0 |  | z = −2 |
| 0 | 0 | −.1 | 1.3 | −.4 |  |
| 1.2 | 0 | 0 | 0 |  | z = −3 |
| 0 | 0 | .9 | 1 | −.1 |  |
| .7 | 0 | 0 | 0 |  | z = −4 |
| 0 | 0 | 1 | .7 | 0 |  |
| .5 | .1 | 0 | 0 |  | z = −5 |
| 0 | 0 | .8 | .5 | 0 |  |
| .4 | .1 | 0 | 0 |  | z = −6 |
| 0 | 0 | .7 | .3 | 0 |  |
| .2 | .1 | 0 | 0 |  | z = −7 |
| 0 | 0 | .5 | .1 | 0 |  |
| .1 | 0 | 0 | 0 |  | z = −8 |
| Plane: y = 0 |||||  |
| 0 | 0 | −1.8 | 4.2 | 13.9 |  |
| 10.7 | .3 | 0 | 0 |  | z = 0 |
| 0 | 0 | −1.2 | 4.1 | 3.7 |  |
| 4.3 | 1.1 | 0 | 0 |  | z = −1 |
| 0 | 0 | −.5 | 3.9 | 1.5 |  |
| 3.5 | 1.2 | 0 | 0 |  | z = −2 |
| 0 | 0 | −.1 | 3.1 | 1.1 |  |
| 1.6 | .3 | 0 | 0 |  | z = −3 |
| 0 | 0 | 1.6 | 2.2 | .6 |  |
| .9 | .2 | 0 | 0 |  | z = −4 |
| 0 | 0 | 1.4 | 1.5 | .7 |  |
| .5 | .2 | 0 | 0 |  | z = −5 |
| 0 | 0 | .9 | 1.1 | .3 |  |
| .3 | .1 | 0 | 0 |  | z = −6 |
| 0 | 0 | .7 | .6 | .1 |  |
| .2 | .1 | 0 | 0 |  | z = −7 |
| 0 | 0 | .4 | .4 | 0 |  |
| .1 | 0 | 0 | 0 |  | z = −8 |
| Plane: y = 1 |||||  |
| 0 | 0 | 5.7 | 19.7 | 25.65 |  |
| 12.4 | 3.7 | 0 | 0 |  | z = 0 |
| 0 | 0 | −.8 | 12.7 | 9.05 |  |
| 10.6 | 1.1 | 0 | 0 |  | z = −1 |
| 0 | 0 | .3 | 8.1 | 1.65 |  |
| 7.1 | 1.1 | 0 | 0 |  | z = −2 |
| 0 | 0 | 1.7 | 4.1 | .65 |  |
| 4.9 | 1.3 | 0 | 0 |  | z = −3 |
| 0 | 0 | 1.6 | 2.7 | .25 |  |
| 2.8 | .3 | 0 | 0 |  | z = −4 |
| 0 | 0 | 1.3 | 2 | .25 |  |
| 1.3 | .1 | 0 | 0 |  | z = −5 |
| 0 | 0 | 1 | 1.3 | .15 |  |
| .9 | .1 | 0 | 0 |  | z = −6 |
| 0 | 0 | .6 | .8 | .15 |  |
| .5 | .1 | 0 | 0 |  | z = −7 |
| 0 | 0 | .4 | .5 | .05 |  |
| .3 | .1 | 0 | 0 |  | z = −8 |

TABLE 1-continued

Voltage Data Obtained of the Phantom by the Prototype

Plane: y = 2

| x = −4 (x = 1) | x = −3 (x = 2) | x = −2 (x = 3) | x = −1 (x = 4) | x = 0 | |
|---|---|---|---|---|---|
| 0 | 0 | 3.5 | 7.8 | 10.1 | |
| 5.6 | .9 | 0 | 0 | | z = 0 |
| 0 | 0 | 6.9 | 0 | 7.6 | |
| .8 | 1.7 | 0 | 0 | | z = −1 |
| 0 | 0 | 2.5 | 1.7 | 4.7 | |
| .7 | 1.4 | 0 | 0 | | z = −2 |
| 0 | 0 | 1.5 | 3.4 | 2.9 | |
| .1 | .6 | 0 | 0 | | z = −3 |
| 0 | 0 | .4 | 3.7 | 1.6 | |
| 0 | .3 | 0 | 0 | | z = −4 |
| 0 | 0 | .2 | 2.9 | .9 | |
| 0 | .2 | 0 | 0 | | z = −5 |
| 0 | 0 | .1 | 2 | .6 | |
| 0 | .2 | 0 | 0 | | z = −6 |
| 0 | 0 | .1 | 1 | .3 | |
| 0 | .1 | 0 | 0 | | z = −7 |
| 0 | 0 | .1 | .6 | .1 | |
| 0 | 0 | 0 | 0 | | z = −8 |

Plane: y = 3

| x = −4 (x = 1) | x = −3 (x = 2) | x = −2 (x = 3) | x = −1 (x = 4) | x = 0 | |
|---|---|---|---|---|---|
| 0 | 0 | .4 | .1 | .9 | |
| 2.6 | −.5 | 0 | 0 | | z = 0 |
| 0 | 0 | .2 | .6 | 1.3 | |
| 1.7 | .2 | 0 | 0 | | z = −1 |
| 0 | 0 | .1 | .9 | 1.3 | |
| .7 | .4 | 0 | 0 | | z = −2 |
| 0 | 0 | .2 | .9 | 1.1 | |
| .5 | .1 | 0 | 0 | | z = −3 |
| 0 | 0 | 0 | .5 | .7 | |
| .3 | 0 | 0 | 0 | | z = −4 |
| 0 | 0 | 0 | .3 | .4 | |
| .2 | 0 | 0 | 0 | | z = −5 |
| 0 | 0 | 0 | .3 | .2 | |
| .2 | 0 | 0 | 0 | | z = −6 |
| 0 | 0 | 0 | .2 | .1 | |
| .1 | 0 | 0 | 0 | | z = −7 |
| 0 | 0 | 0 | .1 | 0 | |
| .1 | 0 | 0 | 0 | | z = −8 |

Plane: y = 4

| x = −4 (x = 1) | x = −3 (x = 2) | x = −2 (x = 3) | x = −1 (x = 4) | x = 0 | |
|---|---|---|---|---|---|
| 0 | 0 | −.4 | −.9 | −.8 | |
| −.5 | −.1 | 0 | 0 | | z = 0 |
| 0 | 0 | −.2 | −.6 | −.5 | |
| −.4 | −.6 | 0 | 0 | | z = −1 |
| 0 | 0 | −.1 | −.3 | −.3 | |
| −.3 | −.3 | 0 | 0 | | z = −2 |
| 0 | 0 | −.1 | 0 | −.2 | |
| −.3 | −.1 | 0 | 0 | | z = −3 |
| 0 | 0 | 0 | 0 | −.2 | |
| −.2 | −.1 | 0 | 0 | | z = −4 |
| 0 | 0 | 0 | 0 | −.1 | |
| −.1 | −.1 | 0 | 0 | | z = −5 |
| 0 | 0 | 0 | 0 | −.1 | |
| −.1 | 0 | 0 | 0 | | z = −6 |
| 0 | 0 | .1 | 0 | 0 | |
| −.1 | 0 | 0 | 0 | | z = −7 |
| 0 | 0 | 0 | 0 | | |
| −.1 | 0 | 0 | 0 | | z = −8 |

TABLE 2

Reconstruction of Phantom where the Algorithm Based on Equation 4 of the Reconstruction Algorithm Section was used

Plane: y = −4

| x = −4 (x = 1) | x = −3 (x = 2) | x = −2 (x = 3) | x = −1 (x = 4) | x = 0 | |
|---|---|---|---|---|---|
| .131492E-10 | .284364E-10 | .375426E-11 | −.128819E-10 | −.817685E-10 | |
| −.973185E-10 | −.768026E-10 | −.406283E-10 | −.115043E-10 | | z = 0 |
| .16953E-03 | .174958E-03 | .14086E-03 | .154642E-03 | .139905E-03 | |
| .12144E-03 | .961589E-04 | .129703E-03 | .152818E-03 | | z = −1 |
| −.11895E-02 | −.128215E-02 | −.142342E-02 | −.113878E-02 | −.905655E-03 | |
| −.670966E-03 | −.650339E-03 | −.775318E-03 | −.100659E-02 | | z = −2 |
| .152135E-01 | .137972E-01 | .111169E-01 | .852379E-02 | .737269E-02 | |
| .822349E-02 | .106805E-01 | .135142E-01 | .151393E-01 | | z = −3 |
| −.793219E-01 | −.730077E-01 | −.641656E-01 | −.527206E-01 | −.463332E-01 | |
| −.503573E-01 | −.616104E-01 | −.721607E-01 | −.791307E-01 | | z = −4 |
| .931006E-01 | .859648E-01 | .752253E-01 | .618924E-01 | .544743E-01 | |
| .589962E-01 | .720399E-01 | .845797E-01 | .927528E-01 | | z = −5 |
| −.0293 | −.270912E-01 | −.240997E-01 | −.193083E-01 | −.170313E-01 | |
| −.184698E-01 | −.022531 | −.265485E-01 | −.029169 | | z = −6 |
| .151382E-01 | .141115E-01 | .123314E-01 | .104191E-01 | .882567E-02 | |
| .924904E-02 | .115864E-01 | .138201E-01 | .151305E-01 | | z = −7 |
| −.773341E-02 | −.719694E-02 | −.756512E-02 | −.53114E-02 | −.271402E-02 | |
| −.142546E-02 | −.361096E-02 | −.619112E-02 | −.751372E-02 | | z = −8 |

Plane: y = −3

| x = −4 (x = 1) | x = −3 (x = 2) | x = −2 (x = 3) | x = −1 (x = 4) | x = 0 | |
|---|---|---|---|---|---|
| .426674E-10 | .766215E-10 | .781962E-10 | .309161E-10 | −.486129E-10 | |
| −.844643E-10 | −.808326E-10 | −.316455E-10 | .575709E-11 | | z = 0 |
| .139351E-03 | .135134E-03 | .792399E-04 | .102976E-03 | .756861E-04 | |
| .865098E-04 | .647045E-04 | .105293E-03 | .128053E-03 | | z = −1 |
| −.106414E-02 | −.113798E-02 | −.127692E-02 | −.100618E-02 | −.726763E-03 | |
| −.466901E-03 | −.565776E-03 | −.64279E-03 | −.887413E-03 | | z = −2 |
| .148289E-01 | .133409E-01 | .102286E-01 | .750262E-02 | .607098E-02 | |
| .723759E-02 | .979496E-02 | .129621E-01 | .147275E-01 | | z = −3 |
| −.799096E-01 | −.744017E-01 | −.066389 | −.533364E-01 | −.451388E-01 | |
| −.494665E-01 | −.060545 | −.712812E-01 | −.789985E-01 | | z = −4 |
| .094427 | .885998E-01 | .786858E-01 | .063505 | .543488E-01 | |
| .583005E-01 | .710072E-01 | .839507E-01 | .930381E-01 | | z = −5 |
| −.296488E-01 | −.278932E-01 | −.246168E-01 | −.187351E-01 | −.172695E-01 | |
| −.182993E-01 | −.219684E-01 | −.262378E-01 | −.291845E-01 | | z = −6 |
| .152621E-01 | .145416E-01 | .132031E-01 | .933994E-02 | .739414E-02 | |
| .885887E-02 | .105076E-01 | .135136E-01 | .150674E-01 | | z = −7 |
| −.749426E-02 | −.702109E-02 | −.639406E-02 | −.204504E-02 | .287697E-04 | |
| .220732E-03 | −.285861E-02 | −.535486E-02 | −.710104E-02 | | z = −8 |

Plane: y = −2

TABLE 2-continued

Reconstruction of Phantom where the Algorithm Based on
Equation 4 of the Reconstruction Algorithm Section was used

| x = −4 (x = 1) | x = −3 (x = 2) | x = −2 (x = 3) | x = −1 (x = 4) | x = 0 | |
|---|---|---|---|---|---|
| .703745E-10 | .128167E-09 | .16432E-09 | .111154E-09 | −.329375E-10 | |
| −.681294E-10 | −.816246E-10 | −.322291E-10 | .16712E-10 | | z = 0 |
| .843776E-04 | .655521E-04 | .550461E-04 | .460526E-05 | −.62816E-04 | |
| −.20975E-04 | −.175481E-04 | .372495E-04 | .768062E-04 | | z = −1 |
| −.835453E-03 | −.887628E-03 | −.104062E-02 | −.532087E-03 | −.295512E-03 | |
| .273948E-03 | .646469E-04 | −.272495E-03 | −.636815E-03 | | z = −2 |
| .124673E-01 | .102022E-01 | .573498E-02 | .10626E-02 | −.140152E-02 | |
| .788574E-03 | .523172E-02 | .987071E-02 | .012404 | | z = −3 |
| −.069643 | −.610384E-01 | −.466779E-01 | −.232114E-01 | −.100012E-01 | |
| −.162018E-01 | −.376669E-01 | −.563834E-01 | −.683104E-01 | | z = −4 |
| .822345E-01 | .072758 | .546738E-01 | .276363E-01 | .115453E-01 | |
| .178799E-01 | .425607E-01 | .656935E-01 | .801441E-01 | | z = −5 |
| −.258189E-01 | −.229213E-01 | −.172557E-01 | −.736645E-02 | −.338784E-02 | |
| −.610373E-02 | −.137143E-01 | −.206035E-01 | −.251199E-01 | | z = −6 |
| .129934E-01 | .113839E-01 | .889354E-02 | .378251E-02 | −.185962E-03 | |
| .318931E-02 | .804608E-02 | .106906E-01 | .127914E-01 | | z = −7 |
| −.662454E-02 | −.558355E-02 | −.276386E-02 | .200449E-02 | .582888E-02 | |
| .274015E-02 | −.164039E-02 | −.451373E-02 | −.631655E-02 | | z = −8 |

Plane: y = −1

| x = −4 (x = 1) | x = −3 (x = 2) | x = −2 (x = 3) | x = −1 (x = 4) | x = 0 | |
|---|---|---|---|---|---|
| .847787E-10 | .18868E-09 | .36158E-09 | .207885E-09 | −.237033E-10 | |
| −.328368E-10 | −.857115E-10 | −.428786E-10 | .159316E-10 | | z = 0 |
| .258223E-04 | −.531909E-04 | −.201884E-03 | −.911632E-04 | −.29284E-03 | |
| −.22801E-03 | −.212592E-03 | −.583098E-04 | .198618E-04 | | z = −1 |
| −.580479E-03 | −.478085E-03 | −.21599E-03 | .868955E-03 | .626072E-03 | |
| .223888E-02 | .119991E-02 | .231194E-03 | −.349457E-03 | | z = −2 |
| .890997E-02 | .49635E-02 | −.26644E-02 | −.987295E-02 | −.175696E-01 | |
| −.113127E-01 | −.286874E-02 | .506711E-02 | .898265E-02 | | z = −3 |
| −.520975E-01 | −.036197 | −.747177E-02 | .414422E-01 | .733732E-01 | |
| .604636E-01 | .55614E-02 | −.314789E-01 | −.050919 | | z = −4 |
| .608925E-01 | .427011E-01 | .762834E-02 | −.496751E-01 | −.858275E-01 | |
| −.702087E-01 | −.113135E-01 | .348024E-01 | .058807 | | z = −5 |
| −.191909E-01 | −.134817E-01 | .211199E-03 | .163275E-01 | .02699 | |
| .022523 | .41222E-02 | −.107533E-01 | −.184352E-01 | | z = −6 |
| .91593E-02 | .561161E-02 | .257204E-02 | −.792133E-02 | −.163623E-01 | |
| −.104461E-01 | −.181947E-02 | .525405E-02 | .907921E-02 | | z = −7 |
| −.546513E-02 | −.365199E-02 | .599324E-02 | .881106E-02 | .931676E-02 | |
| .862534E-02 | .120633E-02 | −.338358E-02 | −.542892E-02 | | z = −8 |

Plane: y = 0

| x = −4 (x = 1) | x = −3 (x = 2) | x = −2 (x = 3) | x = −1 (x = 4) | x = 0 | |
|---|---|---|---|---|---|
| .696308E-10 | .188841E-09 | .46682E-09 | .269954E-09 | −.499944E-10 | |
| −.529323E-10 | −.110869E-09 | −.732289E-10 | −.141281E-11 | | z = 0 |
| .122296E-05 | −.108633E-03 | −.377355E-03 | −.219926E-03 | −.467834E-03 | |
| −.470114E-03 | −.324154E-03 | −.106928E-03 | −.713618E-05 | | z = −1 |
| −.451404E-03 | −.18539E-03 | .583457E-03 | .287676E-02 | .270254E-02 | |
| .413057E-02 | .231167E-02 | .555039E-03 | −.186797E-03 | | z = −2 |
| .567746E-02 | −.969004E-03 | −.141931E-01 | −.025616 | −.403772E-01 | |
| −.299478E-01 | −.113609E-01 | .39958E-03 | .597527E-02 | | z = −3 |
| −.344201E-01 | −.659173-02 | .467711E-01 | .139264 | .21677 | |
| .167423 | .563547E-01 | −.622327E-02 | −.343981E-01 | | z = −4 |
| .391004E-01 | .700743E-02 | −.586962E-01 | −.161848 | −.233465−.18425 | |
| −.722143E-01 | .360276E-02 | .383633E-01 | | | z = −5 |
| −.125247E-01 | −.256439E-02 | .203012E-01 | .514755E-01 | .740281E-01 | |
| .590851E-01 | .235144E-01 | −.917698E-03 | −.120945E-01 | | z = −6 |
| .542755E-02 | −.624386E-03 | −.847236E-02 | −.238413E-01 | −.407709E-01 | |
| −.308616E-01 | −.126592E-01 | −.159331E-03 | .561475E-02 | | z = −7 |
| −.444969E-02 | −.182272E-02 | .111651E-01 | .196736E-01 | .234497E-01 | |
| .120135E-01 | .28118E-02 | −.276816E-02 | −.486242E-02 | | z = −8 |

Plane: y = 1

| x = −4 (x = 1) | x = −3 (x = 2) | x = −2 (x = 3) | x = −1 (x = 4) | x = 0 | |
|---|---|---|---|---|---|
| .269041E-10 | .75012E-10 | .224371E-09 | .218787E-09 | −.12108E-09 | |
| .156353E-10 | −.196456E-09 | −.109697E-09 | −.281517E-10 | | z = 0 |
| .301559E-04 | −.131123E-04 | −.433227E-04 | −.292346E-03 | −.583942E-03 | |
| −.779073E-04 | −.949032E-04 | −.681943E-04 | .113923E-04 | | z = −1 |
| −.579401E-03 | −.470761E-03 | .70731E-03 | .455786E-02 | .203938E-02 | |
| .418994E-02 | .190297E-02 | .467584E-03 | −.260686E-03 | | z = −2 |
| .474527E-02 | −.344297E-02 | −.233312E-01 | −.032298 | −.451664E-01 | |
| −.265314E-01 | −.153394E-01 | −.140992E-02 | .515168E-02 | | z = −3 |
| −.260854E-01 | .116644E-01 | .10624 | .233427 | .295596 | |
| .199334 | .844095E-01 | .485588E-02 | −.277015E-01 | | z = −4 |
| .281843E-01 | −.160533E-01 | −.117039 | −.250077 | −.311774 | |
| −.225528 | −.10032 | −.100105E-01 | .296554E-01 | | z = −5 |
| −.930919E-02 | .415808E-02 | .372485E-01 | .794808E-01 | .985698E-01 | |
| .719222E-01 | .318484E-01 | .313544E-02 | −.95237E-02 | | z = −6 |

TABLE 2-continued
Reconstruction of Phantom where the Algorithm Based on Equation 4 of the Reconstruction Algorithm Section was used

| | | | | |
|---|---|---|---|---|
| .37324E-02 | −.403198E-02 | −.165558E-01 | −.037672 | −.05329 |
| −.333816E-01 | −.164189E-01 | −.205155E-02 | .433268E-02 | $z = -7$ |
| −.403767E-02 | −.343617E-03 | .149593E-01 | .287244E-01 | .211566E-01 |
| .132525E-01 | .762767E-03 | −.328737E-02 | −.495549E-02 | $z = -8$ |

Plane: y = 2

| $x = -4$ | $x = -3$ | $x = -2$ | $x = -1$ | $x = 0$ |
|---|---|---|---|---|
| (x = 1) | (x = 2) | (x = 3) | (x = 4) | |
| −.13124E-10 | −.356162E-10 | −.787993E-10 | .281718E-09 | −.102322E-10 |
| −.163497E-09 | −.137084E-09 | −.101613E-09 | −.452903E-10 | $z = 0$ |
| .909433E-04 | .110369E-03 | .220921E-03 | .884389E-04 | −.132785E-03 |
| −.356396E-03 | −.143044E-03 | −.293539E-04 | .56532E-04 | $z = -1$ |
| −.866414E-03 | −.130983E-02 | −.87122E-03 | .15033E-02 | .268173E-02 |
| .001842 | .148286E-02 | .120778E-03 | −.510476E-03 | $z = -2$ |
| .675482E-02 | .214286E-02 | −.279766E-02 | −.320017E-01 | −.278984E-01 |
| −.249887E-01 | −.770003E-02 | .199209E-02 | .702649E-02 | $z = -3$ |
| −.326049E-01 | −.156564E-02 | .674097E-01 | .159794 | .188327 |
| .136646 | .493079E-01 | −.884849E-02 | −.347904E-01 | $z = -4$ |
| .352439E-01 | −.399141E-02 | −.847492E-01 | −.17888 | −.214742 |
| −.159083 | −.064112 | .566148E-02 | .377599E-01 | $z = -5$ |
| −.116183E-01 | .130935E-03 | .245968E-01 | .0567 | .667959E-01 |
| .492652E-01 | .198382E-01 | −.21107E-02 | −.121812E-01 | $z = -6$ |
| .514869E-02 | −.17211E-02 | −.147888E-01 | −.208316E-01 | −.328363E-01 |
| −.257672E-01 | −.008688 | .113999E-02 | .591773E-02 | $z = -7$ |
| −.462549E-02 | −.949754E-03 | .675495E-02 | .270726E-01 | .139916E-01 |
| .302053E-02 | −.119049E-02 | −.483553E-02 | −.564865E-02 | $z = -8$ |

Plane: y = 3

| $x = -4$ | $x = -3$ | $x = -2$ | $x = -1$ | $x = 0$ |
|---|---|---|---|---|
| (x = 1) | (x = 2) | (x = 3) | (x = 4) | |
| −.265643E-10 | −.461754E-10 | −.926156E-10 | −.511518E-10 | −.687386E-10 |
| −.110601E-09 | −.115145E-09 | −.783568E-10 | −.436585E-10 | $z = 0$ |
| .144078E-03 | .170917E-03 | .201475E-03 | .169937E-03 | .525111E-04 |
| −.571782E-04 | −.496819E-04 | .392287E-04 | .106704E-03 | $z = -1$ |
| −.110955E-02 | −.140902E-02 | −.135009E-02 | −.128344E-04 | .640006E-03 |
| .512834E-03 | .354256E-03 | −.304896E-03 | −.779367E-03 | $z = -2$ |
| .103823E-01 | .73164E-02 | .823116E-03 | −.846081E-02 | −.010429 |
| −.672044E-02 | .900803E-03 | .714598E-02 | .01039 | $z = -3$ |
| −.498482E-01 | −.297228E-01 | .683393E-02 | .444138E-01 | .611604E-01 |
| .469139E-01 | −.240874E-02 | −.350286E-01 | −.051378 | $z = -4$ |
| .559032E-01 | .030472 | −.139444E-01 | −.577928E-01 | −.778343E-01 |
| −.056818 | −.316229E-02 | .376641E-01 | .057894 | $z = -5$ |
| −.179809E-01 | −.102427E-01 | .326737E-02 | .172634E-01 | .023534 |
| .172056E-01 | .312839E-03 | −.122075E-01 | −.184893E-01 | $z = -6$ |
| .877597E-02 | .42589E-02 | −.306109E-02 | −.807887E-02 | −.121161E-01 |
| −.767678E-02 | .4155E-03 | .657349E-02 | .942813E-02 | $z = -7$ |
| −.591585E-02 | −.354668E-02 | −.444666E-03 | .213189E-02 | .341221E-02 |
| .429765E-03 | −.431066E-02 | −.612589E-02 | −.664925E-02 | $z = -8$ |

Plane: y = 4

| $x = -4$ | $x = -3$ | $x = -2$ | $x = -1$ | $x = 0$ |
|---|---|---|---|---|
| (x = 1) | (x = 2) | (x = 3) | (x = 4) | |
| −.131233E-10 | −.125318E-10 | −.257365E-10 | −.648105E-10 | −.117988E-09 |
| −.120606E-09 | −.948047E-10 | −.576148E-10 | −.298425E-10 | $z = 0$ |
| .171481E-03 | .185734E-03 | .178976E-03 | .183862E-03 | .106304E-03 |
| .452167E-04 | .772162E-04 | .109683E-03 | .143905E-03 | $z = -1$ |
| −.120557E-02 | −.132393E-02 | −.123725E-02 | −.100057E-02 | −.654538E-03 |
| −.493149E-03 | −.524899E-03 | −.662665E-03 | −.963561E-03 | $z = -2$ |
| .013552 | .114402E-01 | .753913E-02 | .351291E-02 | .189146E-02 |
| .355072E-02 | .745596E-02 | .114311E-01 | .135114E-01 | $z = -3$ |
| −.679922E-01 | −.567394E-01 | −.397515E-01 | −.236935E-01 | −.151335E-01 |
| −.220137E-01 | −.435248E-01 | −.590564E-01 | −.686627E-01 | $z = -4$ |
| .785327E-01 | .648473E-01 | .437858E-01 | .239348E-01 | .137968E-01 |
| .223481E-01 | .476129E-01 | .678066E-01 | .793872E-01 | $z = -5$ |
| −.248786E-01 | −.020507 | −.132407E-01 | −.775421E-02 | −.440305E-02 |
| −.776573E-02 | −.153512E-01 | −.215222E-01 | −.251093E-01 | $z = -6$ |
| .012672 | .102089E-01 | .651178E-02 | .364643E-02 | .109988E-02 |
| .334272E-02 | .863568E-02 | .114585E-01 | .013003 | $z = -7$ |
| −.71537E-02 | −.599526E-02 | −.458751E-02 | −.32421E-02 | −.196403E-02 |
| −.282305E-02 | −.601099E-02 | −.673301E-02 | −.737539E-02 | $z = -8$ |

TABLE 3
Reconstruction of Phantom Where the Algorithm Based on Equation 4 of the Reconstruction Algorithm Section was used, and a Sinc Filter was used to Correct for the Finite Detector Dimensions

Plane: y = −4

| $x = -4$ | $x = -3$ | $x = -2$ | $x = -1$ | $x = 0$ |
|---|---|---|---|---|
| (x = 1) | (x = 2) | (x = 3) | (x = 4) | |

TABLE 3-continued

Reconstruction of Phantom Where the Algorithm
Based on Equation 4 of the Reconstruction
Algorithm Section was used, and a Sinc Filter
was used to Correct for the Finite Detector Dimensions

| .36582E-09 | .128407E-08 | −.121665E-08 | −.254257E-08 | −.332471E-08 |
|---|---|---|---|---|
| .983561E-09 | −.35947E-08 | .305488E-10 | −.748455E-09 | z = 0 |
| .492313E-03 | .311096E-03 | .443434E-03 | .160281E-03 | .909157E-04 |
| .112546E-02 | −.243822E-03 | .580737E-03 | .13541E-03 | z = −1 |
| −.420759E-02 | .234918E-03 | −.782614E-02 | .002949 | −.613309E-02 |
| .172796E-02 | −.220432E-02 | −.144913E-02 | −.151346E-02 | z = −2 |
| .216085E-01 | .520421E-01 | −.177206E-01 | .635292E-01 | −.170934E-01 |
| .472831E-01 | .847125E-02 | .349118E-01 | .035521 | z = −3 |
| −.169722 | −.162692 | −.128327 | −.134802 | −.719414E-01 |
| −.107784 | −.122212 | −.160791 | −.169775 | z = −4 |
| .20109 | .188056 | .162505 | .146385 | .103702 |
| .131733 | .150768 | .186278 | .199458 | z = −5 |
| −.672482E-01 | −.516098E-01 | −.682108E-01 | −.416752E-01 | −.356591E-01 |
| −.350573E-01 | −.052333 | −.571614E-01 | −.614287E-01 | z = −6 |
| .032733 | .030869 | .284824E-01 | .212636E-01 | .228456E-01 |
| .258041E-01 | .258938E-01 | .299983E-01 | .327264E-01 | z = −7 |
| −.144821E-01 | −.217557E-01 | −.576768E-02 | −.588305E-01 | .240209E-01 |
| −.111801E-01 | .723036E-02 | −.202733E-01 | −.141712E-01 | z = −8 |

Plane: y = −3

| x = −4 | x = −3 | x = −2 | x = −1 | x = 0 |
|---|---|---|---|---|
| (x = 1) | (x = 2) | (x = 3) | (x = 4) | |
| .198255E-08 | .124196E-08 | .374243E-08 | .169269E-08 | −.316008E-08 |
| −.278282E-10 | −.482088E-08 | .107238E-08 | −.107954E-08 | z = 0 |
| .102496E-03 | .721403E-03 | −.623628E-03 | .104361E-02 | −.691776E-03 |
| .84736E-03 | −.173289E-03 | .407308E-03 | .294898E-03 | z = −1 |
| −.16804E-02 | −.253049E-02 | −.236328E-02 | −.353747E-03 | −.536902E-02 |
| .208671E-02 | −.472294E-02 | .651945E-03 | −.314766E-02 | z = −2 |
| .340927E-01 | .028585 | .222134E-01 | .182245E-01 | .106596E-01 |
| .302042E-01 | .114886E-01 | .034397 | .282311E-01 | z = −3 |
| −.176597 | −.156031 | −.146836 | −.913482E-01 | −.114397 |
| −.130272 | −.128493 | −.157727 | −.167306 | z = −4 |
| .20849 | .18449 | .182604 | .119496 | .136331 |
| .135758 | .158565 | .182474 | .199045 | z = −5 |
| −.622647E-01 | −.637055E-01 | −.441609E-01 | −.334648E-01 | −.474506E-01 |
| −.418415E-01 | −.452313E-01 | −.570636E-01 | −.639177E-01 | z = −6 |
| .415089E-01 | .221325E-01 | .042407 | .104516E-01 | .987454E-02 |
| .317354E-01 | .440937E-02 | .408357E-01 | .234159E-01 | z = −7 |
| −.01675 | −.699552E-02 | −.027847 | .419561E-01 | −543519E-01 |
| .371911E-01 | −.339505E-01 | .450874E-02 | −.225354E-01 | z = −8 |

Plane: y = −2

| x = −4 | x = −3 | x = −2 | x = −1 | x = 0 |
|---|---|---|---|---|
| (x = 1) | (x = 2) | (x = 3) | (x = 4) | |
| −.407931E-09 | .562598E-08 | .159913E-09 | .608811E-08 | .804737E-09 |
| −.756362E-08 | .232085E-08 | −.355716E-08 | .276023E-08 | z = 0 |
| .310662E-03 | −.214747E-03 | .943287E-03 | −.804238E-03 | .12611E-02 |
| −.154958E-02 | .54646E-03 | −.247467E-03 | .2793E-03 | z = −1 |
| −.236119E-02 | −.251407E-02 | −.135467E-02 | −.809817E-02 | .904956E-02 |
| −.709896E-02 | .60508E-02 | −.403639E-02 | .423091E-03 | z = −2 |
| .329347E-01 | .545682E-02 | .522081E-01 | −.398967E-01 | .345462E-01 |
| −.514294E-01 | .447838E-01 | .612838E-02 | .317129E-01 | z = −3 |
| −.153257 | −.122551 | −.140502 | −.908539E-01 | −.319568E-01 |
| −.594014E-02 | −.114669 | −.110213 | −.153659 | z = −4 |
| .175868 | .160743 | .131982 | .990414E-01 | .293081E-01 |
| .342512E-01 | .110383 | .138296 | .178512 | z = −5 |
| −.633225E-01 | −.368538E-01 | −.687508E-01 | −.146056E-01 | −.128428E-01 |
| −.011093 | −.406081E-01 | −.439911E-01 | −.518072E-01 | z = −6 |
| .015234 | .395727E-01 | −.230999E-03 | .312018E-01 | .526973E-02 |
| −.129139E-01 | .456381E-01 | .689344E-02 | .416079E-01 | z = −7 |
| −.224466E-01 | −.875082E-02 | −.130734E-01 | −.281972E-01 | .846715E-01 |
| −.489849E-01 | .312377E-01 | −.330843E-01 | .808075E-03 | z = −8 |

Plane: y = −1

| x = −4 | x = −3 | x = −2 | x = −1 | x = 0 |
|---|---|---|---|---|
| (x = 1) | (x = 2) | (x = 3) | (x = 4) | |
| .715001E-08 | .792713E-10 | .14554E-07 | .334757E-08 | −.110581E-07 |
| .159348E-07 | −.155575E-07 | .749275E-08 | −.587422E-08 | z = 0 |
| .163959E-04 | .478121E-03 | −.161481E-02 | .157297E-02 | −.372342E-02 |
| .317542E-02 | −.206379E-02 | .927256E-03 | −.407694E-03 | z = −1 |
| −.257154E-02 | .461352E-02 | −.101431E-01 | .212655E-01 | −.243122E-01 |
| .242981E-01 | −.116012E-01 | .795446E-02 | −.370816E-02 | z = −2 |
| .378561E-02 | .543728E-01 | −.933131E-01 | .801225E-01 | −.121777 |
| .897275E-01 | −.719638E-01 | .444129E-01 | .123868E-01 | z = −3 |
| −.119149 | −.786658E-01 | .374757E-03 | .160962 | .126497 |
| .093919 | .244302E-01 | −.795218E-01 | −.106606 | z = −4 |
| .145095 | .784591E-01 | .419082E-01 | −.166819 | −.148097 |
| −.14668 | −.152366E-01 | .810492E-01 | .124371 | z = −5 |
| −.338362E-01 | −.440892E-01 | .245104E-01 | .374845E-01 | .508778E-01 |
| .470006E-01 | .857381E-02 | −.223192E-01 | −.458472E-01 | z = −6 |

TABLE 3-continued

Reconstruction of Phantom Where the Algorithm
Based on Equation 4 of the Reconstruction
Algorithm Section was used, and a Sinc Filter
was used to Correct for the Finite Detector Dimensions

| | | | | |
|---|---|---|---|---|
| .042996 | −.146088E-01 | .425634E-01 | −.465811E-01 | −.506487E-01 |
| .239965E-01 | −.384644E-01 | .369058E-01 | −.194323E-02 | $z = -7$ |
| .112969E-01 | −.312279E-01 | .399285E-01 | .325344E-01 | −.646672E-01 |
| .955021E-01 | −.507098E-01 | .295994E-01 | −.400913E-01 | $z = -8$ |

Plane: $y = 0$

| $x = -4$ | $x = -3$ | $x = -2$ | $x = -1$ | $x = 0$ |
|---|---|---|---|---|
| ($x = 1$) | ($x = 2$) | ($x = 3$) | ($x = 4$) | |
| .119669E-08 | .213148E-08 | .191561E-07 | .995641E-08 | .801624E-08 |
| −.195708E-07 | .104911E-07 | −.876028E-08 | .351948E-08 | $z = 0$ |
| −.7459E-03 | .603998E-03 | −.218902E-02 | .100389E-03 | .106437E-02 |
| −.504055E-02 | .2902E-03 | −.122412E-02 | .835237E-03 | $z = -1$ |
| −.107632E-02 | −.342511E-02 | .63045E-02 | −.965944E-02 | .271532E-01 |
| −.380646E-02 | .168971E-01 | −.566775E-02 | .26735E-02 | $z = -2$ |
| .313506E-01 | −.514549E-01 | .871894E-01 | −.173247 | −.353714E-02 |
| −.213017 | .641624E-01 | −.395764E-01 | .024353 | $z = -3$ |
| −.732153E-01 | .316426E-02 | −.114738E-01 | .200005 | .471255 |
| .509668 | −.142049E-01 | .416184E-01 | −.107709 | $z = -4$ |
| .831721E-01 | .192364E-01 | −.712483E-01 | −.273683 | −.544782 |
| −.480018 | −.910421E-01 | −.998676E-02 | .10137 | $z = -5$ |
| −.289119E-01 | −.403456E-02 | .017122 | .895848E-01 | .174588 |
| .148945 | .320852E-01 | .13579E-02 | −.029774 | $z = -6$ |
| −.709696E-02 | .217777E-01 | −.512645E-01 | −.460708E-02 | −.924334E-01 |
| −.119208 | .100997E-01 | −.228602E-01 | .330789E-01 | $z = -7$ |
| −.179468E-01 | −.911056E-02 | .222091E-01 | .171867E-01 | .157688 |
| −.677876E-01 | .664838E-01 | −.446448E-01 | .010934 | $z = -8$ |

Plane: $y = 1$

| $x = -4$ | $x = -3$ | $x = -2$ | $x = -1$ | $x = 0$ |
|---|---|---|---|---|
| ($x = 1$) | ($x = 2$) | ($x = 3$) | ($x = 4$) | |
| .888527E-08 | −.308033E-08 | .741216E-08 | .74135E-08 | −.327668E-07 |
| .417045E-07 | −.378132E-07 | .166918E-07 | −.135463E-07 | $z = 0$ |
| .568819E-03 | −.324527E-05 | −.463899E-03 | .651889E-03 | −.64536E-02 |
| .658882E-02 | −.273537E-02 | .169425E-02 | −.105963E-02 | $z = -1$ |
| −.630789E-02 | .140586E-01 | −.238789E-01 | .581281E-01 | −.473423E-01 |
| .050065 | −.236592E-01 | .150705E-01 | −.486869E-02 | $z = -2$ |
| −.428644E-01 | .118125 | −.304241 | .185764 | −.343996 |
| .186777 | −.185654 | .663681E-01 | .556911E-02 | $z = -3$ |
| −.490356E-01 | −.431222E-01 | .399114 | .56782 | 1 |
| .267847 | .34916 | −.817395E-01 | −.291845E-01 | $z = -4$ |
| .678898E-01 | −.118759E-01 | −.31798 | −.655781 | −.906442 |
| −.448402 | −.290082 | .237119E-01 | .505113E-01 | $z = -5$ |
| −.140423E-01 | −.956129E-02 | .117674 | .199993 | .286478 |
| .152253 | .861613E-01 | −.152698E-02 | −.229241E-01 | $z = -6$ |
| .038575 | −.361356E-01 | −.501263E-02 | −.124099 | −.200747 |
| .185961E-01 | −.107817 | .438621E-01 | −.254661E-01 | $z = -7$ |
| .233695E-01 | −.338512E-01 | .693031E-01 | .616328E-01 | −.250308E-01 |
| .12527 | −.069093 | .426165E-01 | −.493067E-01 | $z = -8$ |

Plane: $y = 2$

| $x = -4$ | $x = -3$ | $x = -2$ | $x = -1$ | $x = 0$ |
|---|---|---|---|---|
| ($x = 1$) | ($x = 2$) | ($x = 3$) | ($x = 4$) | |
| −.134394E-07 | .158905E-07 | −.292953E-07 | .408175E-07 | −.134072E-08 |
| −.220435E-07 | .114474E-07 | −.14012E-07 | .103908E-07 | $z = 0$ |
| .273079E-04 | −.234904E-03 | .161397E-02 | −.85813E-03 | .365393E-02 |
| −.652138E-02 | .200697E-02 | −.163806E-02 | .963661E-03 | $z = -1$ |
| .747067E-04 | −.112365E-01 | .944251E-02 | −.244743E-01 | .399318E-01 |
| −.233006E-01 | .227662E-01 | −.107738E-01 | .300586E-02 | $z = -2$ |
| .839307E-01 | −.140383 | .280093 | −.373783 | .185467 |
| −.297501 | .128388 | −.555667E-01 | .120921E-01 | $z = -3$ |
| −.883818E-01 | .393325E-01 | −.551553E-02 | .409456 | .257642 |
| .417156 | −.193128E-01 | .270695E-01 | −.956014E-01 | $z = -4$ |
| .788757E-01 | −.687603E-02 | −.142468 | −.385261 | −.42957 |
| −.389188 | −.084007 | −.633609E-03 | .960753E-01 | $z = -5$ |
| −.350796E-01 | .128968E-01 | .182615E-01 | .141605 | .12495 |
| .116075 | .295702E-01 | −.568463E-02 | −.241021E-01 | $z = -6$ |
| −.240915E-01 | .428373E-01 | −.986323E-01 | .337744E-01 | −.06802 |
| −.108765 | .292945E-01 | −.303705E-01 | .461286E-01 | $z = -7$ |
| −.589915E-01 | .648847E-01 | −.912452E-01 | .19447 | .837178E-02 |
| −.313724E-01 | .254843E-01 | −.419384E-01 | .251457E-01 | $z = -8$ |

Plane: $y = 3$

| $x = -4$ | $x = -3$ | $x = -2$ | $x = -1$ | $x = 0$ |
|---|---|---|---|---|
| ($x = 1$) | ($x = 2$) | ($x = 3$) | ($x = 4$) | |
| .470516E-08 | −.697235E-08 | .551025E-08 | −.176996E-07 | −.398568E-08 |
| .101765E-07 | −.128337E-07 | .466071E-08 | −.663495E-08 | $z = 0$ |
| .540785E-03 | .448335E-03 | .744948E-04 | .834387E-03 | −.194723E-02 |
| .33124E-02 | −.157037E-02 | .107065E-02 | −.327915E-03 | $z = -1$ |
| −.521029E-02 | .398961E-02 | −.141411E-01 | .189385E-01 | −.187527E-01 |
| .160237E-01 | −.860114E-02 | .383921E-02 | −.250015E-01 | $z = -2$ |
| −.123282E-01 | .091543 | −.148962 | .143241 | −.149403 |

TABLE 3-continued

Reconstruction of Phantom Where the Algorithm
Based on Equation 4 of the Reconstruction
Algorithm Section was used, and a Sinc Filter
was used to Correct for the Finite Detector Dimensions

| .118243 | −.709313E-01 | .476039E-01 | .247528E-01 | $z = -3$ |
|---|---|---|---|---|
| −.936067E-01 | −.974819E-01 | .787955E-01 | .678989E-01 | .179023 |
| .888785E-01 | .840533E-02 | −.08145 | −.119864 | $z = -4$ |
| .119037 | .797244E-01 | −.456239E-01 | −.119981 | −.184425 |
| −.120012 | −.493194E-02 | .861637E-01 | .130146 | $Z = -5$ |
| −.361246E-01 | −.277484E-01 | .122978E-01 | .310473E-01 | .529706E-01 |
| .459044E-01 | −.717102E-02 | −.231752E-01 | −.446494E-01 | $z = -6$ |
| .347781E-01 | −.619241E-02 | .177464E-01 | −.472223E-01 | −.400961E-01 |
| .257599E-01 | −.284089E-01 | .350988E-01 | .436446E-02 | $z = -7$ |
| .123956E-01 | −.430078E-01 | .524193E-01 | −.882688E-01 | .215379E-01 |
| .248837E-01 | −.244473E-01 | .27149E-02 | −.033727 | $z = -8$ |

Plane: y = 4

| $x = -4$ | $x = -3$ | $x = -2$ | $x = -1$ | $x = 0$ |
|---|---|---|---|---|
| (x = 1) | (x = 2) | (x = 3) | (x = 4) | |
| −.283394E-08 | .243786E-08 | −.380812E-08 | .724909E-08 | −.301567E-08 |
| −.104756E-07 | .250567E-08 | −.456164E-08 | .194335E-08 | $z = 0$ |
| .130617E-03 | .507407E-03 | .32803E-03 | .443432E-03 | .123219E-02 |
| −.195654E-02 | .113699E-02 | −.383908E-03 | .720796E-03 | $z = -1$ |
| −.492671E-03 | −.736244E-02 | .472872E-02 | −.138382E-01 | .943556E-02 |
| −.978597E-02 | .32214E-02 | −.350025E-02 | −.209083E-02 | $z = -2$ |
| .512441E-01 | −.197653E-01 | .10688 | −.085651 | .080064 |
| −.655226E-01 | .576451E-01 | .890736E-02 | .267851E-01 | $z = -3$ |
| −.151496 | −.109434 | −.131605 | −.424542E-01 | −.964983E-01 |
| −.362583E-01 | −.139829 | −.110547 | −.15588 | $z = -4$ |
| .170171 | .138855 | .113776 | .612695E-01 | .697961E-01 |
| .447754E-01 | .134199 | .137515 | .178365 | $z = -5$ |
| −.514183E-01 | −.500012E-01 | −.208176E-01 | −.246633E-01 | −.137381E-01 |
| −.276573E-01 | −.348809E-01 | −.473549E-01 | −.557749E-01 | $z = -6$ |
| .179847E-01 | .332018E-01 | −.113764E-02 | .294013E-01 | .482899E-02 |
| −.144069E-01 | .382635E-01 | .132159E-01 | .383334E-01 | $z = -7$ |
| −.265636E-01 | .536716E-02 | −.392072E-01 | .545283E-01 | −.271876E-01 |
| −.100816E-01 | −.214328E-01 | −.143128E-01 | −.107024E-01 | $z = -8$ |

APPENDIX I

Derivation Of The Field Produced By A Ring of Dipoles

The $\vec{z}$ component of the magnetic field of a dipole or current loop of radium R where the dipole $m = i\pi R^2$ is given as follows:

$$B_z = m \frac{(2z^2 - x^2 - y^2)}{(x^2 + y^2 + z^2)^{5/2}}$$

The $\vec{z}$ component of the magnetic field due to a ring of dipoles is given as follows, where the dipole density is $m/2\pi R$.

$$B_z = \frac{m}{2\pi R} \int_0^\pi \frac{[2(z-z')^2 - (x-x')^2 - (y-y')^2] R \, d\phi}{[(x-x')^2 + (x-y')^2 + (z-z')^2]^{5/2}}$$

for the ring at $z' = 0$ $$B_z = \frac{m}{2\pi} \int \frac{2z^2 - (x - R\cos\phi)^2 - (y - R\sin\phi)^2 \, d\phi}{[(x - R\cos\phi)^2 + (y - R\sin\phi)^2 + z^2)]^{5/2}}$$

$$B_z = \frac{m}{2\pi} \int \frac{2z^2 - (x^2 + R^2\cos^2\phi \; 31 \; 2xR\cos\phi) - (y^2 + R^2\sin^2\phi - 2yR\sin\phi) \, d\phi}{[r^2 + R^2 - 2R(x\cos\phi + y\sin\phi)]^{5/2}}$$

$(a + b)^n \approx a^n + nba^{n-1}$ $a = r^2 + R^2;\ b = -2R(x\cos\phi + y\sin\phi);\ n = -5/2$ $$[r^2 + R^2 - 2R(x\cos\phi + y\sin\phi)]^{-5/2} \approx \frac{1}{(r^2 + R^2)^{5/2}} + \frac{5R(x\cos\phi + y\sin\phi)}{(r^2 + R^2)^{7/2}}$$

$$B_z = \frac{m}{2\pi} \int_0^{2\pi} 2z^2 \left[ \frac{1}{(r^2 + R^2)^{5/2}} + \frac{5R}{(r^2 + R^2)^{7/2}} (x\cos\phi + y\sin\phi) \right] d\phi \; \frac{-m}{2\pi} \int_0^{2\pi} \left( \frac{x^2}{(r^2 + R^2)^{5/2}} + \frac{R^2\cos^2\phi}{(r^2 + R^2)^{5/2}} - \right.$$

$$\left. \frac{2xR\cos\phi}{(r^2 + R^2)^{5/2}} \right) d\phi \; \frac{-m}{2\pi} \int_0^{2\pi} \left( \frac{5Rx^3\cos\phi}{(r^2 + R^2)^{7/2}} + \frac{5Rx^2y\sin\phi}{(r^2 + R^2)^{7/2}} + \frac{5R^3x\cos^3\phi}{(r^2 + R^2)^{7/2}} + \frac{5R^3y\cos^2\phi\sin\phi}{(r^2 + R^2)^{7/2}} - \frac{10x^2R^2\cos^2\phi}{(r^2 + R^2)^{7/2}} - \right.$$

-continued $$\left. \frac{10xyR^2\cos\phi\sin\phi}{(r^2+R^2)^{7/2}} \right) d\phi \frac{-m}{2\pi} \int_0^{2\pi} \left( \frac{y^2}{(r^2+R^2)^{5/2}} + \frac{R^2\sin^2\phi}{(r^2+R^2)^{5/2}} - \frac{2yR\sin\phi}{(r^2+R^2)^{5/2}} \right) d\phi \frac{-m}{2\pi} \int_0^{2\pi} \left( \frac{5Ry^2x\cos\phi}{(r^2+R^2)^{7/2}} + \right.$$

$$\left. \frac{5Ry^3\sin\phi}{(r^2+R^2)^{7/2}} + \frac{5R^3x\cos\phi\sin^2\phi}{(r^2+R^2)^{7/2}} + \frac{5R^3y\sin^3\phi}{(r^2+R^2)^{7/2}} - \frac{10R^2xy\cos\phi\sin\phi}{(r^2+R^2)^{7/2}} - \frac{10R^2y^2\sin^2\phi}{(r^2+R^2)^{7/2}} \right) d\phi$$

$$B_z = \frac{m}{2\pi} \left\{ \frac{4\pi z^2}{(r^2+R^2)^{5/2}} - \frac{2\pi x^2}{(r^2+R^2)^{5/2}} - \frac{R^2\pi}{(r^2+R^2)^{5/2}} + \frac{10\pi x^2 R^2}{(r^2+R^2)^{7/2}} - \frac{2\pi y^2}{(r^2+R^2)^{5/2}} - \frac{\pi R^2}{(r^2+R^2)^{5/2}} + \frac{10\pi R^2 y^2}{(r^2+R^2)^{7/2}} \right\}$$

Ring of Dipoles:

$$B_z \simeq m \left\{ \frac{2z^2 - x^2 - y^2}{(r^2+R^2)^{5/2}} - \frac{R^2}{(r^2+R^2)^{5/2}} + \frac{5R^2(x^2+y^2)}{(r^2+R^2)^{7/2}} \right\}$$

APPENDIX II
Derivation Of The Field Produced By A Shell of Dipoles

The $\vec{z}$ component of the magnetic field of a dipole or a loop of current of radius R where the dipole $m = i\pi R^2$ is given as follows:

$$B_z = \frac{m(2z^2 - x^2 - y^2)}{(x^2 + y^2 + z^2)^{5/2}}$$

The $\vec{z}$ component of the magnetic field due to a shell of dipoles of radius R with dipole density is $m/4\pi R^2$ is given as follows:

$$p = \sqrt{x^2 + y^2 + z^2} \quad R = \sqrt{x'^2 + y'^2 + z'^2}$$
$$x = p\sin\phi\cos\theta \quad x' = R\sin\phi\cos\theta$$
$$y = p\sin\phi\sin\theta \quad y' = R\sin\phi\sin\theta$$

$$B_z = \frac{m}{4\pi R^2} \int_0^{2\pi} \int_0^\pi \frac{(2(z-z')^2 - (x-x')^2 - (y-y')^2) R^2 \sin\phi \, d\phi \, d\theta}{((x-x')^2 + (y-y')^2 + (z-z')^2)^{5/2}}$$

$$B_z = \frac{m}{4\pi R^2} \int_0^{2\pi} \int_0^\pi \frac{(2(z - R\cos\phi)^2 - (x - R\sin\phi\cos\theta)^2 - (y - R\sin\phi\sin\theta)^2) R^2 \sin\phi \, d\phi \, d\theta}{((x - R\sin\phi\cos\theta)^2 + (y - R\sin\phi\sin\theta)^2 + (z - R\cos\phi)^2)^{5/2}}$$

$$B_z = \frac{m}{4\pi R^2} \int_0^{2\pi} \int_0^\pi \frac{\begin{array}{c}(2z^2 - 4zR\cos\phi + 2R^2\cos^2\phi - x^2 + 2xR\sin\phi\cos\theta - \\ R^2\sin^2\phi\cos^2\theta - y^2 + 2yR\sin\phi\sin\theta - R^2\sin^2\phi\sin^2\theta)R^2\sin\phi d\phi d\theta\end{array}}{[x^2 - 2xR\sin\phi\cos\theta + R^2\sin^2\phi\cos^2\theta + y^2 - 2yR\sin\phi\sin\theta + R^2\sin^2\phi\sin^2\theta + z^2 - 2zR\cos\phi + R^2\cos^2\phi]^{5/2}}$$

$$B_z = \frac{m}{4\pi R^2} \int_0^{2\pi} \int_0^\pi \frac{\begin{array}{c}(2R^2z^2\sin\phi - 4zR^3\sin\phi\cos\phi + 2R^4\cos^2\phi\sin\phi - x^2R^2\sin\phi + \\ 2xR^3\sin^2\phi\cos\theta - R^4\sin^3\phi\cos^2\theta - y^2R^2\sin\phi + 2yR^3\sin^2\phi\sin\theta - R^4\sin^3\phi\sin^2\theta) d\phi d\theta\end{array}}{[x^2 - 2xR\sin\phi\cos\theta + R^2\sin^2\phi\cos^2\theta + y^2 - 2yR\sin\phi\sin\theta + R^2\sin^2\phi\sin^2\theta + z^2 - 2zR\cos\phi + R^2\cos^2\phi]^{5/2}}$$

$$B_z = \frac{m}{4\pi R^2} \int_0^{2\pi} \int_0^\pi \frac{\begin{array}{c}2R^2z^2\sin\phi - 4zR^3\sin\phi\cos\phi + 2R^4\cos^2\phi\sin\phi - x^2R^2\sin\phi + \\ 2xR^3\sin^2\phi\cos\theta - R^4\sin^3\phi\cos^2\theta - y^2R^2\sin\phi + 2y^2R^3\sin^2\phi\sin\theta - R^4\sin^3\phi\sin^2\theta)d\phi d\theta\end{array}}{[p^2 - 2xR\sin\phi\cos\theta + R^2\sin^2\phi\cos^2\theta - 2yR\sin\phi\sin\theta + R^2\sin^2\phi\sin^2\theta - 2zR\cos\phi + R^2\cos^2\phi]^{5/2}}$$

$$B_z = \frac{m}{4\pi R^2} \int_0^{2\pi} \int_0^\pi \frac{\begin{array}{c}(2R^2z^2\sin\phi - 4zR^3\sin\phi\cos\phi + 2R^4\cos^2\phi\sin\phi - x^2R^2\sin\phi + \\ 2xR^3\sin^2\phi\cos\theta - R^4\sin^3\phi\cos^2\theta - y^2R^2\sin\phi + 2yR^3\sin^2\phi\sin\theta - R^4\sin^3\phi\sin^2\theta)d\phi d\theta\end{array}}{[p^2 + R^2 - 2xR\sin\phi\cos\theta - 2yR\sin\phi\sin\theta - 2zR\cos\phi]^{5/2}}$$

$(a + b)^n \simeq a^n + nba^{n-1}$ $a = p^2 + R^2$ $b = -2xR\sin\phi\cos\theta - 2yR\sin\phi\sin\theta - 2zR\cos\phi$ $n = -5/2$ $$[p^2 + R^2 - 2xR\sin\phi\cos\theta - 2yR\sin\phi\sin\theta - 2zR\cos\phi]^{-5/2} \simeq \frac{1}{(p^2+R^2)^{5/2}} + \frac{5R}{(p^2+R^2)^{7/2}} (x\sin\phi\cos\theta + y\sin\phi\sin\theta + z\cos\phi)$$

$$B_z = \frac{m}{4\pi R^2} \int_0^{2\pi} \int_0^{\pi} \left[ \frac{2R^2z^2\sin\phi}{(p^2+R^2)^{5/2}} + \frac{10R^3z^2\sin\phi}{(p^2+R^2)^{7/2}} (x\sin\phi\cos\theta + y\sin\phi\sin\theta + z\cos\phi) - \frac{4zR^3\sin\phi\cos\phi}{(p^2+R^2)^{5/2}} - \right.$$

$$\frac{20zR^4\sin\phi\cos\phi}{(p^2+R^2)^{7/2}} (x\sin\phi\cos\theta + y\sin\phi\sin\theta + z\cos\phi) + \frac{2R^4\cos^2\phi\sin\phi}{(p^2+R^2)^{5/2}} + \frac{10R^5\cos^2\phi\sin\phi}{(p^2+R^2)^{7/2}} (x\sin\phi\cos\theta + y\sin\phi\sin\theta + z\cos\phi) -$$

$$\frac{x^2R^2\sin\phi}{(p^2+R^2)^{5/2}} - \frac{5x^2R^3\sin\phi}{(p^2+R^2)^{7/2}} (x\sin\phi\cos\theta + y\sin\phi\sin\theta + z\cos\phi) + \frac{2xR^3\sin^2\phi\cos\theta}{(p^2+R^2)^{5/2}} + \frac{10xR^4\sin^2\phi\cos\theta}{(p^2+R^2)^{7/2}} (x\sin\phi\cos\theta + y\sin\phi\sin\theta +$$

$$z\cos\phi) - \frac{R^4\sin^3\phi\cos^2\theta}{(p^2+R^2)^{5/2}} + \frac{5R^5\sin^3\phi\cos^2\theta}{(p^2+R^2)^{7/2}} (x\sin\phi\cos\theta + y\sin\phi\sin\theta + z\cos\phi) - \frac{y^2R^2\sin\phi}{(p^2+R^2)^{5/2}} - \frac{5y^2R^3\sin\phi}{(p^2+R^2)^{7/2}} (x\sin\phi\cos\theta +$$

$$y\sin\phi\sin\theta + z\cos\phi) + \frac{2yR^3\sin^2\phi\sin\theta}{(p^2+R^2)^{5/2}} + \frac{10yR^4\sin^2\phi\sin\theta}{(p^2+R^2)^{7/2}} (x\sin\phi\cos\theta + y\sin\phi\sin\theta + z\cos\phi) - \frac{R^4\sin^3\phi\sin^2\theta}{(p^2+R^2)^{5/2}} -$$

$$\left. \frac{5R^5\sin^3\phi\sin^2\theta}{(p^2+R^2)^{7/2}} (x\sin\phi\cos\theta + y\sin\phi\sin\theta + z\cos\phi) \right] d\phi d\theta$$

$$B_z = \frac{m}{4\pi R^2} \left[ \frac{8\pi R^2 z^2}{(p^2+R^2)^{5/2}} - \frac{80\pi R^4 z^2}{3(p^2+R^2)^{7/2}} + \frac{8\pi R^4}{3(p^2+R^2)^{5/2}} - \frac{4\pi x^2 R^2}{(p^2+R^2)^{5/2}} + \frac{40\pi x^2 R^4}{3(p^2+R^2)^{7/2}} - \frac{4\pi R^4}{3(p^2+R^2)^{5/2}} - \right.$$

$$\left. \frac{4\pi y^2 R^2}{(p^2+R^2)^{5/2}} + \frac{40\pi y^2 R^4}{3(p^2+R^2)^{7/2}} - \frac{4\pi R^4}{3(p^2+R^2)^{7/2}} \right]$$

Shell of Dipoles:

$$B_z \cong \frac{m}{4\pi R^2} \left\{ 4\pi R^2 \left[ \frac{2z^2 - x^2 - y^2}{(p^2+R^2)^{5/2}} \right] - \frac{40\pi}{3} \frac{R^4(2z^2 - x^2 - y^2)}{(p^2+R^2)^{7/2}} \right\}$$

APPENDIX III

Derivation Of The Field Produced By A Sphere of Dipoles

The $\bar{z}$ component of the magnetic field due to a sphere of dipoles follows from the equation for a shell with the substitution of the dipole density $3m/4\pi R^3$ as follows: Shell of Dipoles:

$$B_z \cong \frac{m}{4\pi R^2} \left( 4\pi R^2 \left[ \frac{2z^2 - x^2 - y^2}{(p^2+R^2)^{5/2}} \right] + \right.$$

$$\left. - \frac{40\pi}{3} \frac{R^4(2z^2 - x^2 - y^2)}{(p^2+R^2)^{7/2}} \right)$$

For small R the first term dominates and is used to calculate the $\bar{z}$ component of the magnetic field due to a sphere of $\bar{z}$-oriented dipoles as follows:

$$B_z \cong (2z^2 - x^2 - y^2) \frac{m}{4/3\pi R^3} \int_0^R \frac{4\pi}{p^2} \frac{\tan^2\theta}{\sec^5\theta} \sec^2\theta \, d\theta$$

$$B_z \cong (2z^2 - x^2 - y^2) \frac{m}{4/3\pi R^3} \int_0^R \frac{4\pi}{p^2} \sin^2\theta \cos\theta \, d\theta$$

$$B_z \cong (2z^2 - x^2 - y^2) \frac{m}{4/3\pi R^3} \left[ \frac{4\pi}{3p^2} \frac{\mu^3}{(1+\mu^2)^{3/2}} \right]_0^R$$

$$B_z \cong (2z^2 - x^2 - y^2) \frac{m}{4/3\pi R^3} \left[ \frac{4\pi}{3p^5} \frac{r^3}{(1+(r/p)^2)^{3/2}} \right]_0^R$$

-continued $$B_z \cong (2z^2 - x^2 - y^2) \frac{m}{4/3\pi R^3} \frac{4\pi}{3p^5} \left\{ \frac{R^3(1+(R/p)^2)}{(1+(R/p)^2)^{5/2}} \right\}$$

Sphere of Dipoles:

$$B_z \cong \frac{m(2z^2 - x^2 - y^2)}{(R^2+p^2)^{5/2}} (1 + (R/p)^2)$$

APPENDIX IV

Derivation Of The Fourier Transform Of The System Function $$h = \frac{2z^2 - x^2 - y^2}{[x^2+y^2+z^2]^{5/2}} = \frac{2z^2 - p^2}{[p^2+z^2]^{5/2}} \quad \text{Equation 3}$$

$$H = \int_{-\infty}^{\infty} 2\pi \int_0^{\infty} \frac{2z^2 - p^2}{[p^2+z^2]^{5/2}} J_0[k_p p] p \, dp \, e^{-jkz} \, dz$$

$$2\pi \int_0^{\infty} \left[ \frac{2z^2 p}{[p^2+z^2]^{5/2}} - \frac{p^3}{[p^2+z^2]^{5/2}} \right] J_0[k_p p] dp$$

$$\int_0^{\infty} \frac{t^{\nu+1} J_\nu[at] dt}{[t^2+z^2]^{\mu+1}} = \frac{a^\mu z^{\nu-\mu} K_{\nu-\mu}[az]}{2^\mu \Gamma[\mu+1]}$$

recurrence relationship $$J_{\nu-1}[z] + J_{\nu+1}[z] = \frac{2\nu}{z} J_\nu[z]$$

$$2z^2[2\pi] \int_0^{\infty} \frac{p}{[p^2+z^2]^{5/2}} J_0[k_p p] dp$$

-continued $$\frac{2z^2[2\pi]k_p^{3/2}z^{-3/2}}{2^{3/2}\Gamma[5/2]} K_{-3/2}[k_pz] = \boxed{\frac{[2^{1/2}]\pi z^{1/2}k_p^{3/2}}{\Gamma[5/2]} K_{3/2}[k_pz]}$$

recurrence relationship $$J_{\nu-1}[z] + J_{\nu+1}[z] = \frac{2\nu}{z} J_\nu[z] - 2\pi \int_0^\infty \frac{p^3}{[p^2+z^2]^{5/2}} J_0[k_pp] dp$$

$$J_0 + J_2 = 2/zJ_1$$

$$J_0 = 2/zJ_1 - J_2 \quad \text{Let } z = k_pp$$

$$J_0[k_pp] = \frac{2}{k_pp} J_1[k_pp] - J_2[k_pp] -$$

$$2\pi \int_0^\infty \frac{p^3}{[p^2+z^2]^{5/2}} \left[\frac{2}{k_pp} J_1[k_pp] - J_2[k_pp]\right] dp -$$

$$2\pi \int_0^\infty \frac{2p^2}{k_p[p^2+z^2]^{5/2}} J_1[k_pp] dp +$$

$$2\pi \int_0^\infty \frac{p^3}{[p^2+z^2]^{5/2}} J_2[k_pp] dp$$

$$\int_0^\infty \frac{t^{\nu+1}J_\nu[at]dt}{[t^2+z^2]^{u+1}} = \frac{a^u z^{\nu-u} K_{\nu-u}[az]}{2^u \Gamma[u+1]} -$$

$$2\pi \int_0^\infty \frac{2p^2}{k_p[p^2+z^2]^{5/2}} J_1[k_pp] dp = \frac{-[4\pi]k_p^{3/2}z^{-1/2}}{k_p 2^{3/2}\Gamma[5/2]} K_{-1/2}[k_pz] =$$

$$\boxed{-\frac{[2^{1/2}]\pi z^{-1/2}k_p^{1/2}}{\Gamma[5/2]} K_{1/2}[k_pz]}$$

$$2\pi \int_0^\infty \frac{p^3}{[p^2+z^2]^{5/2}} J_2[k_pp] dp = \frac{[2\pi]k_p^{3/2}z^{1/2}}{2^{3/2}\Gamma[5/2]} K_{1/2}[k_pz] =$$

$$\boxed{\frac{\pi z^{1/2}k_p^{3/2}}{[2^{1/2}]\Gamma[5/2]} K_{1/2}[k_pz]}$$

$$\int_{-\infty}^\infty \left[\frac{[2^{1/2}]\pi z^{1/2}k_p^{3/2}}{\Gamma[5/2]} K_{3/2}[k_pz] - \frac{[2^{1/2}]\pi z^{1/2}k_p^{1/2}}{\Gamma[5/2]} K_{1/2}[k_pz] + \right.$$

$$\left. \frac{\pi z^{1/2}k_p^{3/2}}{[2^{1/2}]\Gamma[5/2]} K_{1/2}[k_pz]\right] e^{-jkz} dz$$

$$K_{n+1/2}[z] = \left[\frac{\pi}{2z}\right]^{1/2} e^{-z} \sum_{m=0}^n [2z]^{-m} \frac{\Gamma[n+m+1]}{m!\Gamma[n+1-m]}$$

$$K_{3/2}[k_pz] = \left[\frac{\pi}{2k_pz}\right]^{1/2} e^{-k_pz}\left[1 + \frac{1}{2k_pz}\Gamma[3]\right]$$

$$K_{1/2}[k_pz] = \left[\frac{\pi}{2k_pz}\right]^{1/2} e^{-k_pz}$$

-continued $$\int_{-\infty}^\infty \left\{\frac{[2^{1/2}]\pi z^{1/2}k_p^{3/2}}{\Gamma[5/2]}\left[\frac{\pi}{2k_pz}\right]^{1/2} e^{-k_pz}\left[1 + \frac{1}{2k_pz}\Gamma[3]\right] - \right.$$

$$\frac{[2^{1/2}]\pi z^{1/2}k_p^{1/2}}{\Gamma[5/2]}\left[\frac{\pi}{2k_pz}\right]^{1/2} e^{-k_pz} +$$

$$\left.\frac{\pi z^{1/2}k_p^{3/2}}{[2^{1/2}]\Gamma[5/2]}\left[\frac{\pi}{2k_pz}\right]^{1/2} e^{-k_pz}\right\} e^{-jkz} dz$$

$$\int_{-\infty}^\infty \left\{\frac{\pi^{3/2}}{\Gamma[5/2]} k_p e^{-[jkz+kp]z} + \frac{z^{-1}\pi^{3/2}\Gamma[3]}{\Gamma[5/2]2} e^{-[jkz+kp]z} - \right.$$

$$\left. \frac{z^{-1}\pi^{3/2}}{\Gamma[5/2]} e^{-[jkz+kp]z} + \frac{\pi^{3/2}}{\Gamma[5/2]2} k_p e^{-[jkz+kp]z}\right\} dz$$

$$\int_{-\infty}^\infty \frac{\pi^{3/2}}{\Gamma[5/2]} \left\{k_p[1 + 1/2] + \left[\frac{\Gamma[3]}{2} - 1\right]z^{-1}\right\} e^{-[jkz+kp]z} dz$$

$$\int_{-\infty}^\infty \frac{\pi^{3/2}}{\Gamma[5/2]} \{k_p[3/2] + [1-1]z^{-1}\} e^{-kpz} e^{-jkzz} dz$$

$$\int_{-\infty}^\infty \frac{\pi^{3/2}}{3/4\pi^{1/2}} 3/2 k_p e^{-kpz} e^{-jkzz} dz$$

$$2\pi k_p \int_{-\infty}^\infty e^{-kpz} e^{-jkzz} dz$$

$$4\pi k_p \int_0^\infty e^{-kpz} e^{-jkzz} dz$$

$$4\pi k_p \int_0^\infty e^{-[jkz+kp]z} dz$$

$$4\pi k_p \left\{\frac{-1}{jk_z + k_p} e^{-[jkz+kp]z}\bigg|_0^\infty\right\}$$

$$4\pi k_p \left[\frac{1}{jk_z + k_p}\right]$$

$$4\pi k_p \left[\frac{-jk_z + k_p}{k_z^2 + k_p^2}\right]$$

$$H[k_p, k_z] = \frac{4\pi k_p^2}{k_p^2 + k_z^2}$$

$$H[k_x, k_y, k_z] = \frac{4\pi[k_x^2 + k_y^2]}{k_x^2 + k_y^2 + k_z^2}$$

$$k_x = 2\pi f_x = 2\pi 1/x$$

$$k_y = 2\pi f_y = 2\pi 1/y$$

$$k_z = 2\pi f_z = 2\pi 1/z.$$

APPENDIX V

Derivation of S=HF*U[$k_z$]

$$S = HF * U[k_z] = \frac{2\pi k_p^2}{k_p^2 + k_z^2} \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} +$$

$$1/jk_z * \frac{4\pi k_p^2}{k_p^2 + k_z^2} \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)}$$

$$S = 1/2\,HF + \sum_{z_n=0}^{-l_3} \sum_{y_n=-l_2/2}^{+l_2/2} \sum_{x_n=-l_1/2}^{+l_1/2} \frac{4\pi k_p^2}{j} e^{-j(k_x x_n + k_y y_n)} \int_{-\infty}^{\infty} \frac{\chi_{n1,n2,n3}\, e^{-j(k_z - \kappa_z) z_n}}{\kappa_z [k_p^2 + [k_z - \kappa_z]^2]} d\kappa_z$$

$$S = 1/2\,HF + \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} \frac{4\pi k_p^2}{j} \int_{-\infty}^{\infty} \frac{e^{+j\kappa_z z_n}}{\kappa_z [k_p^2 + [k_z - \kappa_z]^2]} d\kappa_z$$

$$S = 1/2\,HF + \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} \frac{4\pi k_p^2}{j} \int_{-\infty}^{\infty} \frac{e^{+j\kappa_z z_n}}{\kappa_z [\kappa_z^2 - 2k_z \kappa_z + k_p^2 + k_z^2]} d\kappa_z$$

Factorization of $\kappa_z^2 - 2k_z\kappa_z + k_p^2 + k_z^2 \quad \dfrac{2k_z \mp [4k_z^2 - 4[k_p^2 + k_z^2]]^{1/2}}{2} = \dfrac{2k_z \mp [4k_z^2 - 4k_p^2 - 4k_z^2]^{1/2}}{2}$ $\kappa_z = k_z \mp jk_p$ $$S = 1/2\,HF + \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} \frac{4\pi k_p^2}{j} \int_{-\infty}^{\infty} \frac{e^{+j\kappa_z z_n}}{\kappa_z [\kappa_z - k_z + jk_p][\kappa_z - k_z - jk_p]} d\kappa_z$$

Method of partial fractions
$$S = 1/2\,HF +$$
$$\sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} \frac{4\pi k_p^2}{j} \int_{-\infty}^{\infty} e^{+j\kappa_z z_n} \left[ \frac{A}{\kappa_z} + \frac{B}{\kappa_z - k_z + jk_p} + \frac{C}{\kappa_z - k_z - jk_p} \right] d\kappa_z$$

Determine $A, B, C$
$A[\kappa_z^2 - 2k_z\kappa_z + k_p^2 + k_z^2] + B[\kappa_z][\kappa_z - k_z - jk_p] + C[\kappa_z][\kappa_z - k_z + jk_p] = 1$
Let $\kappa_z = 0$, Then $A[k_p^2 + k_z^2] = 1$
$\therefore A = 1/[k_p^2 + k_z^2]$ Let $\kappa_z = k_z + jk_p$, Then
$A[[k_z + jk_p]^2 - 2k_z[k_z + jk_p] + k_p^2 + k_z^2] + B[k_z + jk_p][k_z + jk_p - k_z - jk_p] + C[k_z + jk_p][k_z + jk_p - k_z + jk_p] = 1 =$ $$\frac{1}{[k_p^2 + k_z^2]} [k_z^2 + 2jk_z k_p - k_p^2 - 2k_z^2 - 2jk_z k_p + k_p^2 + k_z^2] + C[2jk_z k_p - 2k_p^2] = 1$$

$C = 1/[-2k_p^2 + 2jk_z k_p]$
Let $\kappa_z = k_z + jk_p$, Then
$A[[k_z + jk_p]^2 - 2k_z[k_z - jk_p] + k_p^2 + k_z^2] + B[k_z - jk_p][k_z - jk_p - k_z - jk_p] + C[k_z - jk_p][k_z - jk_p - k_z + jk_p] = 1 =$ $$\frac{1}{[k_p^2 + k_z^2]} [k_z^2 - 2jk_z k_p - k_p^2 - 2k_z^2 + 2jk_z k_p + k_p^2 + k_z^2] + B[-2jk_z k_p - 2k_p^2] = 1$$

$B = 1/[-2k_p^2 - 2jk_z k_p]$

Substitute $A, B,$ and $C$ into the convolution integral:

$$S = 1/2\,HF + \sum_{z_n=0}^{-l_3} \sum_{y_n=-l_2/2}^{+l_2/2} \sum_{x_n=-l_1/2}^{+l_1/2} \chi_{n1,n2,n3}\, e^{-j(k_x x_n + k_y y_n + k_z z_n)} \left\{ \frac{4\pi k_p^2}{j} \int_{-\infty}^{\infty} \frac{e^{+j\kappa_z z_n}}{\kappa_z [k_p^2 + k_z^2]} d\kappa_z + \right.$$

$$\left. \frac{4\pi k_p^2}{j} \int_{-\infty}^{\infty} \frac{e^{+j\kappa_z z_n} d\kappa_z}{[\kappa_z - k_z + jk_p][-2k_p^2 - 2jk_z k_p]} + \frac{4\pi k_p^2}{j} \int_{-\infty}^{\infty} \frac{e^{+j\kappa_z z_n} d\kappa_z}{[\kappa_z - k_z - jk_p][-2k_p^2 + 2jk_z k_p]} \right\}$$

Convolution of the first integral:

$$\frac{1}{jk_z} \longleftrightarrow \pi\,\mathrm{sgn}\, z_n = -\pi \text{ where } z_n < 0$$

$$\frac{4\pi k_p^2}{[k_p^2 + k_z^2]} \int_{-\infty}^{\infty} \frac{e^{+j\kappa_z z_n}}{j\kappa_z} d\kappa_z = \frac{-4\pi^2 k_p^2}{k_p^2 + k_z^2} \text{ where } z_n < 0$$

Convolution of the second integral:

$$\frac{4\pi k_p^2}{[-2k_p^2 - 2jk_zk_p]} \int_{-\infty}^{\infty} \frac{e^{+j\kappa_z z_n} d\kappa_z}{j[\kappa_z - k_z + jk_p]}$$

Change of variable:
Let $\kappa_z = -k_z - jk_p;\ d\kappa_z = -dk_z$ $$\frac{4\pi k_p^2}{[-2k_p^2 - 2jk_zk_p]} \int_{-\infty}^{\infty} \frac{e^{+j[-k_z - jk_p]z_n}}{j[-2k_z]} [-dk_z]$$

where $z_n < 0$ $$= \frac{2\pi k_p^2\, e^{-k_p|z_n|}}{[-2k_p^2 - 2jk_zk_p]} \int_{-\infty}^{\infty} \frac{2e^{+jk_z|z_n|}}{2jk_z} dk_z = \frac{\pi^2 k_p^2}{k_p^2 + jk_zk_p} e^{-k_p|z_n|}; \text{ where } z_n < 0$$

Convolution of the third integral:

$$\frac{2\pi k_p^2}{[-2k_p^2 + 2jk_zk_p]} \int_{-\infty}^{\infty} \frac{2e^{+j\kappa_z z_n} d\kappa_z}{j[\kappa_z - k_z - jk_p]}$$

Change of variable:
Let $\kappa_z = -k_z + jk_p;\ d\kappa_z = -dk_z$ $$\frac{2\pi k_p^2}{[-2k_p^2 + 2jk_zk_p]} \int_{-\infty}^{\infty} \frac{2e^{+j[-k_z + jk_p]z_n}}{j[-2k_z]} [-dk_z]$$

where $z_n < 0$ $$\frac{2\pi k_p^2\, e^{+k_p|z_n|}}{[-2k_p^2 + 2jk_zk_p]} \int_{-\infty}^{\infty} \frac{2e^{+jk_z|z_n|}}{2jk_z} dk_z = \frac{\pi k_p^2}{k_p^2 - jk_zk_p} e^{+k_p|z_n|}; \text{ where } z_n < 0$$

Combine integrals:

$$S = 1/2 HF + \sum_{z_n=0}^{-l_3} \sum_{y_n=-l_2/2}^{+l_2/2} \sum_{x_n=-l_1/2}^{+l_1/2} \chi_{n1,n2,n3}\, e^{-j[k_x x_n + k_y y_n + k_z z_n]} \left[\frac{-4\pi k_p^2}{k_p^2 + k_z^2}\right] +$$

$$\sum_{z_n=0}^{-l_3} \sum_{y_n=-l_2/2}^{+l_2/2} \sum_{x_n=-l_1/2}^{+l_1/2} \chi_{n1,n2,n3}\, e^{-j[k_x x_n + k_y y_n + k_z z_n]} \left\{\frac{\pi^2 k_p^2}{k_p^2 + jk_pk_z} e^{-k_p|z_n|} + \frac{\pi^2 k_p^2}{k_p^2 - jk_pk_z} e^{+k_p|z_n|}\right\}$$

APPENDIX VI
Derivation Of The Solution Of Inverse Transform 1

$$\mathcal{F}^{-1}\left\{\frac{\pi}{4} \sum_{z_n=0}^{-l_3} \sum_{y_n=-l_2/2}^{+l_2/2} \sum_{x_n=-l_1/2}^{+l_1/2} \chi_{n1,n2,n3} e^{-j[k_x x_n + k_y y_n + k_z z_n]}\right.$$

$$\left. [e^{-k_p|z_n|} + e^{+k_p|z_n|} + jk_z/k_p\, [e^{+k_p|z_n|} - e^{-k_p|z_n|}]]\right\}$$

where $z_n < 0$ $$= \frac{\pi}{4} \sum_{z_n} \sum_{y_n} \sum_{x_n} \chi_{n1,n2,n3}\, \delta[x - x_n, y - y_n, z - z_n]$$

$$\left\{ 2\pi \int_{-\infty}^{\infty} \int_0^{\infty} e^{-k_p|z_n|} J_0[k_p\rho] k_p\, dk_p\, e^{jk_z z} dk_z +\right.$$

$$2\pi \int_{-\infty}^{\infty} \int_0^{\infty} e^{+k_p|z_n|} J_0[k_p\rho] k_p\, dk_p\, e^{jk_z z} dk_z +$$

$$j2\pi \int_{-\infty}^{\infty} \int_0^{\infty} e^{+k_p|z_n|} J_0[k_p\rho] dk_p\, k_z\, e^{jk_z z} dk_z -$$

$$\left. j2\pi \int_{-\infty}^{\infty} \int_0^{\infty} e^{-k_p|z_n|} J_0[k_p\rho] dk_p\, k_z\, e^{jk_z z} dk_z \right.$$

Inverse Transform 1

$$\int_0^{\infty} e^{-ax} J_0[bx] dx = 1/[a^2 + b^2]^{1/2}$$

$$\therefore \int_0^{\infty} e^{-k_p z_n} J_0[k_p\rho] dk_p = 1/[z_n^2 + \rho^2]^{1/2}\ z_n > 0$$

$$\int_0^{\infty} e^{-at} J_\nu[bt]^{\nu+1} dt = \frac{2a[2b]^\nu \Gamma[\nu + 3/2]}{[a^2 + b^2]^{\nu + 3/2} \pi^{1/2}}; a > 0$$

$\nu = 0$
$t = k_p$
$b = \rho$
$a = z_n$ $$\frac{2|z_n|\Gamma[3/2]}{\pi^{1/2}[z_n^2 + \rho^2]^{3/2}} = \frac{|z_n|}{[z_n^2 + \rho^2]^{3/2}}$$

$$\therefore \int_0^{\infty} e^{-k_p|z_n|} J_0[k_p\rho] k_p\, dk_p = \frac{|z_n|}{[z_n^2 + \rho^2]^{3/2}}$$

$$\pi J_\nu[z] = e^{+j\pi/2[\nu+1]} K_\nu[ze^{+j\pi/2}] + e^{-j\pi/2[\nu+1]} K_\nu[ze^{-j\pi/2}]$$

$$\pi J_0[k_p \rho] = jK_0[jk_p\rho] - jK_0[-jk_p\rho]$$

$$\int_0^\infty e^{+k_p|z_n|} J_0[k_p\rho] dk_p =$$

$$\int_0^\infty \frac{e^{+k_p|z_n|}}{\pi} [jK_0[jk_p\rho] - jK_0[-jk_p\rho]] dk_p$$

$$\int_0^\infty j\frac{e^{+k_p|z_n|}}{\pi} K_0[jk_p\rho] dk_p - \frac{j}{\pi}\int_0^\infty e^{+k_p|z_n|} K_0[-jk_p\rho] dk_p$$

Change of variable:

First integral:     Second integral:

$k_p = jk_p$        $k_p = -jk_p$ $dk_p = jdk_p$      $dk_p = -jdk_p$ $$\int_0^\infty \frac{-1}{\pi} e^{+jk_p|z_n|} K_0[k_p\rho] dk_p +$$

$$\frac{-1}{\pi}\int_0^\infty e^{-jk_p|z_n|} K_0[k_p\rho] dk_p =$$

$$\int_0^\infty \frac{-1}{\pi}[\cos[k_p z_n] + j\sin[k_p z_n] + \cos[k_p z_n] - j\sin[k_p z_n]]$$

$$K_0[k_p\rho] dk_p = \int_0^\infty \frac{-2\rho^{1/2}}{\pi\rho^{1/2}} \cos[k_p z_n] K_0[k_p\rho] dk_p =$$

$$\frac{-2\rho^{1/2}\pi}{2\pi\rho^{1/2}[z_n^2+\rho^2]^{1/2}} = \frac{-1}{[z_n^2+\rho^2]^{1/2}}$$

$$\therefore \int_0^\infty e^{k_p|z_n|} J_0[k_p\rho] dk_p = \frac{-1}{[z_n^2+\rho^2]^{1/2}}$$

$x^m f[x], m =$ $$0, 1, 2, \ldots \Longleftrightarrow y^{1/2-\nu}[-d/ydy]^m[y^{m+\nu-1/2}g[y; m+\nu]]$$

$$\int_0^\infty k_p e^{k_p|z_n|} J_0[k_p\rho] dk_p = k_p^{-1}\{e^{k_p|z_n|} J_0[k_p\rho]\}$$

$m = 1$  $\nu = 0$  $y = |z_n|$ $$g[y; \nu] = \frac{-1}{[z_n^2+\rho^2]^{1/2}}$$

$$\int_0^\infty e^{k_p|z_n|} J_0[k_p\rho] dk_p = z_n^{1/2}\left[\frac{-d}{z_n dz_n}\right]^1\left[z_n^{1/2}\frac{-1}{[z_n^2+\rho^2]^{1/2}}\right]$$

$$= z_n^{-1/2}\frac{d}{dz_n}\left[\frac{z_n^{1/2}}{[z_n^2+\rho^2]^{1/2}}\right]$$

$$= z_n^{-1/2}[z_n^{1/2}[-1/2][z_n^2+\rho^2]^{-3/2} 2z_n + 1/2 z_n^{-1/2}[z_n^2+\rho^2]^{-1/2}]$$

$$= \frac{-|z_n|}{[z_n^2+\rho^2]^{3/2}} + \frac{1/2|z_n|^{-1}}{[z_n^2+\rho^2]^{1/2}}$$

$$\therefore \int_0^\infty k_p e^{k_p|z_n|} J_0[k_p\rho] dk_p = \frac{-|z_n|}{[z_n^2+\rho^2]^{3/2}} + \frac{1/2|z_n|^{-1}}{[z_n^2+\rho^2]^{1/2}}$$

Transform with respect to $k_z$ $$\int_{-\infty}^\infty jk_z e^{+jk_z z} dk_z = 2\pi\dot{\delta}[z]$$

Combining transforms:

$$\mathcal{F}^{-1}\left\{\frac{\pi}{4}\sum_{z_n=0}^{-1_3}\sum_{y_n=-1_1/2}^{+1_2/2}\sum_{x_n=-1_1/2}^{+1_1/2} \chi_{n1,n2,n3} e^{-j[k_x x_n + k_y y_n + k_z z_n]}\right.$$

$$\left.[e^{-k_p|z_n|} + e^{+k_p|z_n|} + jk_z/k_p[e^{+k_p|z_n|} - e^{-k_p|z_n|}]]\right\}$$

where $z_n < 0$ $$= 2\pi\left[\delta[z]\left[\frac{|z_n|}{[z_n^2+\rho^2]^{3/2}} - \frac{|z_n|}{[z_n^2+\rho^2]^{3/2}} + \frac{1/2|z_n|^{-1}}{[z_n^2+\rho^2]^{1/2}}\right] + \right.$$

$$\left. 2\pi\dot{\delta}[z]\left[\frac{-1}{[z_n^2+\rho^2]^{1/2}} - \frac{1}{[z_n^2+\rho^2]^{1/2}}\right]\right]$$

APPENDIX VII

```
10 ! PSI ALGORITHM
25 OPEN "PSIPROTOTYPE.LIS" FOR OUTPUT AS #1
26 C=.05
27 DIM X(9,9,9)
28 FOR W=1 TO 9 STEP 1
29 FOR T=1 TO 9 STEP 1
30 FOR S=1 TO 9 STEP 1
31 X(W,T,S)=0
32 NEXT S
33 NEXT T
34 NEXT W
35 X(5,5,6)=1
36 DIM DI(9,9)
37 PRINT #1, "DIPOLE PHANTOM"
40 FOR Q=1 TO 9 STEP 1
41 FOR R=1 TO 9 STEP 1
42 FOR U=1 TO 9 STEP 1
43 LET H=X(U,R,Q)
44 LET DI(U,R)=H
45 NEXT U
46 NEXT R
47 MAT PRINT #1,DI,
48 NEXT Q
50 DATA 0,0,0,0,0,0,0,0,0,0,0,0,0
52 DATA 0,0,0,0,0,-.6,-.9,-1.1,-1.2,-1.8,5.7,3.5,.4,-.4,-.5,-.7,-.6,.7
54 DATA 4.2,19.7,7.8,.1,-.9,-.3,-.4,-.7,.7,13.9,25.65,10.1,.9,-.8,-.3,-.6
56 DATA -.4,2.7,10.7,12.4,5.6,2.6,-.5,-.3,-.5,-.6,-.6,.3,3.7,.9,-.5,-1.0
58 DATA 0,0,0,0,0,0,0,0,0,0,0,0,0,0,0,0,0,0,0,0,0,0,0,0,0,0,0,0,0,0
60 DATA 0,0,-.5,-.8,-.8,-1.0,-1.2,-.8,6.9,.2,-.2,-.4,-.6,-.6,1.2,4.1,12.7,0,.6
62 DATA -.6,-.3,-.5,-.7,-.3,3.7,9.05,7.6,1.3,-.5,-.3,-.4,-.2,2.7,4.3,10.6,.8
64 DATA 1.7,-.4,-.3,-.5,-.4,-.1,1.1,1.1,1.7,.2,-.6,0,0,0,0,0,0,0,0,0,0,0,0
66 DATA 0,0,0,0,0,0,0,0,0,0,0,0,0,0,0,0,0,0,0,0,0,-.5,-.6,-.6,-.5,-.5
68 DATA .3,2.5,.1,-.1,-.3,-.4,-.3,1.3,3.9,8.1,1.7,.9,-.3,-.3,-.4,-.6,-.8,1.5
70 DATA 1.65,4.7,1.3,-.3,-.2,-.2,.1,2.1,3.5,7.1,.7,.7,-.3,-.2,-.4,-.2,.2,1.2
72 DATA 1.1,1.4,.4,-.3,0,0,0,0,0,0,0,0,0,0,0,0,0,0,0,0,0,0,0,0,0,0,0
74 DATA 0,0,0,0,0,0,0,0,0,0,-.4,-.5,0,-.1,-.1,1.7,1.5,.2,-.1,-.2,-.2,0,1.3,3.1
76 DATA 4.1,3.4,.9,0,-.2,-.3,-.4,-.4,1.1,.65,2.9,1.1,-.2,-.1,-.1,.2,1.2,1.6
78 DATA 4.9,.1,.5,-.3,-.2,-.3,-.1,0,.3,1.3,.6,.1,-.1,0,0,0,0,0,0,0,0,0,0
80 DATA 0,0,0,0,0,0,0,0,0,0,0,0,0,0,0,0,0,0,0,0,0,0,-.3,-.2,.1,.9,1.6,1.6
```

```
82 DATA .4,0,0,-.1,-.1,.2,1.0,2.2,2.7,3.7,.5,0,-.2,-.2,-.2,-
.1,.6,.25,1.6,.7
84 DATA -.2,-.1,-.1,.1,.7,.9,2.8,0,.3,-.2,-.1,-.2,-.1,0,.2,.3,.3,0,-
.1,0,0,0
85 DATA 0,0,0,0,0,0,0,0,0,0,0,0,0,0,0
86 DATA 0,0,0,0,0,0,0,0,0,0,0,0,0,0,0,0,0,-.2,-
.1,.1,1.0,1.4,1.3,.2,0,0
88 DATA -.1,0,.2,.7,1.5,2.0,2.9,.3,0,-.1,-.1,.1,0,.7,.25,.9,.4,-
.1,0,0,.1,.5
90 DATA .5,1.3,0,.2,-.1,0,-.1,0,.1,.2,.1,.2,0,-
.1,0,0,0,0,0,0,0,0,0,0,0,0,0
92 DATA 0,0,0,0,0,0,0,0,0,0,0,0,0,0,0,0,0,0,0,0,0,-
.1,0,.1,.8,.9,1.0,.1,0,0
94 DATA 0,0,.2,.5,1.1,1.3,2.0,.3,0,0,-.1,0,0,.3,.15,.6,.2,-
.1,0,0,.1,.4,.3,.9
96 DATA 0,.2,-.1,0,-
.1,.1,.1,.1,.1,.2,0,0,0,0,0,0,0,0,0,0,0,0,0,0,0,0,0
98 DATA 0,0,0,0,0,0,0,0,0,0,0,0,0,0,0,0,0,-.1,0,0,.7,.7,.6,.1,0,.1
100 DATA 0,.1,.2,.3,.6,.8,1.0,.2,0,0,-
.1,0,0,.1,.15,.3,.1,0,0,0,.2,.2,.5
102 DATA 0,.1,-
.1,0,0,0,.1,.1,.1,.1,0,0,0,0,0,0,0,0,0,0,0,0,0,0,0,0,0
104 DATA
0,0,0,0,0,0,0,0,0,0,0,0,0,0,0,0,0,0,0,.5,.4,.4,.1,0,0,0,.1,.1
106 DATA .4,.5,.6,.1,0,0,0,0,0,.05,.1,0,0,0,0,.1,.1,.3,0,.1,-
.1,0,0,0,0,0
108 DATA .1,0,0,0,0,0,0,0,0,0,0,0,0,0,0,0,0,0,0,0,0
120 DIM V(9,9,9)
130 FOR Z=1 TO 9 STEP 1
140 FOR Q=1 TO 9 STEP 1
145 FOR U=1 TO 9 STEP 1
147 READ V(Z,Q,U)
222 NEXT U
223 NEXT Q
224 NEXT Z
225 PRINT #1, "VOLTAGE DATA"
226 DIM VO(9,9)
227 FOR Q=1 TO 9 STEP 1
228 FOR R=1 TO 9 STEP 1
229 FOR U=1 TO 9 STEP 1
230 LET H=V(U,R,Q)
231 LET VO(U,R)=H
232 NEXT U
233 NEXT R
234 MAT   PRINT #1, VO ,
235 NEXT Q
254 !FFT THE ROWS OF SAMPLED VOLTAGES IN THE X DIRECTION
255 DIM MR(9)
256 DIM MI(9)
257 DIM R(9)
258 DIM RV(9,9,9)
259 DIM IV(9,9,9)
260 FOR V=0 TO 9 STEP 1
270 FOR M=1 TO 9 STEP 1
280 FOR N=1 TO 9 STEP 1
290 LET Y=V(M,N,V)
300 LET R(N)=Y
305 NEXT N
310 EXTERNAL SUB FFT(DIM(),DIM(),DIM())
320 CALL FFT(R(),MR(),MI())
330 FOR N=1 TO 9 STEP 1
```

```
340 LET  Y=MR(N)
350 LET RV(M,N,V)=Y
360 NEXT N
370 FOR N=1 TO 9 STEP 1
380 LET G=MI(N)
390 LET IV(M,N,V)=G
400 NEXT N
410 NEXT M
415 NEXT V
417 DIM RVO(9,9)
419 DIM IVO(9,9)
420 PRINT #1,"RV"
421 FOR Q=1 TO 9 STEP 1
422 FOR R=1 TO 9 STEP 1
423 FOR U=1 TO 9 STEP 1
424 LET H=RV(U,R,Q)
425 LET RVO(U,R)=H
426 NEXT U
427 NEXT R
428 MAT PRINT #1, RVO,
429 NEXT Q
430 PRINT #1, "IV"
431 FOR Q=1 TO 9 STEP 1
432 FOR R=1 TO 9 STEP 1
433 FOR U=1 TO 9 STEP 1
434 LET H=IV(U,R,Q)
435 LET IVO(U,R)=H
436 NEXT U
437 NEXT R
438 MAT PRINT #1, IVO,
439 NEXT Q
455 !FFT THE COLUMNS OF THE SAMPLED VOLTAGE IN THE Z DIRECTION
460 DIM RRV(9,9,9)
470 DIM IRV(9,9,9)
475 FOR V=1 TO 9 STEP 1
480 FOR N=1 TO 9 STEP 1
490 FOR M=1 TO 9 STEP 1
500 LET Y=RV(M,N,V)
510 LET R(M)=Y
520 NEXT M
530 CALL FFT(R(),MR(),MI())
540 FOR M=1 TO 9 STEP 1
550 LET H=MR(M)
560 LET RRV(M,N,V)=H
570 NEXT M
580 FOR M=1 TO 9 STEP 1
590 LET G=MI(M)
600 LET IRV(M,N,V)=G
610 NEXT M
620 NEXT N
625 NEXT V
626 DIM RRVO(9,9)
627 DIM IRVO(9,9)
630 PRINT #1,"RRV"
631 FOR Q=1 TO 9 STEP 1
632 FOR R=1 TO 9 STEP 1
633 FOR U =1 TO 9 STEP 1
634 LET H=RRV(U,R,Q)
637 LET RRVO(U,R)=H
638 NEXT U
639 NEXT R
```

```
640 MAT PRINT #1, RRVO,
641 NEXT Q
650 PRINT #1, "IRV"
651 FOR Q=1 TO 9 STEP 1
653 FOR R=1 TO 9 STEP 1
654 FOR U=1 TO 9 STEP 1
655 LET H= IRV(U,R,Q)
656 LET IRVO(U,R)=H
657 NEXT U
658 NEXT R
659 MAT PRINT #1, IRVO,
660 NEXT Q
661 DIM RIV(9,9,9)
662 DIM IIV(9,9,9)
685 FOR V=1 TO 9 STEP 1
690 FOR N=1 TO 9 STEP 1
700 FOR M=1 TO 9 STEP 1
710 LET Y=IV(M,N,V)
760 LET R(M)=Y
770 NEXT M
830 CALL FFT(R(),MR(),MI())
840 FOR M=1 TO 9 STEP 1
850 LET H=MR(M)
860 LET RIV(M,N,V)=H
870 NEXT M
872 FOR M= 1 TO 9 STEP 1
873 LET G=MI(M)
874 LET IIV(M,N,V)=G
875 NEXT M
876 NEXT N
877 NEXT V
878 DIM RIVO(9,9)
879 DIM IIVO(9,9)
880 PRINT #1, "RIV"
881 FOR Q=1 TO 9 STEP 1
882 FOR R=1 TO 9 STEP 1
883 FOR U=1 TO 9 STEP 1
884 LET H=RIV(U,R,Q)
885 LET RIVO(U,R)=H
886 NEXT U
887 NEXT R
888 MAT PRINT #1, RIVO,
889 NEXT Q
890 PRINT #1, "IIV"
891 FOR Q=1 TO 9 STEP 1
892 FOR R=1 TO 9 STEP 1
893 FOR U=1 TO 9 STEP 1
894 LET H=IIV(U,R,Q)
895 LET IIVO(U,R)=H
896 NEXT U
897 NEXT R
898 MAT PRINT #1, IIVO,
899 NEXT Q
900 DIM RVA(9,9,9)
901 DIM IVA(9,9,9)
904 DIM RVAO(9,9)
906 DIM IVAO(9,9)
908 FOR Q=1 TO 9 STEP 1
910 FOR R=1 TO 9 STEP 1
911 FOR U=1 TO 9 STEP 1
912 LET H=IIV(U,R,Q)
913 H=(-1)*H
```

```
914 LET G=RRV(U,R,Q)
915 LET L=G+H
916 LET RVA(U,R,Q)=L
917 NEXT U
918 NEXT R
919 NEXT Q
920 FOR Q=1 TO 9 STEP 1
921 FOR R=1 TO 9 STEP 1
922 FOR U=1 TO 9 STEP 1
923 LET H=IRV(U,R,Q)
924 LET L=RIV(U,R,Q)
925 LET IVA(U,R,Q)=H+L
927 NEXT U
928 NEXT R
930 NEXT Q
932 PRINT #1, "RVA"
934 FOR Q=1 TO 9 STEP 1
936 FOR R=1 TO 9 STEP 1
938 FOR U=1 TO 9 STEP 1
940 LET H=RVA(U,R,Q)
942 LET RVAO(U,R)=H
944 NEXT U
946 NEXT R
948 MAT PRINT #1, RVAO,
950 NEXT Q
952 PRINT #1, "IVA"
954 FOR Q=1 TO 9 STEP 1
956 FOR R=1 TO 9 STEP 1
958 FOR U=1 TO 9 STEP 1
960 LET H=IVA(U,R,Q)
962 LET IVAO(U,R)=H
964 NEXT U
966 NEXT R
968 MAT PRINT #1, IVAO,
970 NEXT Q
972 !FFT THE ROWS OF THE SAMPLED VOLTAGES IN THE Y DIRECTION
980 DIM RVAY(9,9,9)
990 DIM IRVAY(9,9,9)
992 DIM RVAYO(9,9)
994 DIM IRVAYO(9,9)
1012 FOR M=1 TO 9 STEP 1
1013 FOR N=1 TO 9 STEP 1
1014 FOR V=1 TO 9 STEP 1
1015 LET Y=RVA(M,N,V)
1016 LET R(V)=Y
1017 NEXT V
1018 CALL FFT(R(),MR(),MI())
1019 FOR V=1 TO 9 STEP 1
1020 LET H=MR(V)
1021 LET RVAY (M,N,V)=H
1022 NEXT V
1023 FOR V=1 TO 9 STEP 1
1024 LET G=MI(V)
1025 LET IRVAY(M,N,V)=G
1026 NEXT V
1027 NEXT N
1028 NEXT M
1030 PRINT #1,"RVAY"
1032 FOR Q=1 TO 9 STEP 1
1034 FOR R=1 TO 9 STEP 1
1036 FOR U=1 TO 9 STEP 1
1038 LET H=RVAY(U,R,Q)
```

```
1040 LET RVAYO(U,R)=H
1042 NEXT U
1044 NEXT R
1046 MAT PRINT #1,RVAYO,
1048 NEXT Q
1050 PRINT #1, "IRVAY"
1052 FOR Q=1 TO 9 STEP 1
1054 FOR R=1 TO 9 STEP 1
1056 FOR U=1 TO 9 STEP 1
1058 LET H=IRVAY(U,R,Q)
1060 LET IRVAYO(U,R)=H
1062 NEXT U
1064 NEXT R
1066 MAT PRINT #1,IRVAYO,
1068 NEXT Q
1070 DIM RIVY(9,9,9)
1080 DIM IIVY(9,9,9)
1085 DIM RIVYO(9,9)
1086 DIM IIVYO(9,9)
1090 FOR M=1 TO 9 STEP 1
1100 FOR N=1 TO 9 STEP 1
1138 FOR V=1 TO 9 STEP 1
1139 LET Y=IVA(M,N,V)
1140 LET R(V)=Y
1141 NEXT V
1142 CALL FFT(R(),MR(),MI())
1143 FOR V=1 TO 9 STEP 1
1144 LET H=MR(V)
1145 LET RIVY(M,N,V)=H
1146 NEXT V
1147 FOR V=1 TO 9 STEP 1
1148 LET G=MI(V)
1149 LET IIVY(M,N,V)=G
1150 NEXT V
1151 NEXT N
1152 NEXT M
1153 PRINT #1, "RIVY"
1160 FOR Q=1 TO 9 STEP 1
1162 FOR R=1 TO 9 STEP 1
1164 FOR U=1 TO 9 STEP 1
1166 LET H=RIVY(U,R,Q)
1170 LET RIVYO(U,R)=H
1172 NEXT U
1174 NEXT R
1178 MAT PRINT #1, RIVYO,
1180 NEXT Q
1185 PRINT #1, "IIVY"
1190 FOR Q=1 TO 9 STEP 1
1200 FOR R=1 TO 9 STEP 1
1210 FOR U=1 TO 9 STEP 1
1212 LET H= IIVY(U,R,Q)
1214 LET IIVYO(U,R)=H
1216 NEXT U
1218 NEXT R
1220 MAT PRINT #1,IIVYO,
1222 NEXT Q
1230 DIM YRVA(9,9,9)
1240 DIM YIVA(9,9,9)
1241 FOR Q=1 TO 9 STEP 1
1250 FOR R=1 TO 9 STEP 1
1260 FOR U=1 TO 9 STEP 1
```

```
1270 LET L=IIVY(U,R,Q)
1280 LET B=RVAY(U,R,Q)
1290 LET YRVA(U,R,Q)=B-L
1300 NEXT U
1310 NEXT R
1320 NEXT Q
1330 FOR Q=1 TO 9 STEP 1
1340 FOR R=1 TO 9 STEP 1
1345 FOR U=1 TO 9 STEP 1
1350 LET H=RIVY(U,R,Q)
1360 LET L=IRVAY(U,R,Q)
1370 LET YIVA(U,R,Q)=L+H
1380 NEXT U
1390 NEXT R
1400 NEXT Q
1410 PRINT #1, "YRVA"
1412 DIM YRVAO(9,9)
1414 DIM YIVAO(9,9)
1420 FOR Q=1 TO 9 STEP 1
1430 FOR R=1 TO 9 STEP 1
1440 FOR U=1 TO 9 STEP 1
1450 LET H=YRVA(U,R,Q)
1460 LET YRVAO(U,R)=H
1470 NEXT U
1480 NEXT R
1490 MAT PRINT #1,YRVAO,
1500 NEXT Q
1510 PRINT #1, "YIVA"
1520 FOR Q=1 TO 9 STEP 1
1530 FOR R=1 TO 9 STEP 1
1540 FOR U=1 TO 9 STEP 1
1545 LET H=YIVA(U,R,Q)
1550 LET YIVAO(U,R)=H
1560 NEXT U
1570 NEXT R
1580 MAT PRINT #1,YIVAO,
1590 NEXT Q
2050 !GENERATE THE DISCRETE SPECTRUM OF THE SYSTEM FUNCTION
2060 DIM SFH(9,9,9)
2061 DIM SFHO(9,9)
2065 LET SFH(4,4,4)=4*PI
2066 FOR V=-4 TO 4 STEP 1
2070 FOR M=-4 TO 4 STEP 1
2080 FOR N=-4 TO 4 STEP 1
2090 J=ABS(M)+ABS(N)+ABS(V)
2100 IF J=0 THEN GO TO 2126
2110 T=4*PI*((2*PI*N/9*1/.1)^2+((2*PI*V/9*1/.1)^2))
2120 B=(2*PI*N/9*1/.1)^2+(2*PI*M/9*1/C)^2+(2*PI*V/9*1/.1)^2
2125 LET SFH(M+5,N+5,V+5)=T/B
2126 NEXT N
2130 NEXT M
2131 NEXT V
2135 PRINT #1, "SFH"
2136 FOR Q=1 TO 9 STEP 1
2137 FOR R=1 TO 9 STEP 1
2138 FOR U=1 TO 9 STEP 1
2139 LET S=SFH(U,R,Q)
2140 LET SFHO(U,R)=S
2141 NEXT U
2142 NEXT R
2143 MAT PRINT #1, SFHO,
2144 NEXT Q
```

```
2150 !INVERSE THE DISCRETE SPECTRUM OF THE SYSTEM FUNCTION
2160 DIM HR(9,9,9)
2170 DIM HRO(9,9).
2175 FOR V=1 TO 9 STEP 1
2180 FOR M=1 TO 9 STEP 1
2190 FOR N=1 TO 9 STEP 1
2200 LET Y=SFH(M,N,V)
2210 IF Y=0 THEN GO TO 2230
2220 Y=1/Y
2230 LET HR(M,N,V)=Y
2240 NEXT N
2250 NEXT M
2260 NEXT V
2310 PRINT #1,"HR"
2311 FOR Q=1 TO 9 STEP 1
2312 FOR R=1 TO 9 STEP 1
2313 FOR U=1 TO 9 STEP 1
2314 LET S=HR(U,R,Q)
2315 LET HRO(U,R)=S
2316 NEXT U
2317 NEXT R
2320 MAT PRINT #1,HRO,
2321 NEXT Q
2340 !DIVIDE THE TRANSFORMED DATA BY THE TRANSFORM OF THE SYSTEM
FUNCTION
3030 DIM FR(9,9,9)
3050 DIM FI(9,9,9)
3052 DIM FRO(9,9)
3054 DIM FIO(9,9)
3056 FOR V=1 TO 9 STEP 1
3061 FOR M=1 TO 9 STEP 1
3062 FOR N=1 TO 9 STEP 1
3063 T=YRVA(M,N,V)
3064 S=HR(M,N,V)
3065 K=S*T
3066 LET FR(M,N,V)=K
3067 NEXT N
3068 NEXT M
3070 NEXT V
3080 FOR V=1 TO 9 STEP 1
3091 FOR M=1 TO 9 STEP 1
3092 FOR N=1 TO 9 STEP 1
3093 K= HR(M,N,V)
3094 L= YIVA(M,N,V)
3095 E=K*L
3096 LET FI(M,N,V)=E
3097 NEXT N
3098 NEXT M
3100 NEXT V
3130 PRINT #1, "FR"
3131 FOR Q=1 TO 9 STEP 1
3132 FOR R=1 TO 9 STEP 1
3133 FOR U=1 TO 9 STEP 1
3134 LET H= FR(U,R,Q)
3135 LET FRO(U,R)=H
3136 NEXT U
3137 NEXT R
3138 MAT PRINT #1, FRO,
3140 NEXT Q
3150 PRINT #1, "FI"
3151 FOR Q=1 TO 9 STEP 1
3152 FOR R=1 TO 9 STEP 1
```

```
3153 FOR U=1 TO 9 STEP 1
3154 LET H=FI(U,R,Q)
3155 LET FIO(U,R)=H
3156 NEXT U
3157 NEXT R
3158 MAT PRINT #1, FIO,
3160 NEXT Q
3170 !INVERSE TRANSFORM THE ROWS IN THE X DIRECTION
3180 DIM RF(9,9,9)
3185 DIM RFO(9,9)
3187 DIM MIFO(9,9)
3190 DIM MIF(9,9,9)
3195 DIM I(9)
3196 FOR V=1 TO 9 STEP 1
3200 FOR M=1 TO 9 STEP 1
3210 FOR N=1 TO 9 STEP 1
3220 LET Y=FR(M,N,V)
3230 LET R(N)=Y
3240 NEXT N
3250 FOR N=1 TO 9 STEP 1
3260 LET Y=FI(M,N,V)
3270 LET I(N)=Y
3280 NEXT N
3285 EXTERNAL SUB IFT(DIM(),DIM(),DIM(),DIM())
3290 CALL IFT(R(),I(),MR(),MI())
3300 FOR N=1 TO 9 STEP 1
3310 LET Y=MR(N)
3320 LET RF(M,N,V)=Y
3330 NEXT N
3340 FOR N=1 TO 9 STEP 1
3350 LET Y=MI(N)
3360 LET MIF(M,N,V)=Y
3370 NEXT N
3380 NEXT M
3385 NEXT V
3390 PRINT #1, "RF"
3391 FOR Q=1 TO 9 STEP 1
3392 FOR R=1 TO 9 STEP 1
3393 FOR U=1 TO 9 STEP 1
3394 LET H=RF(U,R,Q)
3395 LET RFO(U,R)=H
3396 NEXT U
3397 NEXT R
3400 MAT PRINT #1, RFO,
3405 NEXT Q
3410 PRINT #1," MIF "
3411 FOR Q=1 TO 9 STEP 1
3412 FOR R=1 TO 9 STEP 1
3413 FOR U=1 TO 9 STEP 1
3414 LET H= MIF(U,R,Q)
3415 LET MIFO(U,R)=H
3416 NEXT U
3417 NEXT R
3420 MAT PRINT #1, MIFO,
3421 NEXT Q
3422 !INVERSE TRANSFORM THE ROWS IN THE Y DIRECTION
3430 DIM RFY(9,9,9)
3432 DIM MIFY(9,9,9)
3433 DIM RFYO(9,9)
3434 DIM MIFYO(9,9)
3435 FOR M=1 TO 9 STEP 1
```

```
3440 FOR N=1 TO 9 STEP 1
3450 FOR V=1 TO 9 STEP 1
3460 LET Y=RF(M,N,V)
3470 LET R(V)=Y
3480 NEXT V
3490 FOR V=1 TO 9 STEP 1
3500 LET Y=MIF(M,N,V)
3510 LET I(V)=Y
3520 NEXT V
3525 EXTERNAL SUB IFT(DIM(),DIM(),DIM(),DIM())
3526 CALL IFT(R(),I(),MR(),MI())
3527 FOR V=1 TO 9 STEP 1
3528 LET Y=MR(V)
3529 LET RFY(M,N,V)=Y
3530 NEXT V
3531 FOR V=1 TO 9 STEP 1
3532 LET Y=MI(V)
3533 LET MIFY(M,N,V)=Y
3534 NEXT V
3535 NEXT N
3536 NEXT M
3537 PRINT #1, "RFY"
3538 FOR Q=1 TO 9 STEP 1
3539 FOR R=1 TO 9 STEP 1
3540 FOR U=1 TO 9 STEP 1
3541. LET H=RFY(U,R,Q)
3542 LET RFYO(U,R)=H
3543 NEXT U
3544 NEXT R
3545 MAT PRINT #1, RFYO,
3546 NEXT Q
3547 PRINT #1, "MIFY"
3550 FOR Q=1 TO 9 STEP 1
3555 FOR R=1 TO 9 STEP 1
3560 FOR U=1 TO 9 STEP 1
3565 LET H=MIFY(U,R,Q)
3566 LET MIFYO(U,R)=H
3567 NEXT U
3568 NEXT R
3570 MAT PRINT #1,MIFYO,
3575 NEXT Q
3580 !INVERSE TRANSFORM THE COLUMNS IN THE Z DIRECTION
3581 DIM F(9,9,9)
3590 DIM FO(9,9)
3592 FOR V=1 TO 9 STEP 1
3593 FOR N=1 TO 9 STEP 1
3594 FOR M=1 TO 9 STEP 1
3600 LET Y=RFY(M,N,V)
4546 LET R(M)=Y
4547 NEXT M
4548 FOR M=1 TO 9 STEP 1
4549 LET Y=MIFY(M,N,V)
4550 LET I(M)=Y
4552 NEXT M
4553 EXTERNAL SUB IFTZ(DIM(),DIM(),DIM(),DIM())
4554 CALL IFTZ(R(),I(),MR(),MI())
4556 FOR M=1 TO 9 STEP 1
4557 LET Y=MR(M)
4559 LET F(M,N,V)=Y
4600 NEXT M
4602 NEXT N
4604 NEXT V
```

```
4605 PRINT #1, "F"
4610 FOR Q=1 TO 9 STEP 1
4620 FOR R=1 TO 9 STEP 1
4630 FOR U=1 TO 9 STEP 1
4635 LET H=F(U,R,Q)
4640 LET FO(U,R)=H
4650 NEXT U
4660 NEXT R
4666 MAT PRINT #1,FO,
4670 NEXT Q
4677 !CORRECT FOR THE U(Z) CONVOLUTION
4678 DIM CF(9,9,9)
4780 DIM CFO(9,9)
4809 FOR V=1 TO 9 STEP 1
4810 FOR N=1 TO 9 STEP 1
4871 LET K=F(1,N,V)
4873 K=K/10E8
4974 LET CF(1,N,V)=K
5915 NEXT N
6616 NEXT V
6617 FOR V=1 TO 9 STEP 1
6620 FOR M=2 TO 9 STEP 1
6630 FOR N=1 TO 9 STEP 1
6640 LET K=F(M,N,V)
6641 P=.25*PI^2/(M-1)^2/C^2
6642 P=P+.5-PI
6650 K=K/P
6660 LET CF(M,N,V)=K
6670 NEXT N
6680 NEXT M
6681 NEXT V
6690 PRINT #1, "RECONSTRUCTION"
6691 FOR Q=1 TO 9 STEP 1
6692 FOR R=1 TO 9 STEP 1
6693 FOR U=1 TO 9 STEP 1
6694 LET H=CF(U,R,Q)
6695 LET CFO(U,R)=H
6696 NEXT U
6697 NEXT R
6700 MAT PRINT #1,CFO,
6705 NEXT Q
6710 END
6722 SUB FFT(R(),MR(),MI())
6726 FOR M=1 TO 9 STEP 1
6730 A=0
6740 FOR N=1 TO 9 STEP 1
6750 LET H=R(N)
6760 B=H*COS(2*PI*(M-5)*(N-5)/9)
6770 A=A+B
6780 NEXT N
6790 A=A/9
6800 LET MR(M)=A
6810 NEXT M
6820 FOR M=1 TO 9 STEP 1
6830 A=0
6840 FOR N=1 TO 9 STEP 1
6880 LET H=R(N)
6890 H=-H
6900 B=H*SIN(2*PI*(M-5)*(N-5)/9)
6910 A=A+B
6920 NEXT N
6930 A=A/9
```

```
6935 LET MI(M)=A
6940 NEXT M
6950 END SUB
6960   SUB IFT(R(),I(),MR(),MI())
6970 DIM MRR(9)
6980 DIM MRI(9)
6990 DIM MIR(9)
7000 DIM MII(9)
7010 FOR N=1 TO 9 STEP 1
7020 A=0
7030 FOR M=1 TO 9 STEP 1
7040 LET G=R(M)
7050 B=G*COS(2*PI*(M-5)*(N-5)/9)
7060 A=A+B
7070 NEXT M
7080 LET MRR(N)=A
7090 NEXT N
7100 FOR N=1 TO 9 STEP 1
7110 A=0
7120 FOR M=1 TO 9 STEP 1
7130 LET G=R(M)
7140 B=G*SIN(2*PI*(M-5)*(N-5)/9)
7150 A=A+B
7160 NEXT M
7170 LET MRI(N)=A
7180 NEXT N
7190 FOR N=1 TO 9 STEP 1
7200 A=0
7210 FOR M=1 TO 9 STEP 1
7220 LET G=I(M)
7230 B=G*COS(2*PI*(M-5)*(N-5)/9)
7240 A=A+B
7250 NEXT M
7260 LET MIR(N)=A
7270 NEXT N
7280 FOR N=1 TO 9 STEP 1
7290 A=0
7300 FOR M=1 TO 9 STEP 1
7310 LET G=I(M)
7320 B=G*SIN(2*PI*(M-5)*(N-5)/9)
7330 A=A+B
7340 NEXT M
7350 LET MII(N)=A
7360 NEXT N
7365 MAT MII=(-1)*MII
7375 MAT MR=MRR+MII
7385 MAT MI=MIR+MRI
7400 END SUB
7410   SUB IFTZ(R(),I(),MR(),MI())
7420 DIM MRR(9)
7430 DIM MRI(9)
7440 DIM MIR(9)
7450 DIM MII(9)
7460 FOR N=1 TO 9 STEP 1
7470 A=0
7480 FOR M=1 TO 9 STEP 1         ;
7490 LET G=R(M)
7500 B=G*COS(2*PI*(M-5)*(-N+1)/9)
7510 A=A+B
7520 NEXT M
7530 LET MRR(N)=A
7540 NEXT N
```

```
7550 FOR N=1 TO 9 STEP 1
7560 A=0
7570 FOR M=1 TO 9 STEP 1
7580 LET G=R(M)
7590 B=G*SIN(2*PI*(M-5)*(-N+1)/9)
7600 A=A+B
7610 NEXT M
7620 LET MRI(N)=A
7630 NEXT N
7640 FOR N=1 TO 9 STEP 1
7641 A=0
7642 FOR M=1 TO 9 STEP 1
7650 LET G=I(M)
7660 B=G*COS(2*PI*(M-5)*(-N+1)/9)
7670 A=A+B
7680 NEXT M
7690 LET MIR(N)=A
7700 NEXT N
7710 FOR N=1 TO 9 STEP 1
7720 A=0
7730 FOR M=1 TO 9 STEP 1
7740 LET G=I(M)
7750 B=G*SIN(2*PI*(M-5)*(-N+1)/9)
7760 A=A+B
7770 NEXT M
7780 LET MII(N)=A
7790 NEXT N
7795 MAT MII=(-1)*MII
7800 MAT MR=MRR+MII
7810 MAT MI=MRI+MIR
7880 END SUB
```

$

APPENDIX VIII

```
10 ! PSI ALGORITHM
25 OPEN "PSIPROTOTYPEI.LIS" FOR OUTPUT AS #1
26 C=.05
27 DIM X(9,9,9)
28 FOR W=1 TO 9 STEP 1
29 FOR T=1 TO 9 STEP 1
30 FOR S=1 TO 9 STEP 1
31 X(W,T,S)=0
32 NEXT S
33 NEXT T
34 NEXT W
35 X(5,5,6)=1
36 DIM DI(9,9)
37 PRINT #1, "DIPOLE PHANTOM"
40 FOR Q=1 TO 9 STEP 1
41 FOR R=1 TO 9 STEP 1
42 FOR U=1 TO 9 STEP 1
43 LET H=X(U,R,Q)
44 LET DI(U,R)=H
```

```
45 NEXT U
46 NEXT R
47 MAT PRINT #1,DI,
48 NEXT Q
50 DATA 0,0,0,0,0,0,0,0,0,0,0,0,0
52 DATA 0,0,0,0,0,-.6,-.9,-1.1,-1.2,-1.8,5.7,3.5,.4,-.4,-.5,-.7,-.6,.7
54 DATA 4.2,19.7,7.8,.1,-.9,-.3,-.4,-.7,.7,13.9,25.65,10.1,.9,-.8,-.3,-.6
56 DATA -.4,2.7,10.7,12.4,5.6,2.6,-.5,-.3,-.5,-.6,-.6,.3,3.7,.9,-.5,-1.0
58 DATA 0,0,0,0,0,0,0,0,0,0,0,0,0,0,0,0,0,0,0,0,0,0,0,0,0,0,0,0,0,0,0,0
60 DATA 0,0,-.5,-.8,-.8,-1.0,-1.2,-.8,6.9,.2,-.2,-.4,-.6,-.6,1.2,4.1,12.7,0,.6
62 DATA -.6,-.3,-.5,-.7,-.3,3.7,9.05,7.6,1.3,-.5,-.3,-.4,-.2,2.7,4.3,10.6,.8
64 DATA 1.7,-.4,-.3,-.5,-.4,-.1,1.1,1.1,1.7,.2,-.6,0,0,0,0,0,0,0,0,0,0,0,0
66 DATA 0,0,0,0,0,0,0,0,0,0,0,0,0,0,0,0,0,0,0,0,0,-.5,-.6,-.6,-.5,-.5
68 DATA .3,2.5,.1,-.1,-.3,-.4,-.3,1.3,3.9,8.1,1.7,.9,-.3,-.3,-.4,-.6,-.8,1.5
70 DATA 1.65,4.7,1.3,-.3,-.2,-.2,.1,2.1,3.5,7.1,.7,.7,-.3,-.2,-.4,-.2,.2,1.2
72 DATA 1.1,1.4,.4,-.3,0,0,0,0,0,0,0,0,0,0,0,0,0,0,0,0,0,0,0,0,0,0,0,0
74 DATA 0,0,0,0,0,0,0,0,0,0,-.4,-.5,0,-.1,-.1,1.7,1.5,.2,-.1,-.2,-.2,0,1.3,3.1
76 DATA 4.1,3.4,.9,0,-.2,-.3,-.4,-.4,1.1,.65,2.9,1.1,-.2,-.1,-.1,.2,1.2,1.6
78 DATA 4.9,.1,.5,-.3,-.2,-.3,-.1,0,.3,1.3,.6,.1,-.1,0,0,0,0,0,0,0,0,0,0
80 DATA 0,0,0,0,0,0,0,0,0,0,0,0,0,0,0,0,0,0,0,0,0,0,-.3,-.2,.1,.9,1.6,1.6
82 DATA .4,0,0,-.1,-.1,.2,1.0,2.2,2.7,3.7,.5,0,-.2,-.2,-.2,-.1,.6,.25,1.6,.7
84 DATA -.2,-.1,-.1,.1,.7,.9,2.8,0,.3,-.2,-.1,-.2,-.1,0,.2,.3,.3,0,-.1,0,0,0
85 DATA 0,0,0,0,0,0,0,0,0,0,0,0,0,0,0,0
86 DATA 0,0,0,0,0,0,0,0,0,0,0,0,0,0,0,0,0,-.2,-.1,.1,1.0,1.4,1.3,.2,0,0
88 DATA -.1,0,.2,.7,1.5,2.0,2.9,.3,0,-.1,-.1,.1,0,.7,.25,.9,.4,-.1,0,0,.1,.5
90 DATA .5,1.3,0,.2,-.1,0,-.1,0,.1,.2,.1,.2,0,-.1,0,0,0,0,0,0,0,0,0,0,0
92 DATA 0,0,0,0,0,0,0,0,0,0,0,0,0,0,0,0,0,0,0,0,0,-.1,0,.1,.8,.9,1.0,.1,0,0
94 DATA 0,0,.2,.5,1.1,1.3,2.0,.3,0,0,-.1,0,0,.3,.15,.6,.2,-.1,0,0,.1,.4,.3,.9
96 DATA 0,.2,-.1,0,-.1,.1,.1,.1,.1,.2,0,0,0,0,0,0,0,0,0,0,0,0,0,0,0,0
98 DATA 0,0,0,0,0,0,0,0,0,0,0,0,0,0,0,0,0,-.1,0,0,.7,.7,.6,.1,0,.1
100 DATA 0,.1,.2,.3,.6,.8,1.0,.2,0,0,-.1,0,0,.1,.15,.3,.1,0,0,0,.2,.2,.5
102 DATA 0,.1,-.1,0,0,0,.1,.1,.1,.1,0,0,0,0,0,0,0,0,0,0,0,0,0,0,0,0
104 DATA 0,0,0,0,0,0,0,0,0,0,0,0,0,0,0,0,0,0,0,.5,.4,.4,.1,0,0,0,.1,.1
106 DATA .4,.5,.6,.1,0,0,0,0,0,.05,.1,0,0,0,0,.1,.1,.3,0,.1,-.1,0,0,0,0,0
108 DATA .1,0,0,0,0,0,0,0,0,0,0,0,0,0,0,0,0,0,0
120 DIM V(9,9,9)
130 FOR Z=1 TO 9 STEP 1
```

```
140 FOR Q=1 TO 9 STEP 1
145 FOR U=1 TO 9 STEP 1
147 READ V(Z,Q,U)
222 NEXT U
223 NEXT Q
224 NEXT Z
225 PRINT #1, "VOLTAGE DATA"
226 DIM VO(9,9)
227 FOR Q=1 TO 9 STEP 1
228 FOR R=1 TO 9 STEP 1
229 FOR U=1 TO 9 STEP 1
230 LET H=V(U,R,Q)
231 LET VO(U,R)=H
232 NEXT U
233 NEXT R
234 MAT  PRINT #1, VO
235 NEXT Q
254 !FFT THE ROWS OF SAMPLED VOLTAGES IN THE X DIRECTION
255 DIM MR(9)
256 DIM MI(9)
257 DIM R(9)
258 DIM RV(9,9,9)
259 DIM IV(9,9,9)
260 FOR V=0 TO 9 STEP 1
270 FOR M=1 TO 9 STEP 1
280 FOR N=1 TO 9 STEP 1
290 LET Y=V(M,N,V)
300 LET R(N)=Y
305 NEXT N
310 EXTERNAL SUB FFT(DIM(),DIM(),DIM())
320 CALL FFT(R(),MR(),MI())
330 FOR N=1 TO 9 STEP 1
340 LET   Y=MR(N)
350 LET RV(M,N,V)=Y
360 NEXT N
370 FOR N=1 TO 9 STEP 1
380 LET G=MI(N)
390 LET IV(M,N,V)=G
400 NEXT N
410 NEXT M
415 NEXT V
417 DIM RVO(9,9)
419 DIM IVO(9,9)
420 PRINT #1,"RV"
421 FOR Q=1 TO 9 STEP 1
422 FOR R=1 TO 9 STEP 1
423 FOR U=1 TO 9 STEP 1
424 LET H=RV(U,R,Q)
425 LET RVO(U,R)=H
426 NEXT U
427 NEXT R
428 MAT PRINT #1, RVO,
429 NEXT Q
430 PRINT #1, "IV"
431 FOR Q=1 TO 9 STEP 1
432 FOR R=1 TO 9 STEP 1
433 FOR U=1 TO 9 STEP 1
434 LET H=IV(U,R,Q)
435 LET IVO(U,R)=H
436 NEXT U
437 NEXT R
```

```
438 MAT PRINT #1, IVO,
439 NEXT Q
455 !FFT THE COLUMNS OF THE SAMPLED VOLTAGE IN THE Z DIRECTION
460 DIM RRV(9,9,9)
470 DIM IRV(9,9,9)
475 FOR V=1 TO 9 STEP 1
480 FOR N=1 TO 9 STEP 1
490 FOR M=1 TO 9 STEP 1
500 LET Y=RV(M,N,V)
510 LET R(M)=Y
520 NEXT M
530 CALL FFT(R(),MR(),MI())
540 FOR M=1 TO 9 STEP 1
550 LET H=MR(M)
560 LET RRV(M,N,V)=H
570 NEXT M
580 FOR M=1 TO 9 STEP 1
590 LET G=MI(M)
600 LET IRV(M,N,V)=G
610 NEXT M
620 NEXT N
625 NEXT V
626 DIM RRVO(9,9)
627 DIM IRVO(9,9)
630 PRINT #1,"RRV"
631 FOR Q=1 TO 9 STEP 1
632 FOR R=1 TO 9 STEP 1
633 FOR U =1 TO 9 STEP 1
634 LET H=RRV(U,R,Q)
637 LET RRVO(U,R)=H
638 NEXT U
639 NEXT R
640 MAT PRINT #1, RRVO,
641 NEXT Q
650 PRINT #1, "IRV"
651 FOR Q=1 TO 9 STEP 1
653 FOR R=1 TO 9 STEP 1
654 FOR U=1 TO 9 STEP 1
655 LET H= IRV(U,R,Q)
656 LET IRVO(U,R)=H
657 NEXT U
658 NEXT R
659 MAT PRINT #1, IRVO,
660 NEXT Q
661 DIM RIV(9,9,9)
662 DIM IIV(9,9,9)
685 FOR V=1 TO 9 STEP 1
690 FOR N=1 TO 9 STEP 1
700 FOR M=1 TO 9 STEP 1
710 LET Y=IV(M,N,V)
760 LET R(M)=Y
770 NEXT M
830 CALL FFT(R(),MR(),MI())
840 FOR M=1 TO 9 STEP 1
850 LET H=MR(M)
860 LET RIV(M,N,V)=H
870 NEXT M
872 FOR M= 1 TO 9 STEP 1
873 LET G=MI(M)
874 LET IIV(M,N,V)=G
875 NEXT M
876 NEXT N
877 NEXT V
```

```
878 DIM RIVO(9,9)
879 DIM IIVO(9,9)
880 PRINT #1, "RIV"
881 FOR Q=1 TO 9 STEP 1
882 FOR R=1 TO 9 STEP 1
883 FOR U=1 TO 9 STEP 1
884 LET H=RIV(U,R,Q)
885 LET RIVO(U,R)=H
886 NEXT U
887 NEXT R
888 MAT PRINT #1, RIVO,
889 NEXT Q
890 PRINT #1, "IIV"
891 FOR Q=1 TO 9 STEP 1
892 FOR R=1 TO 9 STEP 1
893 FOR U=1 TO 9 STEP 1
894 LET H=IIV(U,R,Q)
895 LET IIVO(U,R)=H
896 NEXT U
897 NEXT R
898 MAT PRINT #1, IIVO,
899 NEXT Q
900 DIM RVA(9,9,9)
901 DIM IVA(9,9,9)
904 DIM RVAO(9,9)
906 DIM IVAO(9,9)
908 FOR Q=1 TO 9 STEP 1
910 FOR R=1 TO 9 STEP 1
911 FOR U=1 TO 9 STEP 1
912 LET H=IIV(U,R,Q)
913 H=(-1)*H
914 LET G=RRV(U,R,Q)
915 LET L=G+H
916 LET RVA(U,R,Q)=L
917 NEXT U
918 NEXT R
919 NEXT Q
920 FOR Q=1 TO 9 STEP 1
921 FOR R=1 TO 9 STEP 1
922 FOR U=1 TO 9 STEP 1
923 LET H=IRV(U,R,Q)
924 LET L=RIV(U,R,Q)
925 LET IVA(U,R,Q)=H+L
927 NEXT U
928 NEXT R
930 NEXT Q
932 PRINT #1, "RVA"
934 FOR Q=1 TO 9 STEP 1
936 FOR R=1 TO 9 STEP 1
938 FOR U=1 TO 9 STEP 1
940 LET H=RVA(U,R,Q)
942 LET RVAO(U,R)=H
944 NEXT U
946 NEXT R
948 MAT PRINT #1, RVAO,
950 NEXT Q
952 PRINT #1, "IVA"
954 FOR Q=1 TO 9 STEP 1
956 FOR R=1 TO 9 STEP 1
958 FOR U=1 TO 9 STEP 1
960 LET H=IVA(U,R,Q)
962 LET IVAO(U,R)=H
```

```
964 NEXT U
966 NEXT R
968 MAT PRINT #1, IVAO,
970 NEXT Q
972 !FFT THE ROWS OF THE SAMPLED VOLTAGES IN THE Y DIRECTION
980 DIM RVAY(9,9,9)
990 DIM IRVAY(9,9,9)
992 DIM RVAYO(9,9)
994 DIM IRVAYO(9,9)
1012 FOR M=1 TO 9 STEP 1
1013 FOR N=1 TO 9 STEP 1
1014 FOR V=1 TO 9 STEP 1
1015 LET Y=RVA(M,N,V)
1016 LET R(V)=Y
1017 NEXT V
1018 CALL FFT(R(),MR(),MI())
1019 FOR V=1 TO 9 STEP 1
1020 LET H=MR(V)
1021 LET RVAY(M,N,V)=H
1022 NEXT V
1023 FOR V=1 TO 9 STEP 1
1024 LET G=MI(V)
1025 LET IRVAY(M,N,V)=G
1026 NEXT V
1027 NEXT N
1028 NEXT M
1030 PRINT #1,"RVAY"
1032 FOR Q=1 TO 9 STEP 1
1034 FOR R=1 TO 9 STEP 1
1036 FOR U=1 TO 9 STEP 1
1038 LET H=RVAY(U,R,Q)
1040 LET RVAYO(U,R)=H
1042 NEXT U
1044 NEXT R
1046 MAT PRINT #1,RVAYO,
1048 NEXT Q
1050 PRINT #1, "IRVAY"
1052 FOR Q=1 TO 9 STEP 1
1054 FOR R=1 TO 9 STEP 1
1056 FOR U=1 TO 9 STEP 1
1058 LET H=IRVAY(U,R,Q)
1060 LET IRVAYO(U,R)=H
1062 NEXT U
1064 NEXT R
1066 MAT PRINT #1,IRVAYO,
1068 NEXT Q
1070 DIM RIVY(9,9,9)
1080 DIM IIVY(9,9,9)
1085 DIM RIVYO(9,9)
1086 DIM IIVYO(9,9)
1090 FOR M=1 TO 9 STEP 1
1100 FOR N=1 TO 9 STEP 1
1138 FOR V=1 TO 9 STEP 1
1139 LET Y=IVA(M,N,V)
1140 LET R(V)=Y
1141 NEXT V
1142 CALL FFT(R(),MR(),MI())
1143 FOR V=1 TO 9 STEP 1
1144 LET H=MR(V)
1145 LET RIVY(M,N,V)=H
1146 NEXT V
1147 FOR V=1 TO 9 STEP 1
1148 LET G=MI(V)
```

```
1149 LET IIVY(M,N,V)=G
1150 NEXT V
1151 NEXT N
1152 NEXT M
1153 PRINT #1, "RIVY"
1160 FOR Q=1 TO 9 STEP 1
1162 FOR R=1 TO 9 STEP 1
1164 FOR U=1 TO 9 STEP 1
1166 LET H=RIVY(U,R,Q)
1170 LET RIVYO(U,R)=H
1172 NEXT U
1174 NEXT R
1178 MAT PRINT #1, RIVYO,
1180 NEXT Q
1185 PRINT #1, "IIVY"
1190 FOR Q=1 TO 9 STEP 1
1200 FOR R=1 TO 9 STEP 1
1210 FOR U=1 TO 9 STEP 1
1212 LET H= IIVY(U,R,Q)
1214 LET IIVYO(U,R)=H
1216 NEXT U
1218 NEXT R
1220 MAT PRINT #1,IIVYO,
1222 NEXT Q
1230 DIM YRVA(9,9,9)
1240 DIM YIVA(9,9,9)
1241 FOR Q=1 TO 9 STEP 1
1250 FOR R=1 TO 9 STEP 1
1260 FOR U=1 TO 9 STEP 1
1270 LET L=IIVY(U,R,Q)
1280 LET B=RVAY(U,R,Q)
1290 LET YRVA(U,R,Q)=B-L
1300 NEXT U
1310 NEXT R
1320 NEXT Q
1330 FOR Q=1 TO 9 STEP 1
1340 FOR R=1 TO 9 STEP 1
1345 FOR U=1 TO 9 STEP 1
1350 LET H=RIVY(U,R,Q)
1360 LET L=IRVAY(U,R,Q)
1370 LET YIVA(U,R,Q)=L+H
1380 NEXT U
1390 NEXT R
1400 NEXT Q
1410 PRINT #1, "YRVA"
1412 DIM YRVAO(9,9)
1414 DIM YIVAO(9,9)
1420 FOR Q=1 TO 9 STEP 1
1430 FOR R=1 TO 9 STEP 1
1440 FOR U=1 TO 9 STEP 1
1450 LET H=YRVA(U,R,Q)
1460 LET YRVAO(U,R)=H
1470 NEXT U
1480 NEXT R
1490 MAT PRINT #1,YRVAO,
1500 NEXT Q
1510 PRINT #1, "YIVA"
1520 FOR Q=1 TO 9 STEP 1
1530 FOR R=1 TO 9 STEP 1
1540 FOR U=1 TO 9 STEP 1
1545 LET H=YIVA(U,R,Q)
1550 LET YIVAO(U,R)=H
```

```
1560 NEXT U
1570 NEXT R
1580 MAT PRINT #1,YIVAO,
1590 NEXT Q
2050 !GENERATE THE DISCRETE SPECTRUM OF THE SYSTEM FUNCTION AND THE SINC
2055 !FUNCTION OF THE SAMPLE AND HOLD CORRESPONDING TO THE FINITE DETECTOR
2057 !DIMENSIONS
2060 DIM SFH(9,9,9)
2061 DIM SFHO(9,9)
2062 DIM SINC (9,9,9)
2063 DIM SINCO(9,9)
2065 LET SFH(4,4,4)=4*PI
2066 FOR M=-4 TO 4 STEP 1
2070 FOR V=-4 TO 4 STEP 1
2080 FOR N=-4 TO 4 STEP 1
2081 H=.04
2082 J=ABS(M)+ABS(N)+ABS(V)
2085 IF J=0 THEN GO TO 2098
2090 T=4*PI*((2*PI*N/9*1/.1)^2+((2*PI*V/9*1/.1)^2))
2092 B=(2*PI*N/9*1/.1)^2+(2*PI*M/9*1/C)^2+(2*PI*V/9*1/.1)^2
2095 LET SFH(M+5,N+5,V+5)=T/B
2098 G=ABS(N)+ABS(V)
2100 IF G=0 THEN GO TO 2114
2101 A=1
2105 IF N=0 THEN GO TO 2107
2106 A=SIN(2*PI*10*N/9*.1)/(PI*N/9*10)
2107 B=1
2108 IF V=0 THEN GO TO 2110
2109 B=SIN(2*PI*10*V/9*.1)/(PI*V/9*10)
2110 H=A*B
2111 IF N=0 THEN H=.2*H
2112 IF V=0 THEN H=.2*H
2114 LET SINC(M+5,N+5,V+5)=H
2130 NEXT N
2131 NEXT V
2132 NEXT M
2135 PRINT #1, "SFH"
2136 FOR Q=1 TO 9 STEP 1
2137 FOR R=1 TO 9 STEP 1
2138 FOR U=1 TO 9 STEP 1
2139 LET S=SFH(U,R,Q)
2140 LET SFHO(U,R)=S
2141 NEXT U
2142 NEXT R
2143 MAT PRINT #1, SFHO,
2144 NEXT Q
2145 PRINT #1, "SINC"
2146 FOR Q=1 TO 9 STEP 1
2147 FOR R=1 TO 9 STEP 1
2148 FOR U=1 TO 9 STEP 1
2149 LET S=SINC(U,R,Q)
2150 LET SINCO(U,R)=S
2151 NEXT U
2152 NEXT R
2153 MAT PRINT #1, SINCO,
2154 NEXT Q
2155 !INVERSE THE DISCRETE SPECTRUM OF THE SYSTEM FUNCTION AND THE SINC
2157 !FUNCTION
2160 DIM HR(9,9,9)
2170 DIM HRO(9,9)
2171 DIM SINCR(9,9,9)
2175 FOR V=1 TO 9 STEP 1
```

```
2180 FOR M=1 TO 9 STEP 1
2190 FOR N=1 TO 9 STEP 1
2200 LET Y=SFH(M,N,V)
2201 LET H=SINC(M,N,V)
2210 IF Y=0 THEN GO TO 2212
2211 Y=1/Y
2212 IF H=0 THEN GO TO 2230
2221 H=1/H
2230 LET HR(M,N,V)=Y
2235 LET SINCR(M,N,V)=H
2240 NEXT N
2250 NEXT M
2260 NEXT V
2310 PRINT #1,"HR"
2311 FOR Q=1 TO 9 STEP 1
2312 FOR R=1 TO 9 STEP 1
2313 FOR U=1 TO 9 STEP 1
2314 LET S=HR(U,R,Q)
2315 LET HRO(U,R)=S
2316 NEXT U
2317 NEXT R
2320 MAT PRINT #1,HRO,
2321 NEXT Q
2340 !DIVIDE THE TRANSFORMED DATA BY THE TRANSFORM OF THE SYSTEM
FUNCTION
2345 !AND THE SINC FUNCTION
3030 DIM FR(9,9,9)
3050 DIM FI(9,9,9)
3052 DIM FRO(9,9)
3054 DIM FIO(9,9)
3056 FOR V=1 TO 9 STEP 1
3057 FOR M=1 TO 9 STEP 1
3058 FOR N=1 TO 9 STEP 1
3059 T=YRVA(M,N,V)
3060 S=HR(M,N,V)
3062 L=SINCR(M,N,V)
3065 K=S*T*L
3066 LET FR(M,N,V)=K
3067 NEXT N
3068 NEXT M
3070 NEXT V
3080 FOR V=1 TO 9 STEP 1
3081 FOR M=1 TO 9 STEP 1
3082 FOR N=1 TO 9 STEP 1
3083 H=SINCR(M,N,V)
3093 K= HR(M,N,V)
3094 L= YIVA(M,N,V)
3095 E=K*L*H
3096 LET FI(M,N,V)=E
3097 NEXT N
3098 NEXT M
3100 NEXT V
3130 PRINT #1, "FR"
3131 FOR Q=1 TO 9 STEP 1
3132 FOR R=1 TO 9 STEP 1
3133 FOR U=1 TO 9 STEP 1
3134 LET H= FR(U,R,Q)
3135 LET FRO(U,R)=H
3136 NEXT U
3137 NEXT R
3138 MAT PRINT #1, FRO,
3140 NEXT Q
3141 PRINT #1, "FI"
```

```
3142 FOR Q=1 TO 9 STEP 1
3143 FOR R=1 TO 9 STEP 1
3144 FOR U=1 TO 9 STEP 1
3145 LET H=FI(U,R,Q)
3146 LET FIO(U,R)=H
3156 NEXT U
3157 NEXT R
3158 MAT PRINT #1, FIO,
3160 NEXT Q
3170 !INVERSE TRANSFORM THE ROWS IN THE X DIRECTION
3180 DIM RF(9,9,9)
3185 DIM RFO(9,9)
3187 DIM MIFO(9,9)
3190 DIM MIF(9,9,9)
3195 DIM I(9)
3196 FOR V=1 TO 9 STEP 1
3200 FOR M=1 TO 9 STEP 1
3210 FOR N=1 TO 9 STEP 1
3220 LET Y=FR(M,N,V)
3230 LET R(N)=Y
3240 NEXT N
3250 FOR N=1 TO 9 STEP 1
3260 LET Y=FI(M,N,V)
3270 LET I(N)=Y
3280 NEXT N
3285 EXTERNAL SUB IFT(DIM(),DIM(),DIM(),DIM())
3290 CALL IFT(R(),I(),MR(),MI())
3300 FOR N=1 TO 9 STEP 1
3310 LET Y=MR(N)
3320 LET RF(M,N,V)=Y
3330 NEXT N
3340 FOR N=1 TO 9 STEP 1
3350 LET Y=MI(N)
3360 LET MIF(M,N,V)=Y
3370 NEXT N
3380 NEXT M
3385 NEXT V
3390 PRINT #1, "RF"
3391 FOR Q=1 TO 9 STEP 1
3392 FOR R=1 TO 9 STEP 1
3393 FOR U=1 TO 9 STEP 1
3394 LET H=RF(U,R,Q)
3395 LET RFO(U,R)=H
3396 NEXT U
3397 NEXT R
3400 MAT PRINT #1, RFO,
3405 NEXT Q
3410 PRINT #1," MIF "
3411 FOR Q=1 TO 9 STEP 1
3412 FOR R=1 TO 9 STEP 1
3413 FOR U=1 TO 9 STEP 1
3414 LET H= MIF(U,R,Q)
3415 LET MIFO(U,R)=H
3416 NEXT U
3417 NEXT R
3420 MAT PRINT #1, MIFO,
3421 NEXT Q
3422 !INVERSE TRANSFORM THE ROWS IN THE Y DIRECTION
3430 DIM RFY(9,9,9)
3432 DIM MIFY(9,9,9)
3433 DIM RFYO(9,9)
3434 DIM MIFYO(9,9)
```

```
3435 FOR M=1 TO 9 STEP 1
3440 FOR N=1 TO 9 STEP 1
3450 FOR V=1 TO 9 STEP 1
3460 LET Y=RF(M,N,V)
3470 LET R(V)=Y
3480 NEXT V
3490 FOR V=1 TO 9 STEP 1
3500 LET Y=MIF(M,N,V)
3510 LET I(V)=Y
3520 NEXT V
3525 EXTERNAL SUB IFT(DIM(),DIM(),DIM(),DIM())
3526 CALL IFT(R(),I(),MR(),MI())
3527 FOR V=1 TO 9 STEP 1
3528 LET Y=MR(V)
3529 LET RFY(M,N,V)=Y
3530 NEXT V
3531 FOR V=1 TO 9 STEP 1
3532 LET Y=MI(V)
3533 LET MIFY(M,N,V)=Y
3534 NEXT V
3535 NEXT N
3536 NEXT M
3537 PRINT #1, "RFY"
3538 FOR Q=1 TO 9 STEP 1
3539 FOR R=1 TO 9 STEP 1
3540 FOR U=1 TO 9 STEP 1
3541 LET H=RFY(U,R,Q)
3542 LET RFYO(U,R)=H
3543 NEXT U
3544 NEXT R
3545 MAT PRINT #1, RFYO,
3546 NEXT Q
3547 PRINT #1, "MIFY"
3550 FOR Q=1 TO 9 STEP 1
3555 FOR R=1 TO 9 STEP 1
3560 FOR U=1 TO 9 STEP 1
3565 LET H=MIFY(U,R,Q)
3566 LET MIFYO(U,R)=H
3567 NEXT U
3568 NEXT R
3570 MAT PRINT #1,MIFYO,
3575 NEXT Q
3580 !INVERSE TRANSFORM THE COLUMNS IN THE Z DIRECTION
3581 DIM F(9,9,9)
3590 DIM FO(9,9)
3592 FOR V=1 TO 9 STEP 1
3593 FOR N=1 TO 9 STEP 1
3594 FOR M=1 TO 9 STEP 1
3600 LET Y=RFY(M,N,V)
4546 LET R(M)=Y
4547 NEXT M
4548 FOR M=1 TO 9 STEP 1
4549 LET Y=MIFY(M,N,V)
4550 LET I(M)=Y
4552 NEXT M
4553 EXTERNAL SUB IFTZ(DIM(),DIM(),DIM(),DIM())
4554 CALL IFTZ(R(),I(),MR(),MI())
4556 FOR M=1 TO 9 STEP 1
4557 LET Y=MR(M)
4559 LET F(M,N,V)=Y
4600 NEXT M
4602 NEXT N
```

```
4604 NEXT V
4605 PRINT #1, "F"
4610 FOR Q=1 TO 9 STEP 1
4620 FOR R=1 TO 9 STEP 1
4630 FOR U=1 TO 9 STEP 1
4635 LET H=F(U,R,Q)
4640 LET FO(U,R)=H
4650 NEXT U
4660 NEXT R
4666 MAT PRINT #1,FO,
4670 NEXT Q
4677 !CORRECT FOR THE U(Z) CONVOLUTION AND NORMALIZE THE RECONSTRUCTION
4678 DIM CF(9,9,9)
4780 DIM CFO(9,9)
4809 FOR V=1 TO 9 STEP 1
4810 FOR N=1 TO 9 STEP 1
4871 LET K=F(1,N,V)
4873 K=K/10E8
4974 LET CF(1,N,V)=K
5915 NEXT N
6616 NEXT V
6617 FOR V=1 TO 9 STEP 1
6620 FOR M=2 TO 9 STEP 1
6630 FOR N=1 TO 9 STEP 1
6640 LET K=F(M,N,V)
6641 P=.25*PI^2/(M-1)^2/C^2
6642 P=P+.5-PI
6650 K=K/P
6660 LET CF(M,N,V)=K
6670 NEXT N
6680 NEXT M
6681 NEXT V
6690 PRINT #1, "RECONSTRUCTION"
6691 FOR Q=1 TO 9 STEP 1
6692 FOR R=1 TO 9 STEP 1
6693 FOR U=1 TO 9 STEP 1
6694 LET H=CF(U,R,Q)
6695 H=H/CF(5,5,6)
6696 LET CFO(U,R)=H
6697 NEXT U
6698 NEXT R
6700 MAT PRINT #1,CFO,
6705 NEXT Q
6710 END
6722 SUB FFT(R(),MR(),MI())
6726 FOR M=1 TO 9 STEP 1
6730 A=0
6740 FOR N=1 TO 9 STEP 1
6750 LET H=R(N)
6760 B=H*COS(2*PI*(M-5)*(N-5)/9)
6770 A=A+B
6780 NEXT N
6790 A=A/9
6800 LET MR(M)=A
6810 NEXT M
6820 FOR M=1 TO 9 STEP 1
6830 A=0
6840 FOR N=1 TO 9 STEP 1
6880 LET H=R(N)
6890 H=-H
6900 B=H*SIN(2*PI*(M-5)*(N-5)/9)
6910 A=A+B
6920 NEXT N
```

```
6930 A=A/9
6935 LET MI(M)=A
6940 NEXT M
6950 END SUB
6960  SUB IFT(R(),I(),MR(),MI())
6970 DIM MRR(9)
6980 DIM MRI(9)
6990 DIM MIR(9)
7000 DIM MII(9)
7010 FOR N=1 TO 9 STEP 1
7020 A=0
7030 FOR M=1 TO 9 STEP 1
7040 LET G=R(M)
7050 B=G*COS(2*PI*(M-5)*(N-5)/9)
7060 A=A+B
7070 NEXT M
7080 LET MRR(N)=A
7090 NEXT N
7100 FOR N=1 TO 9 STEP 1
7110 A=0
7120 FOR M=1 TO 9 STEP 1
7130 LET G=R(M)
7140 B=G*SIN(2*PI*(M-5)*(N-5)/9)
7150 A=A+B
7160 NEXT M
7170 LET MRI(N)=A
7180 NEXT N
7190 FOR N=1 TO 9 STEP 1
7200 A=0
7210 FOR M=1 TO 9 STEP 1
7220 LET G=I(M)
7230 B=G*COS(2*PI*(M-5)*(N-5)/9)
7240 A=A+B
7250 NEXT M
7260 LET MIR(N)=A
7270 NEXT N
7280 FOR N=1 TO 9 STEP 1
7290 A=0
7300 FOR M=1 TO 9 STEP 1
7310 LET G=I(M)
7320 B=G*SIN(2*PI*(M-5)*(N-5)/9)
7330 A=A+B
7340 NEXT M
7350 LET MII(N)=A
7360 NEXT N
7365 MAT MII=(-1)*MII
7375 MAT MR=MRR+MII
7385 MAT MI=MIR+MRI
7400 END SUB
7410  SUB IFTZ(R(),I(),MR(),MI())
7420 DIM MRR(9)
7430 DIM MRI(9)
7440 DIM MIR(9)
7450 DIM MII(9)
7460 FOR N=1 TO 9 STEP 1
7470 A=0
7480 FOR M=1 TO 9 STEP 1
7490 LET G=R(M)
7500 B=G*COS(2*PI*(M-5)*(-N+1)/9)
7510 A=A+B
7520 NEXT M
7530 LET MRR(N)=A
7540 NEXT N
```

```
7550 FOR N=1 TO 9 STEP 1
7560 A=0
7570 FOR M=1 TO 9 STEP 1
7580 LET G=R(M)
7590 B=G*SIN(2*PI*(M-5)*(-N+1)/9)
7600 A=A+B
7610 NEXT M
7620 LET MRI(N)=A
7630 NEXT N
7640 FOR N=1 TO 9 STEP 1
7641 A=0
7642 FOR M=1 TO 9 STEP 1
7650 LET G=I(M)
7660 B=G*COS(2*PI*(M-5)*(-N+1)/9)
7670 A=A+B
7680 NEXT M
7690 LET MIR(N)=A
7700 NEXT N
7710 FOR N=1 TO 9 STEP 1
7720 A=0
7730 FOR M=1 TO 9 STEP 1
7740 LET G=I(M)
7750 B=G*SIN(2*PI*(M-5)*(-N+1)/9)
7760 A=A+B
7770 NEXT M
7780 LET MII(N)=A
7790 NEXT N
7795 MAT MII=(-1)*MII
7800 MAT MR=MRR+MII
7810 MAT MI=MRI+MIR
7880 END SUB $
```

References

The following citations are incorporated by reference.

Antonini, E.; Brunori, M., *Hemoglobin and Myoglobin and Their Reaction with Ligands*, 1971, p. 32.

Pauling, Linus and Coryell, Charles D., "The Magnetic Properties and Structure of Hemoglobin", Oxyhemoglobin and Carbonmonoxyhemoglobin, *Proceedings of the National Academy of Science*, 1936, U.S. 22, 210.

Ternberg T. L. and Commoner B. *Journal of the American Medical Association*, 183, p. 339-342, 1963.

Ivanenko, A. I.; Shpiring, K., Instrum. Exp. Tech. (USA), (1987), Vol. 30, No. 3, pt. 2, pp. 728-730.

Huang, R. M.; Yeh, F. S.; Huang, R. S., *IEEE Trans. Electron Devices* (USA), (1984), Vol. ED-31, No. 7, pp. 1001-1004.

Thorn, M. J., *Proceedings of the 29th IEEE Vehicular Technology Conference*, 27-30 March, 1979, Arlington Heights, Ill., pp. 226-229.

Nathan, A.; et al., *Proceedings of the IASTED International Symposium: Applied Simulation and Modeling—ASM '85*, 3-5 June 1985, Montreal, Quebec, Canada, pp. 22-24.

Bligh, P. H.; Johnson, J. J.; Ward, J. M., *Phys. Educ.* (GB), (1985), Vol. 20, No. 5, pp. 245-247.

Nathan, A.; Huiser, A. M. J.; Baltes, H. P., *IEEE Trans Electron Devices* (USA), (1985), Vol. Ed-32, No. 7, pp. 1212-1219.

Vinal, A. W., *IBM J. Res. and Dev.* (USA), (1981), Vol. 25, No. 2-3, pp. 196-201.

Bol'Shakova, I. A.; et al., *Instrum. and Exp. Tech.* (USA), (1980), Vol. 23, No. 2, pt. 2, pp. 526-528.

Bessonov, V. I.; et al., *Meas. Tech.* (USA), (1980), Vol. 23, No. 3, pp. 255-256.

Kordic, S., *Sens. and Actuators* (Switzerland), (1986), Vol. 10, No. 3-4, pp. 347-378.

Pogodin, V. I.; et al., *Meas. Tech.* (USA), (1986), Vol. 29, No. 3, pp. 223-225.

Tacano, M.; Sugiyama, Y.; Taguchi, T., *IEEE Electron Device Lett.* (USA), (1987), Vol. EDL-8, No. 1, pp. 22-23.

Dibbern, U., *Sens and Actuators* (Switzerland), (1986), Vol. 10, No. 1-2, pp. 127-140.

Extance, P.; Pitt, G. D., TRANSDUCERS '85, 1985 International Conference on Solid State Sensors and Actuators. Digest of Technical Papers, (Cat. No. 85CH 2127-9), 11-14 June 1985, Phila., Pa., pp. 304-307.

Han, Y. S.; et al., *Proceedings of the 9th International Conference on Magnet Technology*, MT-9 1985, 9-13 Sept. 1985, Zurich, Switzerland, pp. 828-829.

Dickson, K. R.; Galbraith, P., CERN 85-13.

Bender, P. A., *Am. J. Phys.* (USA), (1986), Vol. 54, No. 1 pp. 89-90.

Hoffmann, H. *J. Appl. Phys.* (USA). Vol. 57, No. 8, pt. 2B, p. 3831.

Schmidt-Weinmar, H. G.; et al., *IEEE Trans. Magn.* (*USA*), (1984), Vol. MAG-20, No. 5, pt. 1, pp. 975–977.

Roumenin, C. S.; Kostov, P. T., *Sens and Actuators* (*Switzerland*), (1984), Vol. 6, No. 1, pp. 9–33.

Akhmanova, L. N.; et al., *Instrum. and Exp. Tech.* (*USA*), (1983), Vol. 26, No. 6, pt. 2, pp. 1433–1436.

Dibbern, U.; Pettersen, A., *Electron, Components and Appl.* (*Netherlands*), (1983), Vol. 5, No. 3, pp. 148–153.

Popovic, R. S.; Baltes, H. P., *Sens. and Actuators* (*Switzerland*), (1983), Vol. 4, No. 2, pp. 155–163.

Kordic, S.; et al., *Sens. and Actuators* (*Switzerland*), (1983), Vol. 4, No. 1, pp. 55–61.

Lindstrom, E. R.; et al., *IEEE Trans. Nucl. Sci.* (*USA*), (1983), Vol. NS-30, No. 4, pt. 2, pp. 3605–3607.

Rutkovskii, I. Z.; et al., *Instrum. and Exp. Tech.* (*USA*), (1981), Vol. 24, No. 3, pt. 2, pp. 822–823.

Belyaev, M Yu.; Medvedev, E. Yu., Instrum. and Exp. Tech. (*USA*), (1981), Vol. 24, No. 3, pt. 2, pp. 821–822.

Netzev, Y., *EDN* (*USA*), (1982), Vol. 27, No. 6, pp. 180–186.

Lachinov, V. M.; et al., *Instrum. and Exp. Tech.* (*USA*), (1980), Vol. 23, No. 6, pt. 2, pp. 1460–1462.

Poole, M. W.; Walker, R. P., *IEEE Trans. Magn* (*USA*), (1981), Vol. MAG-17, No. 5, pp. 2129–2132.

Wedlake, D., *TransducerTechnol.* (*GB*), (1981), Vol. 3, No. 2, pp. 15–19.

Dolgii, S. A.; et al., *Instrum. and Exp. Tech.* (*USA*), (1979), Vol. 22, No. 5, pt. 2, pp. 1407–1410.

Wedlake, D., *Electron. Ind.* (*GB*), (1979), Vol. 5, No. 3, p. 55.

Szavitis, O., *6th International Conference on Magnet Technology, Part II*, 29 Aug. 2 Sept. 1977, Bratislava, Czechoslovakia, pp. 849–853.

Sugiyama, Y; Taguchi, T.; Tacano, M., *Proc. 6th Sensor Symp.*, May 1986, pp. 51–56.

Popovic, R. S.; Widmer, R., Int. Electron Devices Meet., San Francisco, Calif., USA, 1984, *IEDM Tech. Dig.*, pp. 568–571.

Jackson, D. A., *J. Phys. E.*, Vol. 18, No. 12, (1985), pp. 981–1001.

Giallorenzi, T. G.; et al., *IEEE J. of Quantum Electronics*, Vol. QE-18, No. 4, (1982), pp. 626–665.

Kyuma, K.; et al., *IEEE J. of Quantum Electronics*, Vol. QE-18, No. 10, (1982), pp. 1619–1623.

Yoshino, T.; et al., *IEEE J. of Quantum Electronics*, Vol. QE-18, No. 10, (1982), pp. 1624–1633.

Dandridge, A.; et al., *Electronics Letters*, Vol. 16, No. 11, (1980), pp. 408–409.

Dickson, K. R. and Galbraith, P., "A Digital Micro-Teslameter," Organisation Europénne Pour La Recherche Nucléaire CERN European Organization for Nuclear Research, CERN 85-13, LEP Main Ring Division, 13 September 1985, pp. 1–24.

Modifications and substitutions of the system elements and process steps by one of skill in the art are considered within the scope of the present invention which is not to be limited except by the claims.

What is claimed is:

1. Apparatus for providing a multidimensional image representation of the spatial variations of magnetic susceptibility in a volume, comprising:
   a generator for providing an excitation field in the region of said volume which affects a paramagnetic substance or a diamagnetic substance in said volume;
   a detector for detecting a magnetic field originating in said volume from said paramagnetic or diamagnetic substances in response to said excitation field and according to the susceptibility of said volume, and having an output signal;
   a nullifier for nulling said excitation field in the region of said detector; and
   a reconstruction processor for reconstructing said multidimensional image representation according to the output signal of said detector.

2. The apparatus of claim 1, wherein said volume includes substantially non-ferromagnetic material.

3. The apparatus of claim 2, wherein
said generator for providing an excitation field includes an amplifier for compensating for the decreased magnitude of the magnetic field originating in portions of said volume relatively distal to said detector.

4. The apparatus of claim 1, wherein
said excitation field is substantially constant.

5. The apparatus of claim 4, further including
an oscillator for providing an alternating field signal having a periodicity to said detector and driving the detector periodically, and
said detector being further responsive to a signal having said periodicity.

6. The apparatus of claim 1, wherein
said detector comprises detector elements disposed on a first and a second axes and having corresponding output signals.

7. The apparatus of claim 6, wherein
said detector includes a detector element disposed on a third axis and having a corresponding output signal, and wherein
said detector elements disposed on first, second and third axes are responsive to the corresponding oriented magnetic field components.

8. The apparatus of claim 1, wherein
said detector includes one of a SQUID, a MAGFET, a Hall effect detector, a magnetoresistive element, and a Van der Pauw element.

9. The apparatus of claim 1, wherein
said detector comprises an array of detector elements.

10. The apparatus of claim 1, wherein
said nullifier includes field bucking coils operative to provide a field which selectively subtracts said excitation field at said detector.

11. The apparatus of claim 1, wherein said reconstruction processor includes at least one of the following: a detector processor for processing the detector output signal with an inverse matrix, a reiterative processor, a Fourier transform processor, a compensating processor for compensating for the field gradients of said excitation field, and a sinc function filter processor for detecting said detector output signals.

12. A method of providing a multidimensional image representation of the spatial variations of the magnetic susceptibility of a volume comprising the steps of:
   exciting said volume with an excitation field which affects a paramagnetic substance or a diamagnetic substance in said volume;
   detecting a magnetic field originating in said volume from said paramagnetic or diamagnetic substances in response to said excitation field and according to the susceptibility variations of said volume;
   nulling said excitation field in the region said magnetic field originating in said volume is detected; and reconstructing said multidimensional image representation according to the detected magnetic field.

13. The method of claim 12, wherein said step of exciting includes the step of compensating for the decrease in the magnitude of the magnetic field originating in portions of said volume relatively distal to the region where said magnetic field is detected.

14. The method of claim 12, wherein said step of detecting further comprises using an oscillator to drive the detector to synchronously detect said magnetic field.

15. The method of claim 12, wherein said step of nulling comprises subtracting from said excitation field a substantially equal bucking field at the region of detection of said magnetic field originating in said volume.

16. The method of claim 12, wherein said step of reconstructing includes the steps of recording over a sample space including at least a portion of said volume, the signals corresponding to the detected magnetic field;

inverting a matrix including numeric values corresponding to said detected magnetic field signals;

transforming said inverted matrix numeric values according to a Fourier transform and providing a transform array;

multiplying each numeric value of said transform array by a value which is the inverse of the Fourier transform of a waveform, said waveform corresponding to an operation performed in the step of detecting and providing a discrete spectrum matrix;

multiplying each numeric value of said discrete spectrum matrix by a value corresponding to the inverse Fourier transform of a function representative of said steps of exciting and detecting and providing a system corrected matrix;

inverse-transforming said system corrected matrix according to a multidimensional discrete inverse Fourier transform providing a dipole susceptibility matrix;

correcting each element in said dipole susceptibility matrix for any asymmetries in the dimensions of said sample space and any nonuniformities of the excitation field; and plotting said corrected dipole susceptibility matrix values in a plurality of dimensions for providing said multi-dimensional image representation of the spatial variations of the susceptibility of said volume.

* * * * *